(12) United States Patent
Sul et al.

(10) Patent No.: US 8,924,805 B2
(45) Date of Patent: *Dec. 30, 2014

(54) COMPUTER MEMORY TEST STRUCTURE

(71) Applicant: Silicon Image, Inc., Sunnyvale, CA (US)

(72) Inventors: Chinsong Sul, Santa Clara, CA (US); Sungjoon Kim, Cupertino, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,751

(22) Filed: Dec. 31, 2013

(65) Prior Publication Data

US 2014/0115414 A1    Apr. 24, 2014

Related U.S. Application Data

(63) Continuation of application No. 13/776,508, filed on Feb. 25, 2013, now Pat. No. 8,667,354, which is a continuation of application No. 12/497,391, filed on Jul. 2, 2009, now Pat. No. 8,386,867.

(51) Int. Cl.
| | | |
|---|---|---|
| *G01R 31/28* | (2006.01) | |
| *G01R 31/319* | (2006.01) | |
| *G11C 29/00* | (2006.01) | |
| *G11C 29/02* | (2006.01) | |
| *G11C 29/12* | (2006.01) | |
| *G11C 29/56* | (2006.01) | |

(52) U.S. Cl.
CPC ............ *G01R 31/319* (2013.01); *G11C 29/003* (2013.01); *G11C 29/02* (2013.01); *G11C 29/022* (2013.01); *G11C 29/12* (2013.01); *G11C 2029/5602* (2013.01)
USPC .......................................................... 714/733

(58) Field of Classification Search
CPC .... G11C 29/003; G11C 29/12; G11C 29/022; G11C 2029/5602; G11C 29/02; A01B 12/006; G01R 31/319
See application file for complete search history.

(56) References Cited

U.S. PATENT DOCUMENTS

| | | |
|---|---|---|
| 5,025,421 A | 6/1991 | Cho |
| 5,138,619 A | 8/1992 | Fasang et al. |

(Continued)

FOREIGN PATENT DOCUMENTS

| | | |
|---|---|---|
| CN | 1319072 C | 5/2007 |
| CN | 101582045 A | 11/2009 |

(Continued)

OTHER PUBLICATIONS

Chinese First Office Action, Chinese Application No. 201080030348.5, Mar. 5, 2014, 25 pages.

(Continued)

*Primary Examiner* — Guerrier Merant
(74) *Attorney, Agent, or Firm* — Fenwick & West LLP

(57) ABSTRACT

A method and apparatus for a computer memory test structure. An embodiment of a method for testing of a memory board includes testing a memory of the memory board, where testing the memory including use of a built-in self-test structure to provide a first test pattern for the memory. The method further includes testing an IO (input output) interface of the memory with a host, where testing of the IO interface includes use of the built-in self-test structure to provide a second test pattern for the IO interface.

37 Claims, 60 Drawing Sheets

(56) References Cited

U.S. PATENT DOCUMENTS

| | | | |
|---|---|---|---|
| 5,568,437 | A | 10/1996 | Jamal |
| 5,787,097 | A | 7/1998 | Roohparvar et al. |
| 5,923,675 | A | 7/1999 | Brown et al. |
| 6,085,346 | A | 7/2000 | Lepejian et al. |
| 6,297,997 | B1 | 10/2001 | Ohtani et al. |
| 6,424,583 | B1 | 7/2002 | Sung et al. |
| 6,928,593 | B1 | 8/2005 | Halbert et al. |
| 7,099,278 | B2 | 8/2006 | Momtaz |
| 7,161,964 | B2 | 1/2007 | Lentine et al. |
| 7,184,916 | B2 | 2/2007 | Resnick et al. |
| 7,200,059 | B2 | 4/2007 | Fujioka et al. |
| 7,460,418 | B2 | 12/2008 | Jung et al. |
| 7,653,849 | B1 | 1/2010 | Tabatabaei |
| 7,779,319 | B1 | 8/2010 | Tabatabaei |
| 8,386,867 | B2 * | 2/2013 | Sul et al. ................ 714/733 |
| 2003/0023912 | A1 | 1/2003 | Lesea |
| 2004/0250187 | A1 | 12/2004 | Schauer et al. |
| 2005/0065747 | A1 | 3/2005 | Premy et al. |
| 2005/0077905 | A1 | 4/2005 | Sasaki |
| 2006/0176943 | A1 | 8/2006 | Sindalovsky et al. |
| 2007/0257693 | A1 | 11/2007 | Stott et al. |
| 2008/0010573 | A1 | 1/2008 | Sul |
| 2008/0016421 | A1 | 1/2008 | McDevitt |
| 2008/0059105 | A1 | 3/2008 | Resnick et al. |
| 2008/0100327 | A1 | 5/2008 | Lee et al. |
| 2008/0235547 | A1 | 9/2008 | Chan |
| 2009/0100295 | A1 | 4/2009 | Hiew et al. |
| 2009/0161458 | A1 | 6/2009 | Pyeon |

FOREIGN PATENT DOCUMENTS

| | | | |
|---|---|---|---|
| JP | H11-296391 | A | 10/1999 |
| JP | 2006-078447 | A | 3/2006 |
| JP | 2007-095276 | A | 4/2007 |
| JP | 2008-305450 | | 12/2008 |
| JP | 2010-152939 | A | 7/2010 |

OTHER PUBLICATIONS

Chinese First Office Action, Chinese Application No. 201180005563.4, Jun. 4, 2014, 32 pages.

Japanese Office Action, Japanese Application No. 2012-517617, Jun. 17, 2014, 3 pages. (with English Summary).

International Search Report and Written Opinion for International Application No. PCT/US2010/039274 mailed Oct. 28, 2010. 23 pages.

Office Action mailed Dec. 22, 2010 in U.S. Appl. No. 12/497,391, 12 pages.

Office Action mailed May 27, 2011, in U.S. Appl. No. 12/497,391.

Office Action mailed Sep. 19, 2011, in U.S. Appl. No. 12/497,391, 13 pages.

Application Note 1328 Using Built-In Self-Tests (BIST) with SCAN50C400, National Semiconductor Corporation, Oct. 2004, pp. 1-12.

Clarke et al., "Automatic Test Generation for the Analysis of a Real-Time System: Case Study," IEEE Real-Time Technology and Applications Symposium, 1997, pp. 112-124.

International Search Report and Written Opinion of the International Searching Authority dated Apr. 22, 2013, in International Patent Application No. PCT/US2011/020055, 10 pages.

Jong et al., Memory interconnection test at board level, IEEE International Test Conference, 1992, Paper 17.1, pp. 328-337.

Office Action mailed Sep. 28, 2012, in U.S. Appl. No. 12/683,365, 24 pages.

Silicon Image, Inc., et al., "Serial Port Memory Technology", Specification Version 1.0, Jun. 15, 2007, 41 Pages.

Machine English translation of JP 2008-305450 published Dec. 18, 2008, 11 pages.

Office Action dated Oct. 28, 2013 (+English translation), in Japanese patent application No. 2012-517617, 3 pages.

Examination Report dated Oct. 28, 2013, in European Patent Application No. 10726766.8, 6 pages.

Invitation to Pay Additional Fees for International Patent Application No. PCT/US2010/039274 mailed Aug. 20, 2010, 6 pages.

International Searching Authority, International Preliminary Report on Patentability and Written Opinion for International Application No. PCT/US2010/039274 mailed Jan. 2012, 16 pages.

United States Office Action, U.S. Appl. No. 13/776,508, Mar. 28, 2013, 11 pages.

United States Office Action, U.S. Appl. No. 12/497,391, Sep. 19, 2011, 13 pages.

United States Office Action, U.S. Appl. No. 12/497,391, May 27, 2011, 12 pages.

United States Office Action, U.S. Appl. No. 12/497,391, Dec. 22, 2010, 12 pages.

* cited by examiner

| 6-bit In | 7-bit Out |
|---|---|
| 000000 | 0010000 |
| 000001 | 0010001 |
| 000010 | 0010010 |
| 000011 | 0010011 |
| 000100 | 0010100 |
| 000101 | 0010101 |
| 000110 | 0010110 |
| 000111 | 0010111 |
| 001000 | 0011000 |
| 001001 | 0011001 |
| 001010 | 0011010 |
| 001011 | 0011011 |
| 001100 | 0011100 |
| 001101 | 0011101 |
| 001110 | 0011110 |
| 001111 | 0110101 |

| 6-bit In | 7-bit Out |
|---|---|
| 010000 | 0101000 |
| 010001 | 0100001 |
| 010010 | 0100010 |
| 010011 | 0100011 |
| 010100 | 0100100 |
| 010101 | 0100101 |
| 010110 | 0100110 |
| 010111 | 0100111 |
| 011000 | 0111000 |
| 011001 | 0111001 |
| 011010 | 0111010 |
| 011011 | 0111011 |
| 011100 | 0111100 |
| 011101 | 0111101 |
| 011110 | 0111110 |
| 011111 | 0111111 |

| 6-bit In | 7-bit Out |
|---|---|
| 100000 | 1001000 |
| 100001 | 1000001 |
| 100010 | 1000010 |
| 100011 | 1000011 |
| 100100 | 1000100 |
| 100101 | 1000101 |
| 100110 | 1000110 |
| 100111 | 1000111 |
| 101000 | 1011000 |
| 101001 | 1011001 |
| 101010 | 1011010 |
| 101011 | 1011011 |
| 101100 | 1011100 |
| 101101 | 1011101 |
| 101110 | 1011110 |
| 101111 | 1011111 |

| 6-bit In | 7-bit Out |
|---|---|
| 110000 | 1001010 |
| 110001 | 1100001 |
| 110010 | 1100010 |
| 110011 | 1100011 |
| 110100 | 1100100 |
| 110101 | 1100101 |
| 110110 | 1100110 |
| 110111 | 1100111 |
| 111000 | 1101000 |
| 111001 | 1101001 |
| 111010 | 1101010 |
| 111011 | 1101011 |
| 111100 | 1101100 |
| 111101 | 1101101 |
| 111110 | 1101110 |
| 111111 | 1101111 |

The 7 bit code uses the following transformation:

AAAAAA̅ → AA̅AA̅AA̅A

AAADEF → AAA̅ADEF

ABCCCC → ABCC̅CCC

ABCDEF → ABCC̅DEF

FIG. 7

COMPUTER MEMORY TEST STRUCTURE

CROSS-REFERENCE TO RELATED APPLICATIONS

This application is a continuation of U.S. patent application Ser. No. 13/776,508, filed on Feb. 25, 2013; which is a continuation of U.S. patent application Ser. No. 12/497,391, filed Jul. 2, 2009, now U.S. Pat. No. 8,386,867, issued Feb. 26, 2013. These applications are incorporated herein by reference in their entirety.

TECHNICAL FIELD

Embodiments of the invention generally relate to the field of computer memory and, more particularly, to a method and apparatus for a computer memory test structure.

BACKGROUND

Computer memory devices have increasingly dense architecture, as advances in technology allow for smaller and smaller components within each device. Each memory device thus has become more complicated for testing. Memory devices may include SPDRAM (serial port dynamic random access memory).

Computer devices may in some cases include built-in self test (BIST) circuitry. The BIST circuitry may assist in the performance of certain tests for memory devices.

However, memory devices may require multiple different types of testing, which may have different requirements. The addition of too much hardware to support testing increases the size and cost of memory boards, and increases the complexity of testing.

Further, testing may involve the testing of multiple memory devices in relation interfacing with differing host systems, and thus testing that is overly complicated or inflexible will increase the cost and complexity of testing of memory devices and interfaces.

SUMMARY OF THE INVENTION

A method and apparatus are provided for a computer memory test structure.

In a first aspect of the invention, a method for testing of a memory board includes testing a memory of the memory board, with testing the memory including use of a built-in self-test structure to provide a first test pattern for the memory. Further, the method further includes testing an IO (input output) interface of the memory with a host, where testing of the IO interface includes use of the built-in self-test structure to provide a second test pattern for the IO interface.

In a second aspect of the invention, apparatus includes a memory, with the memory including a first test structure; a physical layer of a host, the physical layer includes a second test structure; and an interface between the memory and the physical layer. The memory and the interface are to be tested using the first test structure and the second test structure.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 7 is an illustration of an embodiment of transition encoding and decoding of 6-bit to 7 and 7-bit to 6 respectively;

DETAILED DESCRIPTION

Figure 1:
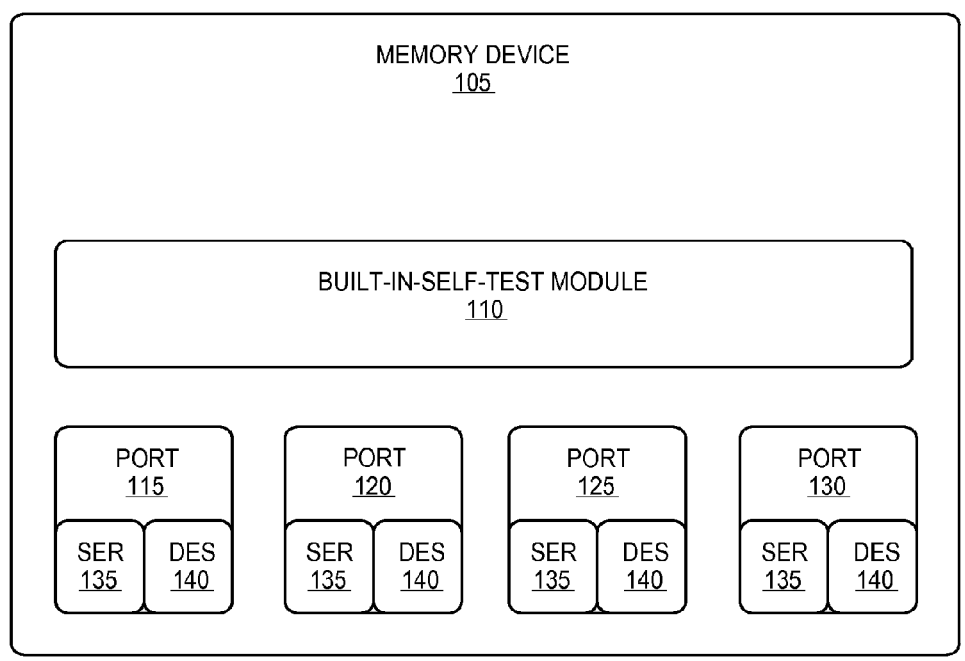
FIG. 1 is an illustration of an embodiment of a memory device containing a built-in self-test structure.

Embodiments of the invention are generally directed to a method and apparatus for a computer memory test structure.

In some embodiments, a built-in test structure is provided for a memory, including a random access memory (DRAM). In some embodiments, a memory is a serial port DRAM (SPDRAM) memory.

Serial links allow for reduced pin count, while simplifying layout issues by eliminating trace match and congestions. Because each port is independent, there is no need to maintain phase relationships among the ports. Memory commands and timing closely resemble standard state-of-art DRAM with multiplexed address buses.

However, providing cost effective and hardware efficient test methods to lower cost of test for the SPDRAM and end products may poses certain challenges. Within a device, hardware overhead of the SPDRAM memory interface test circuitry should be kept small so that more of the silicon area of the device may be utilized for memory cells. Further, test costs of SPDRAM memory interface test method may require careful management in order to maintain price competitiveness. In some embodiments, a test method should be able to provide a rich set of test patterns for characterization, production, test, and diagnosis. From the point of view of, for example, the set top box manufacturers, board level test, and diagnostic capability are important. In some embodiments, a test method integrated into the SPDRAM memory chips and PHY IP products may be reused to validate the interface of the SPDRAM products on system board, and thereby assist in increasing board yield. Because SPDRAM memories are generally tested by the suppliers, the set-top box makers may then apply reduced tests to ensure functionality of SPDRAM memories and of high-speed serial IO interface implemented on system board. In some embodiments, incorporation of low cost test features on the memory and the serial IO interfaces at both chip-level and board-level may provide a significant advantage for IP and IC products.

In some embodiments, a system utilizes built-in self-test (BIST) structures for testing SPDRAM memories, memory interface, and high speed serial IO links. SPDRAM memories and memory interfaces, which include port logic and switches, may be tested either by on-chip test circuitry or by a tester (including ATE—automatic test equipment). In some embodiments, a device may include a low cost hardware test interface that may be employed by the on-chip test circuitry and the tester in order to orchestrate intended tests internally and externally, respectively. In some embodiments, tests of SPDRAM memories and its interface may be carried out via the serial IO links. In some embodiments, a system may utilize test patterns that provide a sequence of SPDRAM commands that do not violate the SPDRAM protocol.

In some embodiments, testing of serial IO may be separated from that of memory and memory interface tests. The separation of testing may be provided because a process for ensuring functionality of serial IO interface with respect to its electrical specification may include test patterns that are outside of legal SPDRAM commands. In some embodiments, the implementation of testing of serial IO interface without requiring knowledge of SPDRAM protocol may also simplify the testing process. Thus, in some embodiments, a serial IO interface test is independent of SPDRAM protocol and may be carried out without knowledge of SPDRAM protocol. The test patterns of a serial IO test may, for example, be random patterns.

In some embodiments, a serial IO interface test may include test properties that are embedded (or encoded) into a stream of test patterns or test data in order to construct the valid data stream. In some embodiments, the interface test may be utilized to detect errors that change the validity of the data stream. The test property may be viewed as a test specification that the test patterns satisfy. Because the test properties may be abstract, the properties may accommodate a large set of test patterns that may be implemented in a simple fashion.

In some embodiments, in order to facilitate low cost testing, a testing system may provide test interface circuitry to the user memory test pattern generator and the tester. The testing system may also function as a stand-alone system that is capable of generating a sequence of SPDRAM commands required for testing the memory interface. In some embodiments, a tester may also access available SPDRAM commands to orchestrate the test externally.

In some embodiments, test interface circuitry may also function as test decompression circuitry. In some embodiments, SPDRAM command inputs may be, in an example of a device having four ports, decoded or decompressed into four 20-bit commands that may be applied to all four ports in parallel. Since, the memory interface test may be carried out through the same serial TO, the serial IO test structure be reused in construction of the test interface circuitry. The test interface circuitry may be viewed as a hierarchical hardware layer that may be turned on and off.

In device design and fabrication, when devices are placed on the printed circuit board to form a system, it is important to validate functionality of SPDRAM interface on board in order to reduce board-level yield loss and test escapes. In general the cost of yield loss at board-level is significantly higher than that of chip-level. Test-escaped boards may be costly because such board may cause system failure and product recall.

FIG. 1 is an illustration of an embodiment of a memory device containing a built-in self-test structure. In this illustration, a memory device 105 is a serial port memory device includes multiple ports, shown here as first port 115, second port 120, third port 125, and fourth port 130, with each port including a serializer 135 and a deserializer 140 (designated as SER and DES, respectively). The device further includes a built-in self-test structure (or BIST) for the testing of the device 110. In some embodiments, the built-in self-test structure is utilized to support the testing of the memory device and the memory interfaces.

Figure 2:
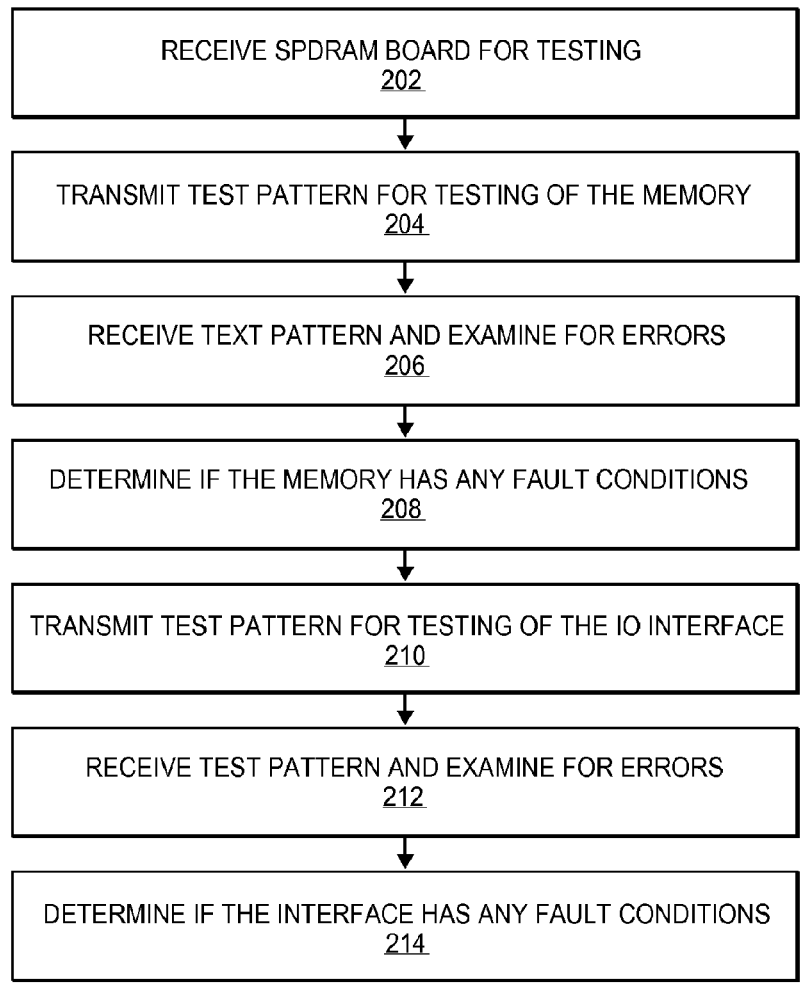
FIG. 2 is a flow chart illustrating an embodiment of a process for testing of computer memory.

FIG. 2 is a flow chart illustrating an embodiment of a process for testing of computer memory. In the illustrated process, a computer memory device is chosen as a device under test (DUT) 202, where the memory device includes multiple ports. A set of memory tests is chosen for the devices, and a test pattern is transmitted for testing of the memory 204. The test patterns are received and examined for errors 206, and there is a determination whether the memory has any fault conditions 208. In the illustrated process, a test pattern is also transmitted for testing of the IO interface 210. The test pattern is received and examined for errors 212, and there is a determination whether the interface has any fault conditions 214.

Figure 3:
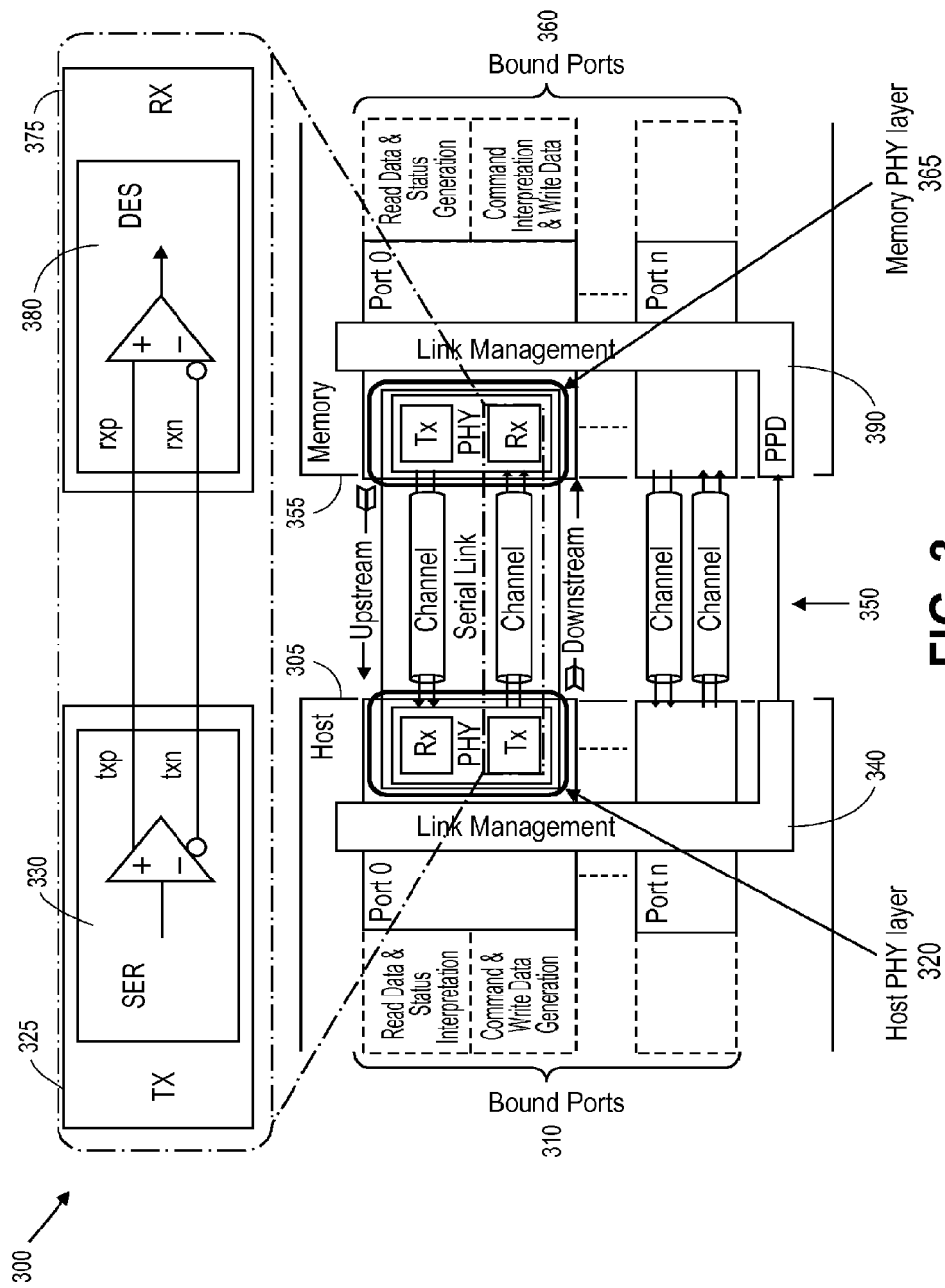
FIG. 3 is an illustration of an interface for a memory device including an embodiment of a built-in memory testing structure.

FIG. 3 is an illustration of an interface for a memory device including an embodiment of a built-in memory testing structure. In the illustrated system 300, a host 305 is linked to a memory 355 via an interface 350.

The host 305 includes one or more ports 310 including illustrated host Port 0, together with a link management 340 for the link with the memory 355. Port 0 includes a host physical layer 320, the host physical layer including a receiver and a transmitter 325, the transmitter including a serializer 330 for transmission over a serial link of the interface 350. The memory 355 includes one or more ports 360 including illustrated memory Port 0, together with a link management 390 for the link with the host 305. Memory Port 0 includes a memory physical layer 365, the memory physical layer including a transmitter and a receiver 375, the receiver including a deserializer 380 for receiving the transmission over the serial link of the interface 350.

In some embodiments, the memory 355 a DRAM (dynamic random access memory), and is specifically a serial port DRAM (SPDRAM). A SPDRAM is a DRAM memory access technology that allows accessing memory via high speed serial IO ports. In some embodiments, the host 305 is a system on a chip (SOC). In operation, parallel data is serialized before transmission between the host 305 and memory 355 and the serialized data is de-serialized into parallel data at the receiving end. Thus, a serializer-deserializer pair forms a communication channel between the host 305 and the host 355.

Figure 4:
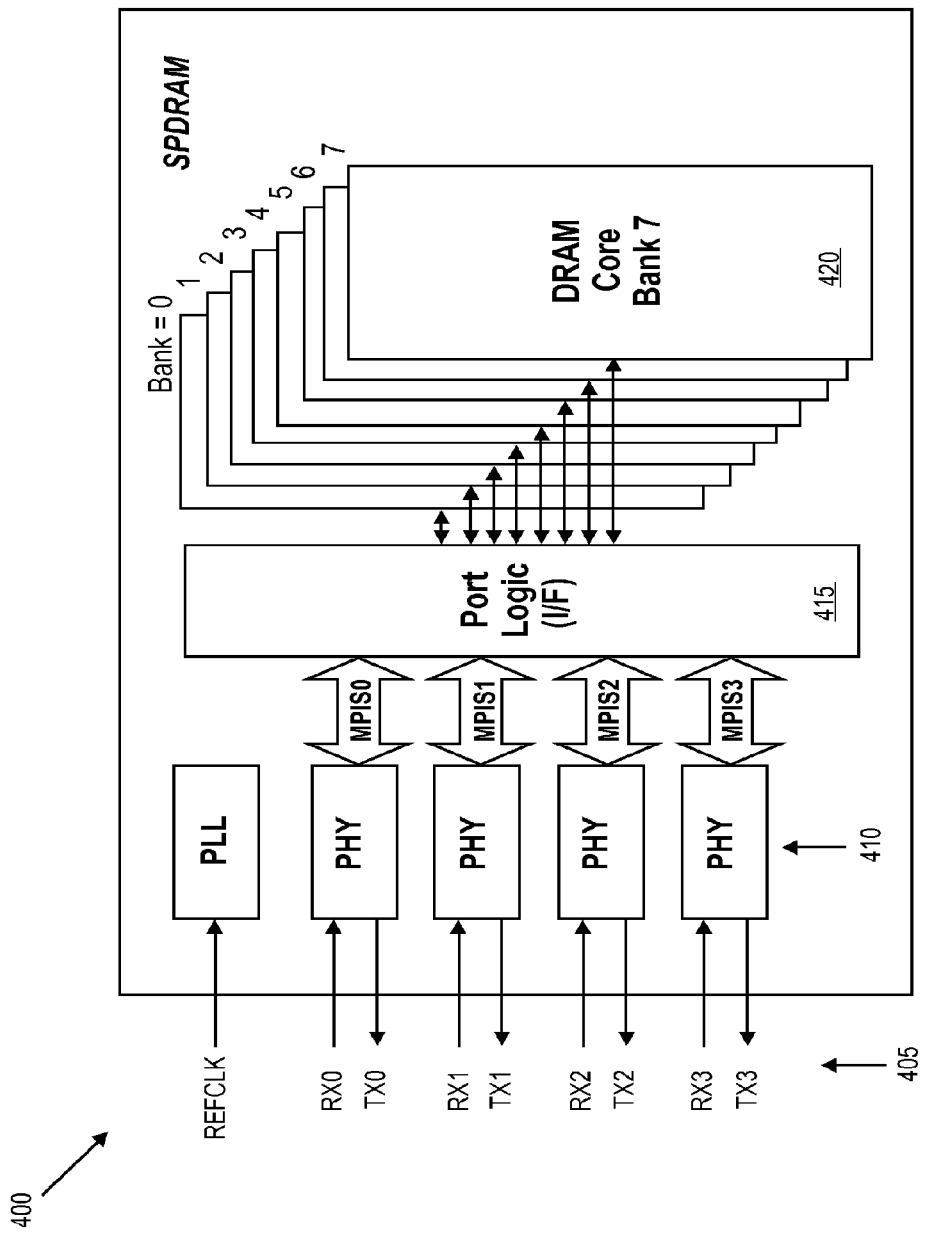
FIG. 4 is an illustration of an embodiment of an SPDRAM memory architecture.

FIG. 4 is an illustration of an embodiment of an SPDRAM memory architecture. In this illustration, the SPDRAM memory 400 is a four channel serial memory with independent bank access for each port. The ports 405 are each illustrated with a memory physical layer 410, and may comprise 4-wire differential transmit and receive links for sending commands or write data while simultaneously receiving read data at up to 5 Gbps (gigabits per seconds) each way. The memory 400 further includes port logic 415 for data storage in one or more memory banks 420, shown herein as DRAM core banks 0-7. In some embodiments, a built-in test structure is provided for the memory 400, with the test structure being used in conjunction with the testing of the memory and an interface with a host device.

Figure 5:
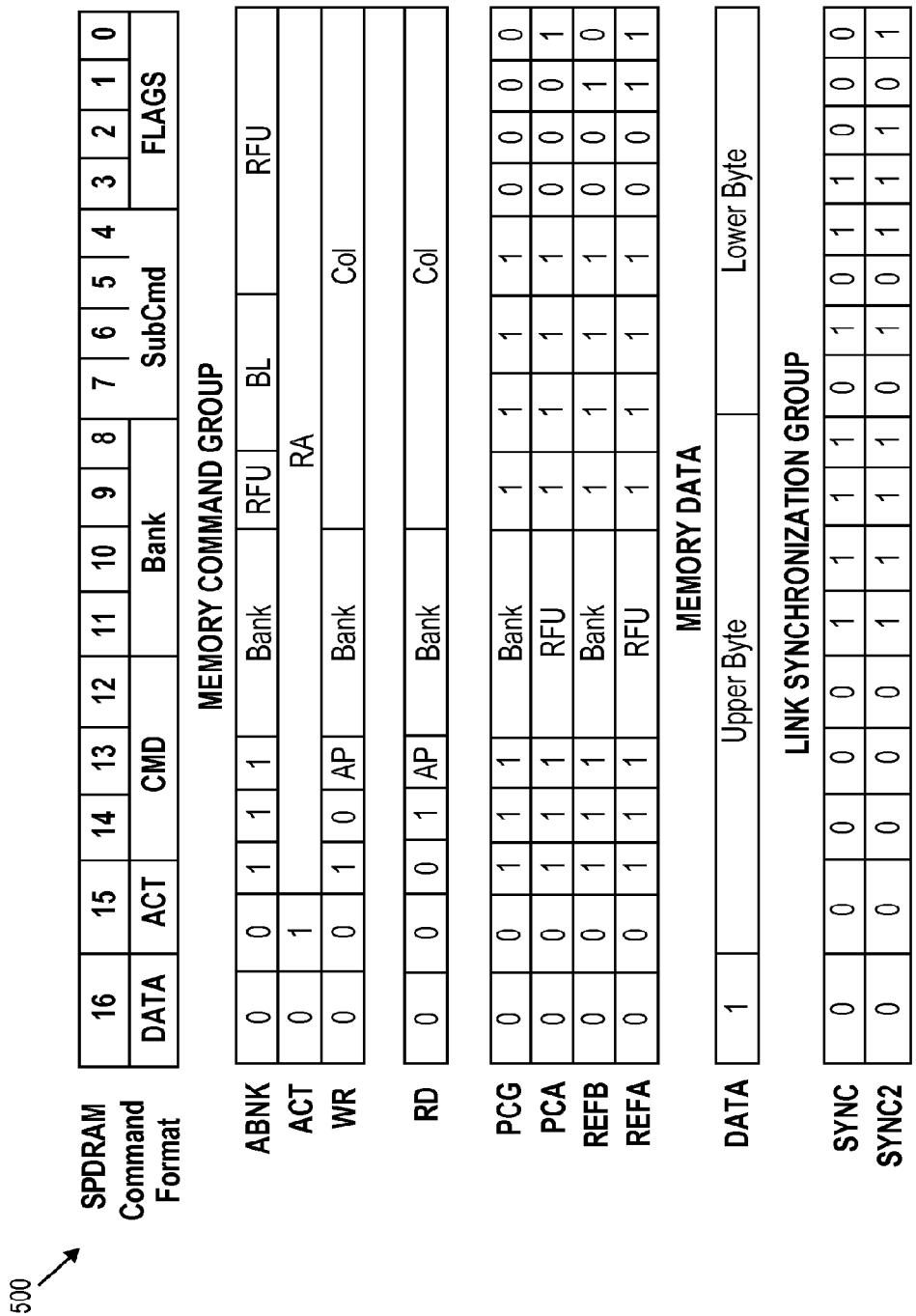
FIG. 5 is an illustration of a command set for a device that may include an embodiment of a built-in self-test structure.

FIG. 5 is an illustration of a command set 500 for a device that may include an embodiment of a built-in self-test structure. The commands include memory commands often utilized for testing DRAM memory, including precharge (PCG), activate bank (ABNK), activate (ACT), and write (WR) and read (RD) commands. In this illustration, the length of each command is 17 bits or 20 bits if encoded for transmission, with the commands including sync commands and memory commands. However, embodiments of the invention are not limited to any particular command set or command structure. In this illustration, the sync commands establish and recover link integrity.

Figure 6:
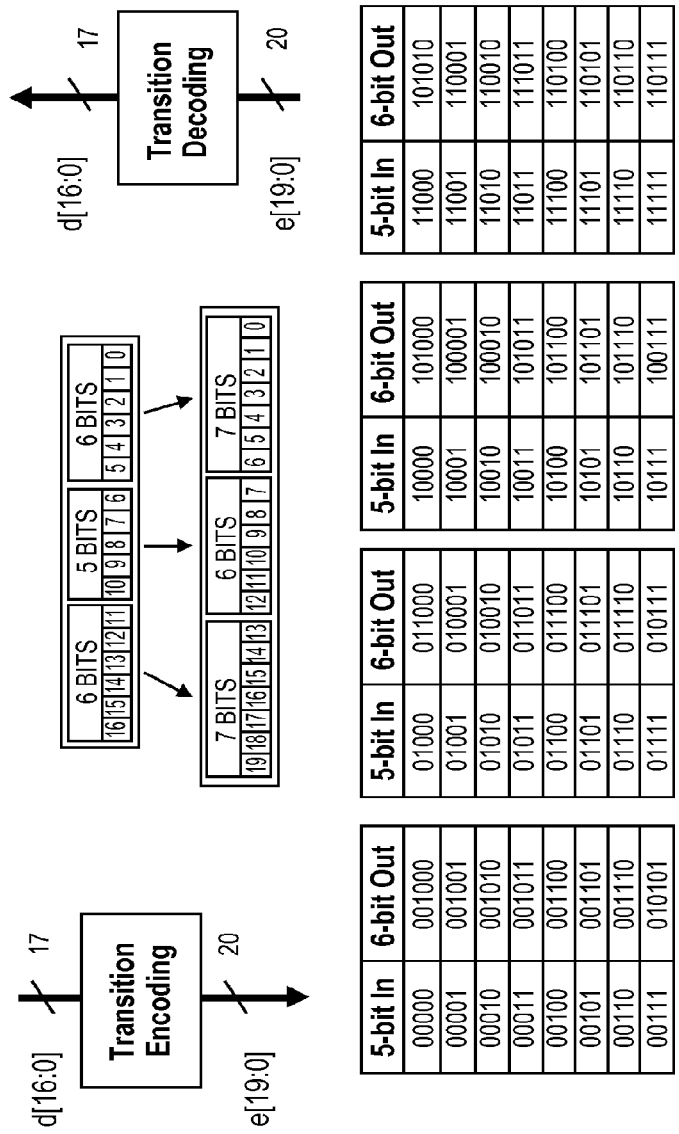
FIG. 6 is an illustration of an embodiment of transition encoding and decoding of 5-bit to 6 and 6-bit to 5, respectively.

FIGS. 6 and 7 are illustrations of how 17-bit memory commands are transformed or encoded for transmission. FIG. 6 is an illustration of an embodiment of transition encoding and decoding of 5-bit to 6 and 6-bit to 5, respectively. FIG. 7 is an illustration of an embodiment of transition encoding and decoding of 6-bit to 7 and 7-bit to 6 respectively. The 17-bit command and the 20-bit encoded command are denoted as d[16:0] and e[19:0] respectively. The encoding of the commands incorporates more transitions into the encoded commands in order to overcome inter-symbol interference (known as "ISI") problems and to recover transmitted commands more reliably at the receiver. In some embodiments, each of a 6-bit, 5-bit, and 6-bit partition of a 17-bit command is transformed into 7-bit, 6-bit, and 7-bit partitions respectively using the transformation expressions illustrated in FIGS. 6 and 7. If, for example, the 5-bit partition of command contains 11000, it is transformed into 1010101 as shown in FIG. 6. Note that the number of transition in the original 5-bit partition is increased to six transitions by the transformation. The 6-bit partition of command can similarly be transformed as illustrated in FIG. 7. The transformation ensures that run length, defined as a consecutive number of zeros or ones in the transmitted bit stream, is no more than five. Thus, there are one or more transitions in every six bits in the transmitted bit stream. In some embodiments, the decoding of encoded commands at the receiver is carried out in an opposite manner.

Figure 8:
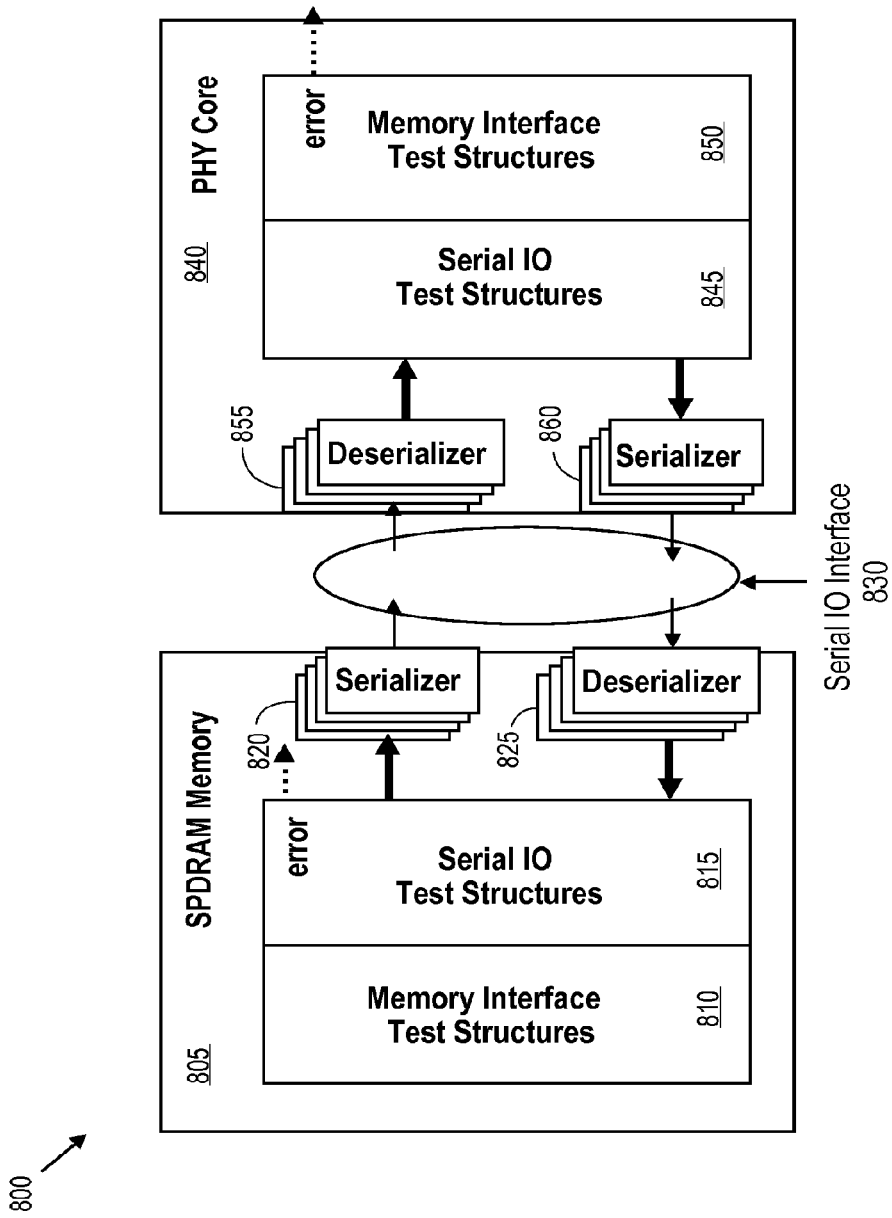
FIG. 8 is an illustration of an embodiment of a SPDRAM test structure for memory and host chips.

In some embodiments, a SPDRAM test structure may test both high-speed serial IO links and memory interface logic via the same serial IO links. FIG. 8 is an illustration of an embodiment of a SPDRAM test structure for memory and host chips that may, for example, be embedded in a system-on-chip (SOC).

In some embodiments, as described above, testing of serial IO is separated from testing of the memory interface. The testing of the memory interface may require the test patterns to comply with the SPDRAM protocol for the memory device under test. However, testing of the serial IO interface may be independent of the SPDRAM protocol. Separation of testing may be advantageous in that a full serial IO interface test may require more test patterns than what the SPDRAM protocol would allow. Separation of serial IO testing may be used to remove the test pattern compliance constraint and allow more diversified test patterns to be applied during the serial IO test. A rich set of diversified test patterns is an important element in achieving high test coverage.

In FIG. 8, the built-in self-test (BIST) hardware to target the serial IO and the memory interface includes serial IO test structures 815 and memory interface test structures 810 respectively. The serial IO test structures 815 and the memory interface test structures 810 may collectively be referred to as the SPDRAM test structure. As illustrated, a testing system includes an SPDRAM memory 805 and a PHY core 840 of a host or other device, linked by a serial IO interface 830. The SPDRAM memory 805 includes memory interface test structures 810, serial IO test structures 815, as well as serializers 820 and deserializers 825 to link to the PHY core 840 via the serial IO interface 830. The PHY core 840 includes memory interface test structures 850, serial IO test structures 845, as well as serializers 860 and deserializers 855 to link to the memory 805 via the serial IO interface 830.

Figure 9:
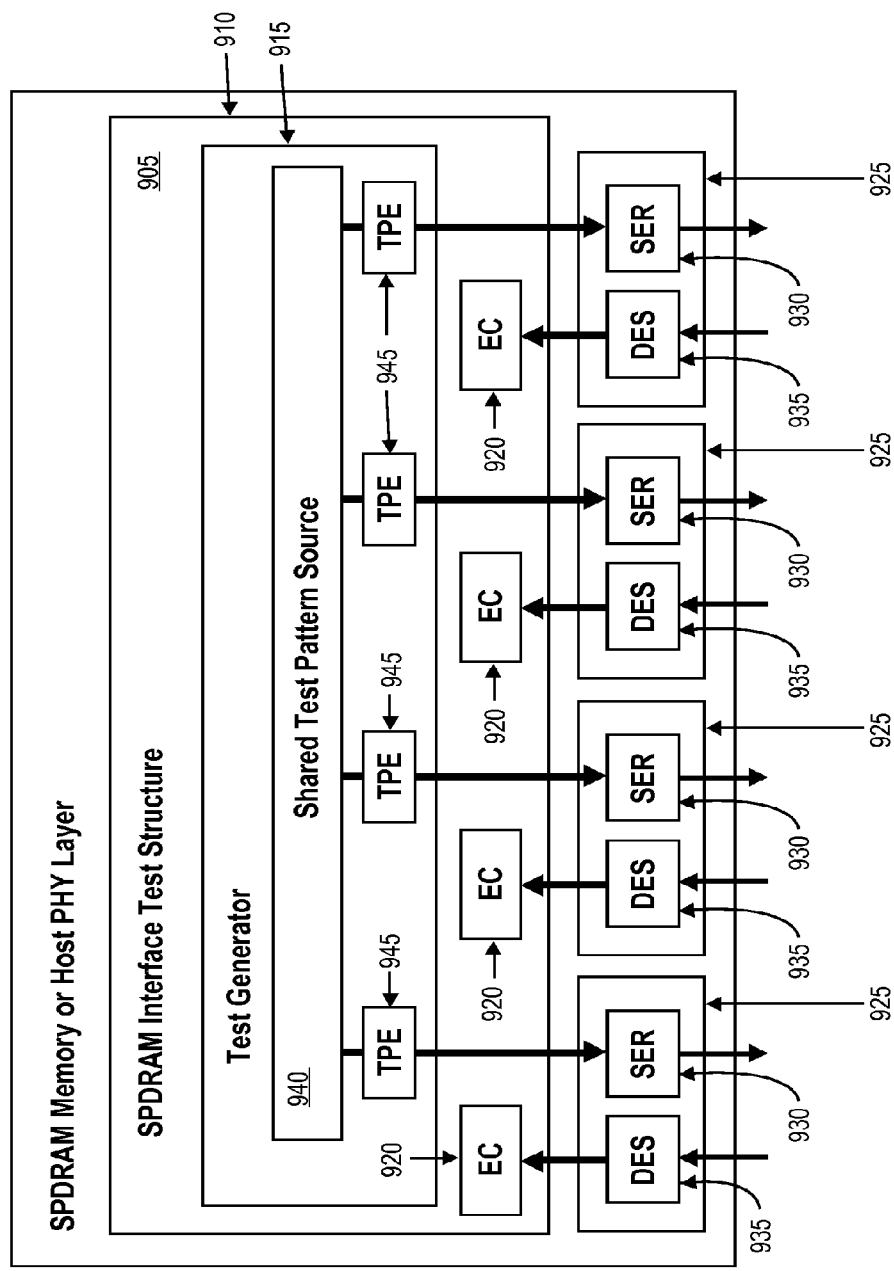
FIG. 9 is an illustration of an embodiment of an SPDRAM interface test architecture.

FIG. 9 is an illustration of an embodiment of an SPDRAM interface test architecture. In this illustration, a SPDRAM memory or host PHY layer 905 includes an SPDRAM interface test structure 910. In this illustration, the test structure 910 includes a test generator 915 and four error checkers 920, with each error checker being denoted as EC in FIG. 9. The test generator 915 contains a shared test pattern source 940 and four test property embedding (TPE) units 945. In some embodiments, a TPE unit 945 is dedicated to each PHY channel to independently modulate the test patterns generated from the shared test source in order to provide diversified test patterns to all PHY channels at a manageable hardware overhead. In some embodiments, the hardware overhead of each TPE unit 945 is significantly smaller than that of the test pattern source 940 that is shared by all PHY channels on the chip. In some embodiments, each error checker 920 is coupled with one of the ports 925, with each port including a serializer 930 and a deserializer 935 for communication via an interface. In an exemplary implementation, the test generator 915 is operable to generate a 20-bit test pattern, expand the 20-bit test pattern into an 80-bit test pattern, and distribute each 20-bit pattern to all four ports 925 directly or via a memory interface. The error checker 920 in each port is capable of independently checking for errors in incoming streams of test pattern or test data observed at the deserializer.

Figure 10:
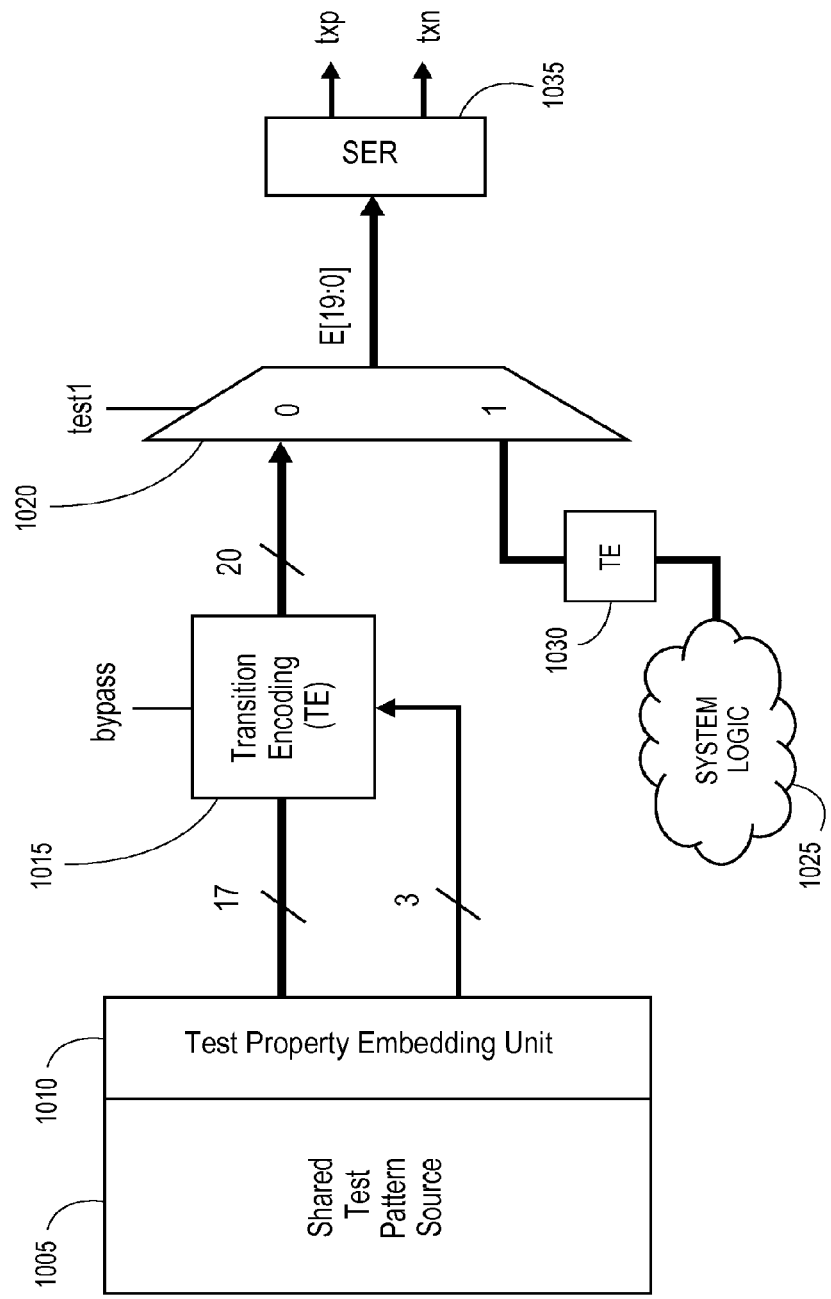
FIG. 10 illustrates an embodiment of test pattern generation in each TX (transmitter) channel of a unit under test.

FIG. 10 illustrates an embodiment of test pattern generation in each TX channel of a unit under test. In this illustration, a shared test pattern source 1005 generates a 20-bit test data or test signal. Depending on the test mode, the 20-bit or 17-bit data contains meaningful test information. The 17-bit or 20-bit test signal is encoded into 20-bit before transmission. The shared test pattern source is coupled with a test property embedding unit (TPE) 1010. The TPE is programmed to modulate 20-bit and 17-bit test signals. The TPE is also programmed to bypass the 20-bit test signal. The shared test pattern source via the TPE provides a 20-bit test signal to a transition encoding unit (TE) 1015. The 17-bit test signal is used for transition encoding to produce a 20-bit signal and the 3-bit test signal to is used to replace the 3 bits produced as a result of transition encoding when bypassed. The test encoding is either activated or bypassed based on the state of a bypass signal. If bypass=0, the 20-bit output test signal is produced from the transition encoding. Otherwise, the transition encoding is disabled and the 17-bit and the 3-bit input test signals are combined to produce the 20-bit output test signal. The resulting 20-bit test signal is provided to a multiplexer 1020, which may also receive signals from a system logic 1025 via a second test encoding unit 1030, with the test signal being selected according to a control signal test1 that controls the multiplexer 1020. The test pattern (E[19:0]) then is serialized by a serializer 1035 for transmission via the interface.

Figure 11:
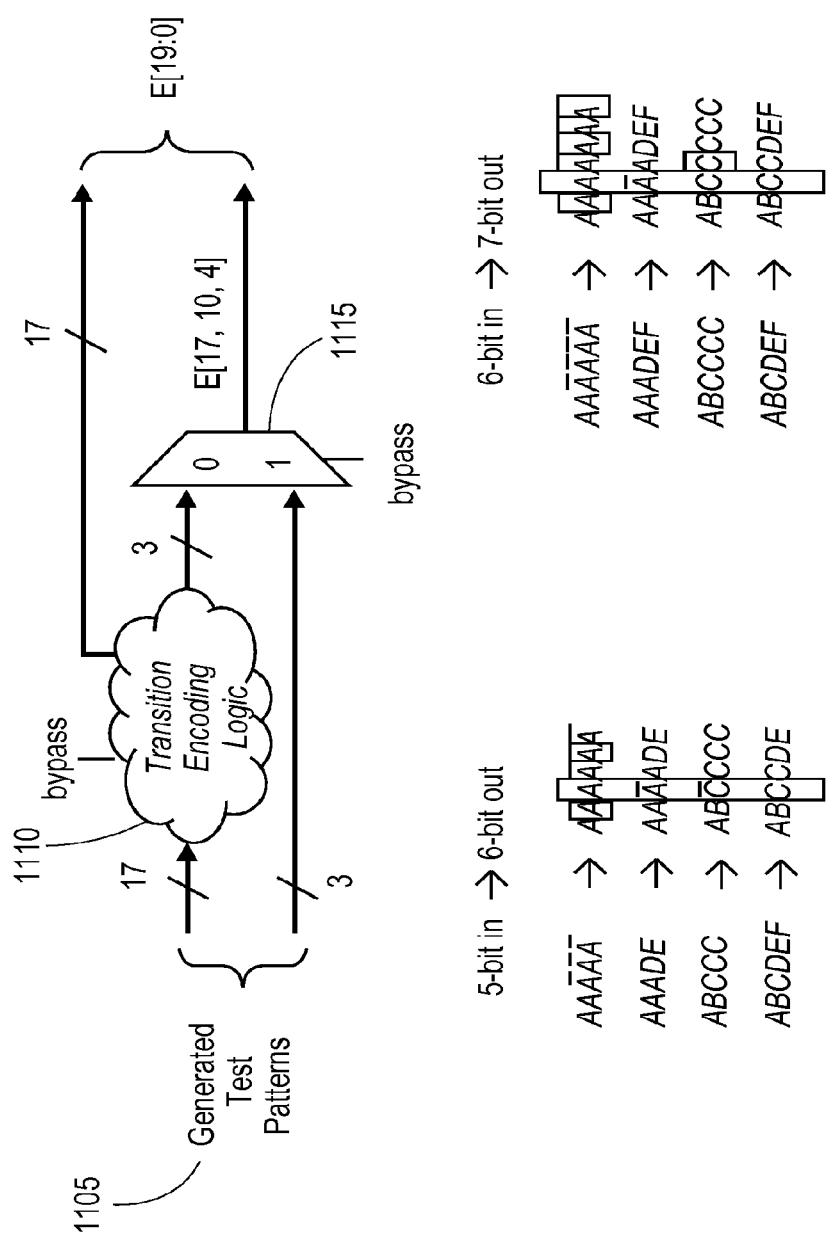
FIG. 11 is an illustration of 20-bit test pattern generation for an embodiment of a testing system or method.
Figure 12:
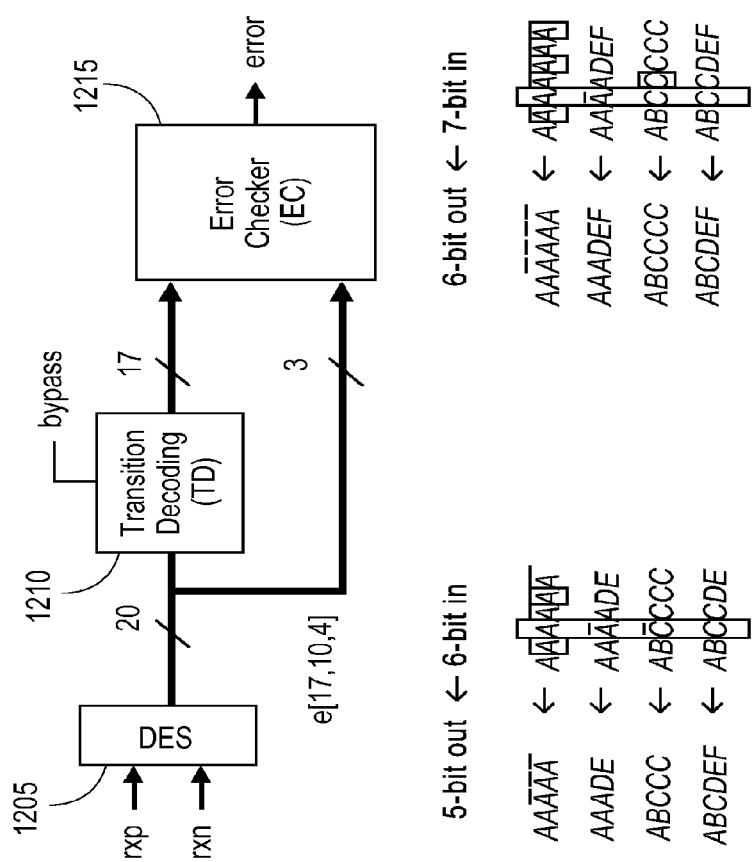
FIG. 12 is an illustration of 20-bit test pattern processing for an embodiment of a testing system or method.

FIGS. 11 and 12 are detailed illustrations of processes for 20-bit data generation at the transmitter and processing at the receiver in an embodiment of a test. FIG. 11 is an illustration of 20-bit test pattern generation for an embodiment of a testing system or method. In this illustration, generated 17-bit test patterns 1105 are provided to a transition encoding logic 1110, with a 3-bit test signal being provided to a multiplexor 1115. In some embodiments, a generator can generate the 20-bit data pattern directly or via a transition encoding unit (TE). If the bypass=0, for example, the 17-bit data is transformed into 20-bit by the TE. Otherwise, the 17-bit input is bypassed in the TE and merged with 3-bit input provided by the test generator to make up 20 bits. In some embodment, the bypass signal is derived from the test mode signals.

FIG. 11 is an illustration of 20-bit test pattern processing for an embodiment of a testing system or method. In some embodiment, a bypass turns on and off complementation implemented in the transformation expression. If the bypass=0, as illustrated in FIG. 12, the 20-bit data is obtained from the 17/20 transformation carried out by the TE and the 3-bit input from the test generator is ignored. The 17/20 transformation denotes the data transformation from 17-bit to 20-bit carried out by the TE. If, however, bypass=1, the third column from the left in the given transformation expression is replaced with one bit of 3-bit input from the test generator. Since there are 3 partitions (i.e. 6-bit, 5-bit and 6-bit) in 17-bit data, the three corresponding columns are replaced with 3-bit input. In addition to column replacement, the complementation in the transformation is disabled so that original data can be produced at the output of TE. The multiplexer shown in FIG. 11 implements the column replacement in the test generator resided in the transmitter. FIG. 12 is an illustration of how the recovered 20-bit data at the receiver can similarly be processed. After the deserializer 1205, if the bypass=1, transformation is disabled and the 20-bit data is provided to the error checker 1215. Otherwise, the 20-bit data is decoded to 17-bit data via the transition decoding unit (TD) 1210. The decoded 17-bit data is provided to the error checker 1215 and the 3-bit data that corresponds to columns introduced by 17/20 transformation is ignored at the error checker 1215. Similarly, the transformation from 20-bit to 17-bit carried out by the TD 1210 is denoted as 20/17 transformation.

In an embodiment, in order to reduce hardware overhead and increase flexibility of testing, a system or process may employ a property-oriented test method. In some embodiments, the test method is a non-PRBS (PRBS being a pseudo-random binary sequence) based test method and may reduce size of test hardware significantly compared to that of PRBS-based conventional BIST. Because an embodiment of such a test system or process is independent of a PRBS polynomial, the testing of SPDRAM device at manufacturing, characterization, and silicon debug stages may also be more flexible. Both the PRBS patterns and non-PRBS patterns may be applied to the device under test.

Figure 13:
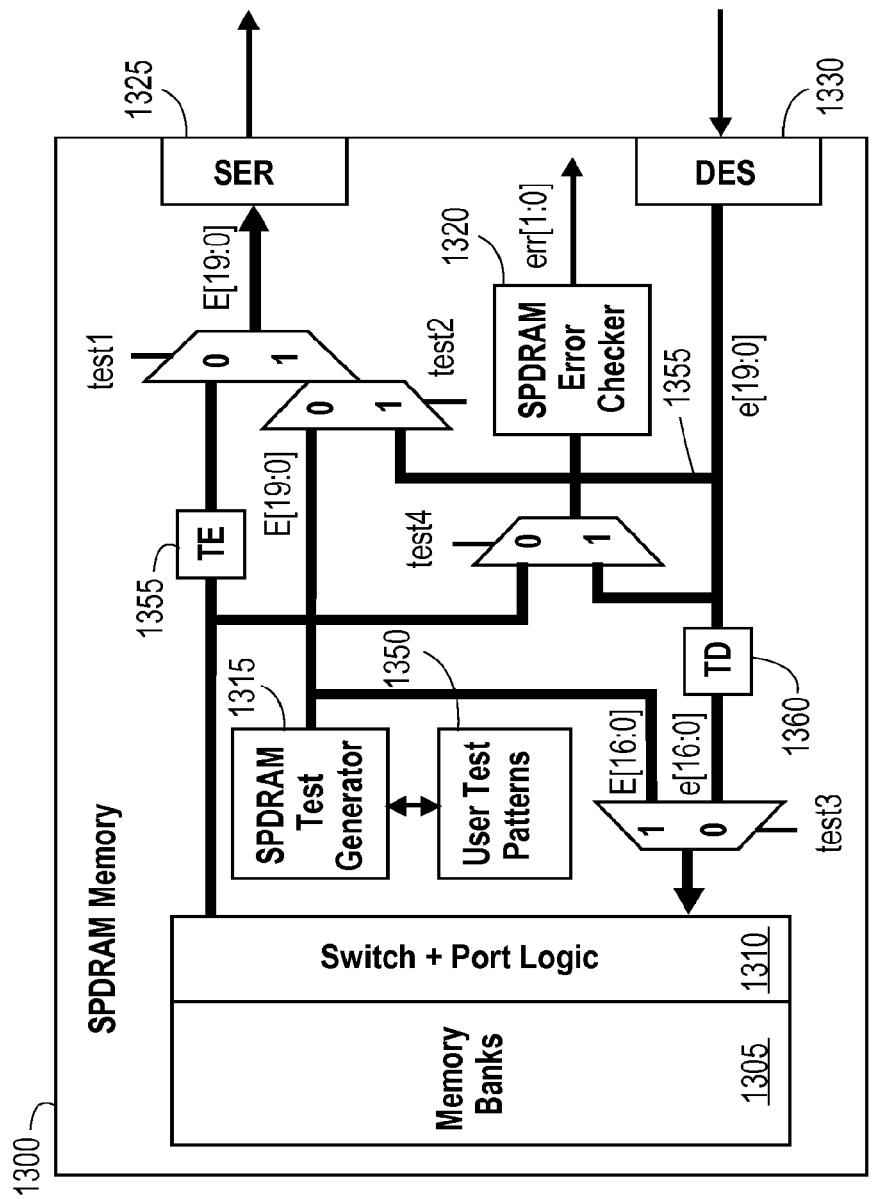
FIG. 13 is an illustration of an embodiment of an SPDRAM test structure for a memory.
Figure 14:
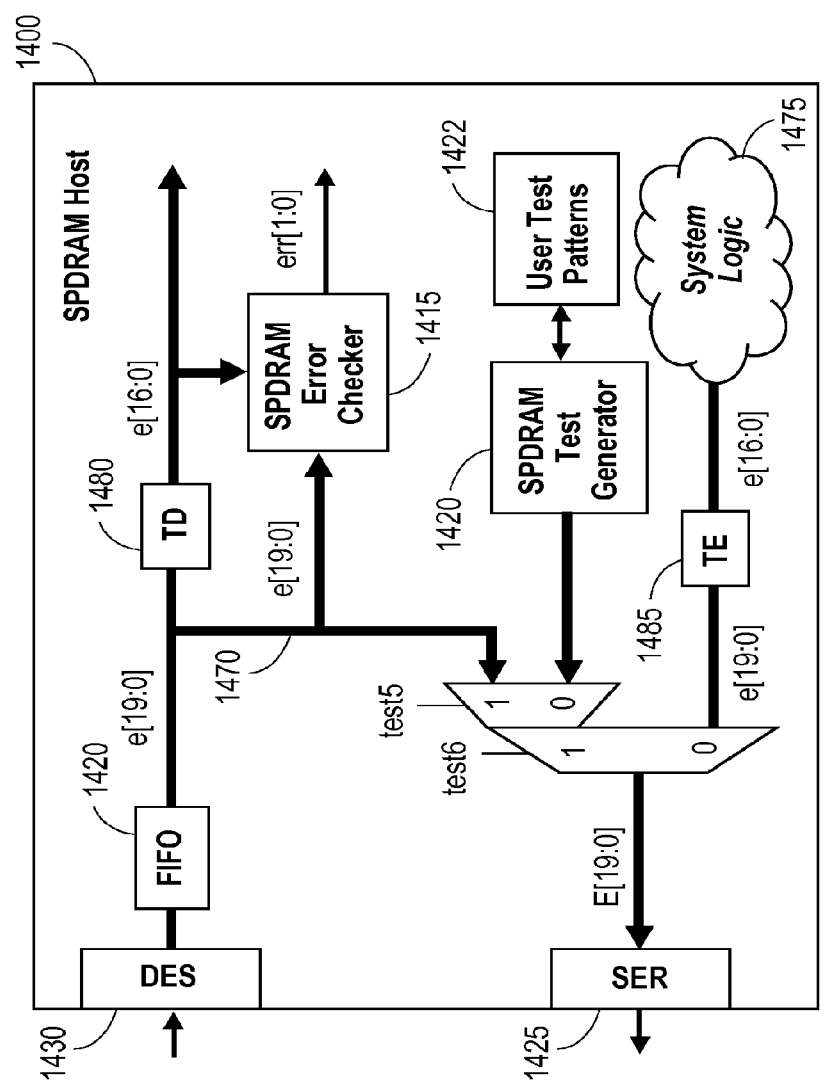
FIG. 14 is an illustration of an embodiment of an SPDRAM test structure for a host chip.

FIG. 13 is an illustration of an embodiment of an SPDRAM test structure for a memory, and FIG. 14 is an illustration of an embodiment of an SPDRAM test structure for a host chip. The SPDRAM memory test structure shown in FIG. 13 may be utilized to test the serial IO interface of a memory chip directly or through the memory logic. As illustrated, an SPDRAM memory 1300 includes memory banks 1305, switch and port logic 1310, an SPDRAM test generator 1315, an error checker 1320, a serializer 1325, and a deserializer 1330. In this illustration, a test pattern generated from a test generator 1315, which may result from user test patterns 1350, may be applied to a serial IO or internal memory interface depending on certain control signal inputs, shown as test1, test2, and test3. In this illustration the test generator contains the shared test pattern source, which is shared among the test generation circuitries on all PHY layers of the memory or of the host chip. In some embodiments, the TPE is dedicated to the test generation circuitry on each PHY layer. The error checker 1320 may inspect incoming test data for errors. The deserializer 1330 is coupled with a transition decoding unit 1360, which is coupled via a multiplexer to the switch and port logic 1310.

In some embodiments, the test structure may provide a bypass loopback path 1355 from deserializer 1330 to serializer 1325. The bypass may be active if, for example, test1=1 and test2=1. The bypass loopback path 1355 may allow the serial IO links to be tested externally, and may be utilized to enhance diagnostic resolution. If, for example, a serial IO link fails using the internal test structure but is validated through the bypass loopback path, then it may be concluded that the serial IO link is not a cause of failure. The failure may instead result from the internal test path including the internal BIST test structure. In an embodiment, the error checker 1320 may be enabled during a bypass test mode. The error checker 1320 can further enhance diagnostic resolution of serial IO test path to the deserializer 1330. In some embodiments, a system may also accommodate non-compatible BIST circuitry used in the SPDRAM memory. In a board-level test, for example, the BIST test structure in the PHY core (or in a SOC) may validate the serial IO links in the SPDRAM memory device through the internal bypass loopback path.

Similarly, the memory interface test structure may be implemented in the SPDRAM host as shown in FIG. 14. As illustrated, host 1400 includes an SPDRAM test generator 1420, receiving user test pattern 1422, an error checker 1415, a serializer 1425, and a deserializer 1430 that is coupled with a FIFO 1432, which is coupled with transition decoding unit 1480. The host 1400 further including a link to system logic 1475, which is coupled with transition encoding unit 1485. In such apparatus, a bypass loopback 1470 may be introduced for certain testing. Providing the memory interface test capability in the host chip may provide advantages for a board-level test or for manufacturing test of SPDRAM memory chips. SPDRAM memory chips may be constrained with regard to chip area and thus implementation of full memory interface test features may not be feasible. In such a case, the memory interface test structure may be implemented in the host chip and may be utilized to validate the memory interface of SPDRAM memories on the system board. In some embodiments, the same host chip may be used to generate tests for SPDRAM memory chips. The generated test patterns may be delivered to the memory chips via serial IO connections. Depending on the settings of signals such as test5 and test6, the test structure may participate in a test or may be bypassed. In various implementations, the user test patterns may be implemented on chip or off chip.

Figure 15:
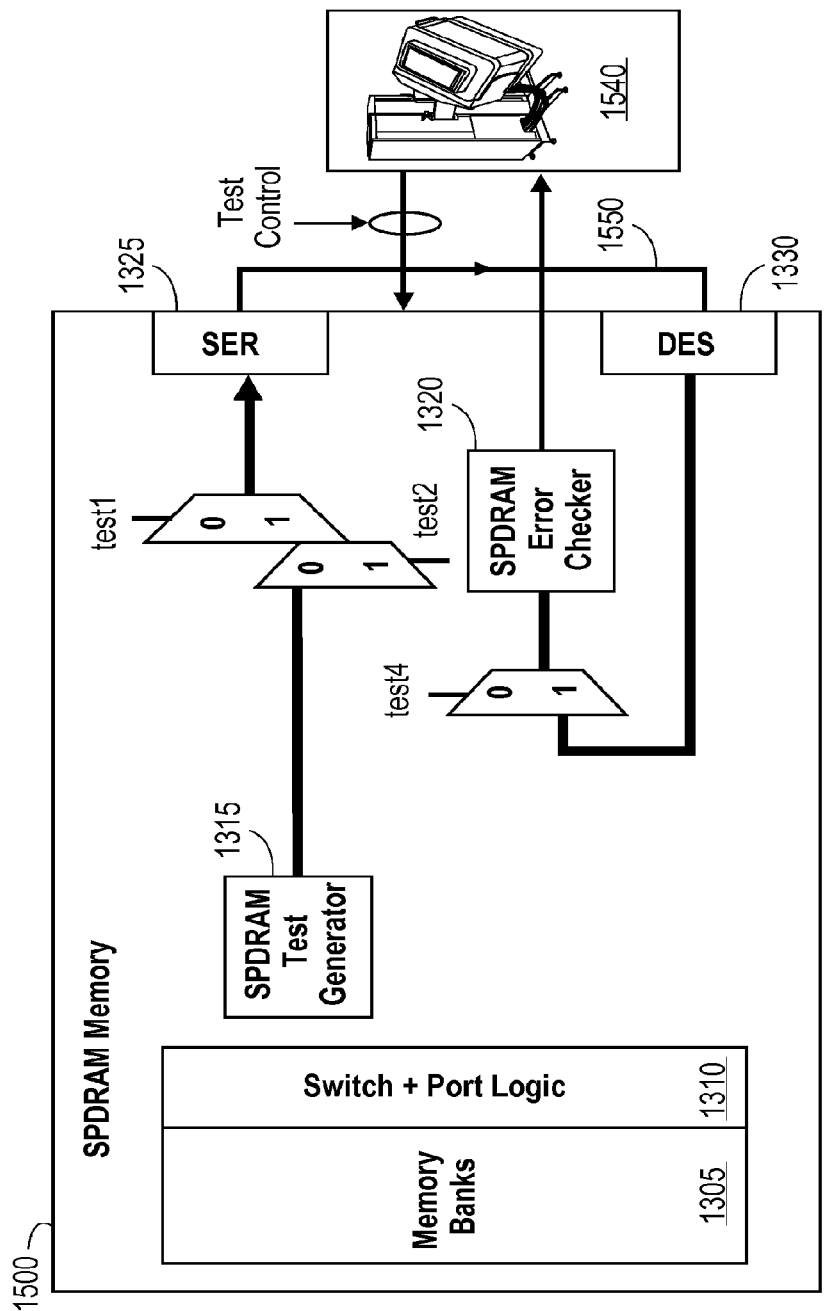
FIG. 15 is an illustration of an embodiment of a self-loopback test configuration for a serial IO interface.

FIG. 15 is an illustration of an embodiment of a self-loopback test configuration for a serial IO interface. As illustrated in FIG. 15, if control signals test1 and test2 are set to logical '1' and '0' respectively, for example, the serial IO interface may be tested via self-loopback connection. The self-loopback serial IO test is illustrated in FIG. 15. In the illustration, an SPDRAM memory 1500 includes memory banks 1305 and switch and port logic 1310. During a serial IO test, the test generator 1315 may provide a stream of 20-bit test data and the serializer 1325 transmits the generated test patterns serially to the deserializer 1330 via a self-loopback path 1550. The deserializer 1330 may reconstruct the received serial bit stream into a 20-bit test pattern and the error checker 1320 determines whether the reconstructed test pattern is valid. In some embodiments, test control may be provided by a tester 1540.

Figure 16:
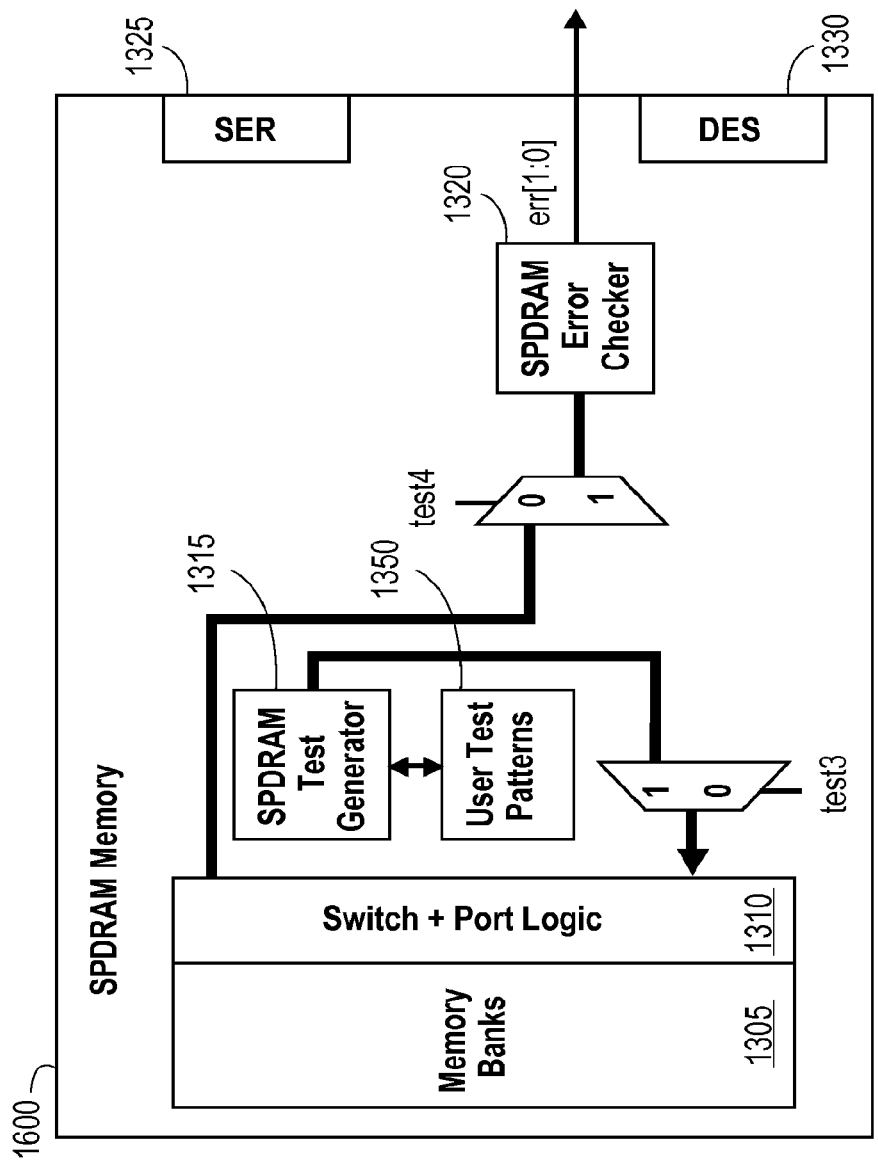
FIG. 16 is an illustration of an embodiment of a self-loopback test configuration for a memory interface.

In some embodiments, a memory interface test structure may target errors that are induced from physical defects in memory and memory interface logic such as port logic and switches. FIG. 16 is an illustration of an embodiment of a self-loopback test configuration for a memory interface. In this illustration, an SPDRAM memory 1600 includes memory banks 1305 and switch and port logic 1310, with an SPDRAM test generator 1315 that may receive user test patterns 1350. The memory may further include an SPDRAM error checker 1320 to generate an output based on an error condition. In this illustration, a memory interface test may be set up when the test mode input test4 is set to '0' and test mode input test3 is set to '1'. A sequence of generated SPDRAM commands or test patterns may be issued to the port logic in order to test the memory interface. The test response may be directly captured and checked at the error checker 1320 without going through the serial IO self-loopback. The direct observation may improve diagnostic resolution because the test of memory and memory interface circuitry can be carried out independently of the serial IO.

Instead of providing DRAM memory testing capability directly in the test structure, a proposed test structure may provide a hardware interface to accommodate user-defined test patterns for a memory test. The memory interface test structure may convert the user-defined memory test patterns into an SPDRAM commend sequence that may be utilized to implement the same test. In varying embodiments the user defined test patterns 1350 may, for example, be implemented on chip or may be provided from an external tester providing test control.

In some embodiments, an architecture allows DRAM memory manufacturers to employ their own test patterns to validate their memories through the targeted memory interface. In some embodiments, if the user-defined memory test patterns are not provided, however, the memory interface test structure may internally generate the SPDRAM test patterns for the memory interface logic. The same memory interface logic may also be tested from the external tester through the memory interface test structure.

Figure 17:
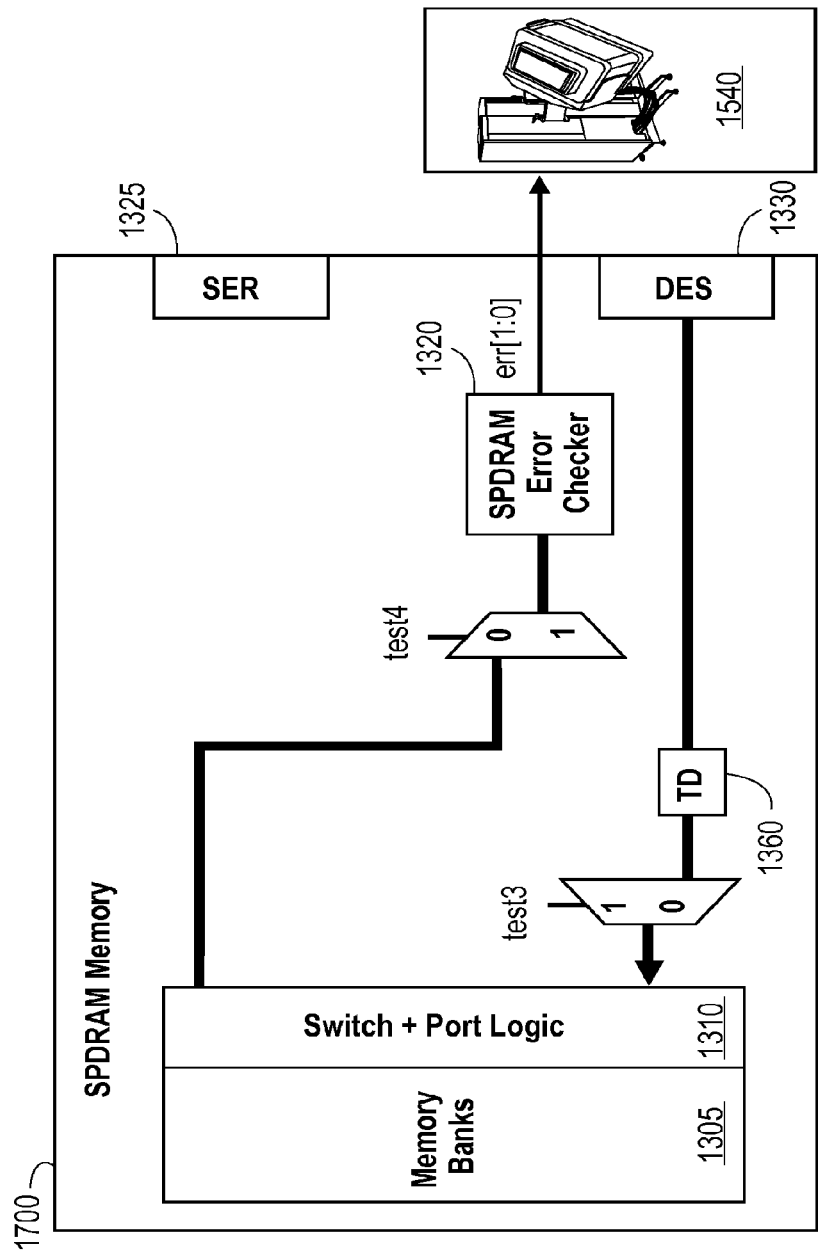
FIG. 17 is an illustration of an embodiment of a test configuration for a memory interface employing a tester including automatic test equipment (ATE)

FIG. 17 is an illustration of an embodiment of a test configuration for a memory interface employing the tester including the ATE. In this illustration, an SPDRAM memory 1700 includes memory banks 1305 and switch and port logic 1310, with an SPDRAM error checker 1320, together with a serializer 1325 and deserializer 1330. Further, a tester may be linked to the deserializer 1330, which is coupled with a transition decoding unit 1360. In some embodiments, test patterns can be supplied from the tester 1540 and errors can be checked by the on-chip error checker 1320, as shown in FIG. 17. The test mode signals, test3 and test4, may be set to logic '0' in order to configure the memory or memory interface test. In this test mode, whether to test memory or memory interface depends on the test patterns supplied by the tester 1540.

Figure 18:
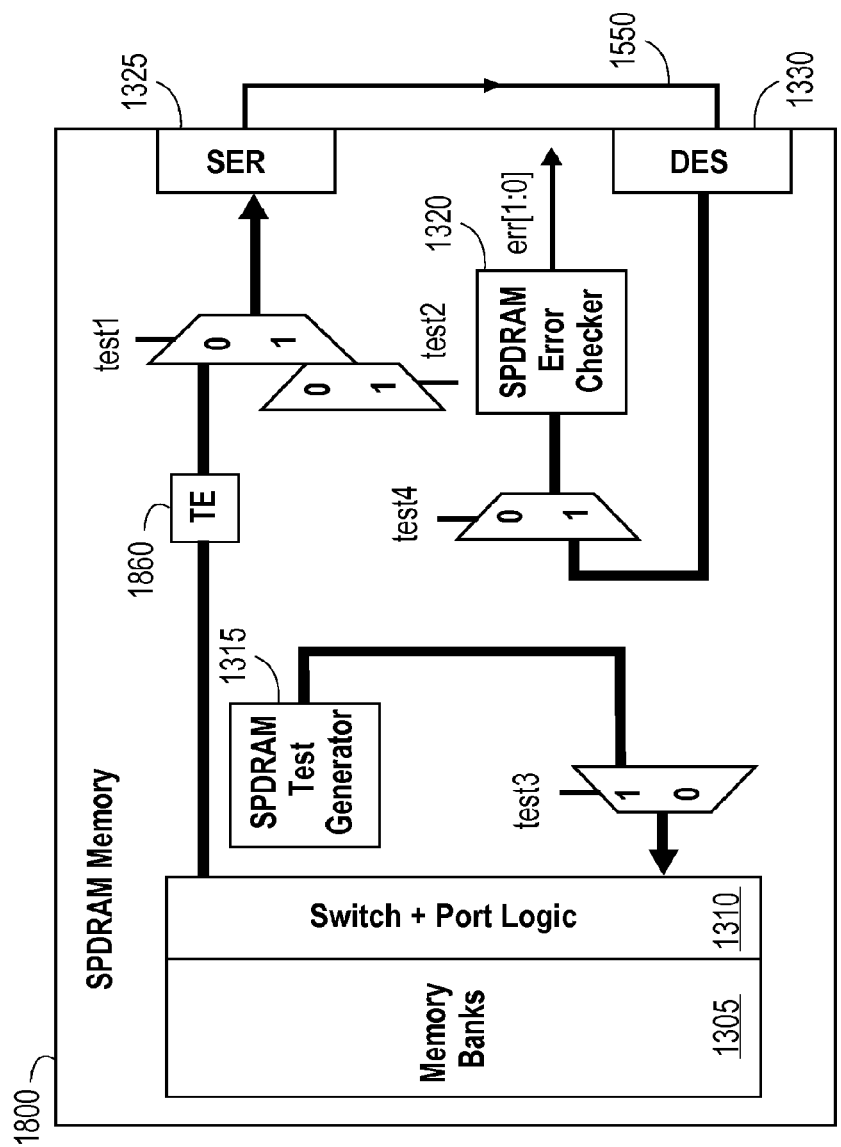
FIG. 18 is an illustration of an embodiment of a external-loopback test configuration for a functional path.
Figure 19:
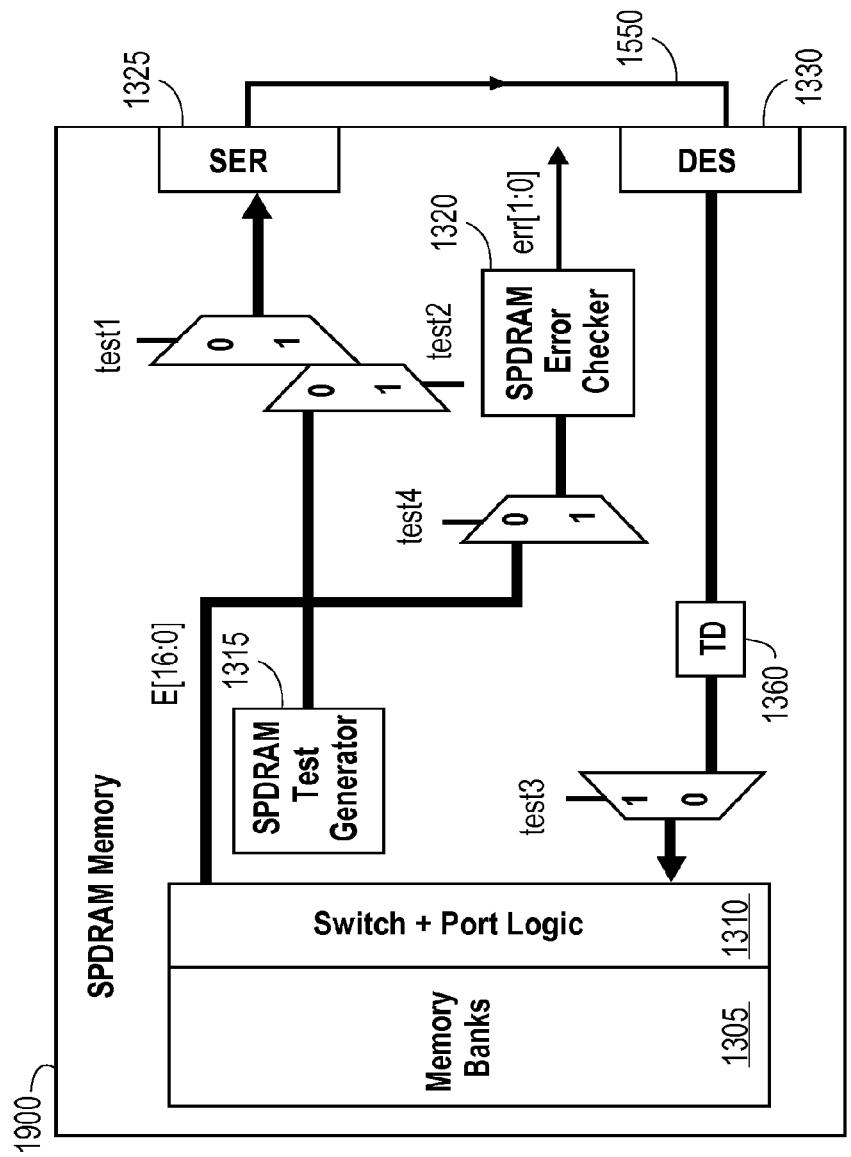
FIG. 19 is an illustration of an embodiment of a self-loopback test configuration for a functional path.

FIGS. 18 and 19 are illustrations of test configuration for testing functional paths. In some embodiments, since the SPDRAM memory chips may not accommodate standard digital tests such as structural test due to area constraint, the functional paths can be tested with the proposed test structure. FIG. 18 is an illustration of an embodiment of an external-loopback test configuration for a functional path. In this illustration, an SPDRAM memory 1800 includes memory banks 1305 and switch and port logic 1310, together with a test generator 1315 and error checker 1320. The memory further includes a serializer 1325 and deserializer 1330. In FIG. 18, the functional path from the output of memory interface through the transition encoder unit 1860 to the serializer 1325 is tested by setting the test mode signals to test1='0', test3='1' and test 4='1'. In this test configuration, the generated test commands are supplied to the memory interface and the test response are delivered to the error checker 1320 via the functional path under test and the serial IO self-loopback path 1550.

FIG. 19 is an illustration of an embodiment of a self-loopback test configuration for a functional path. In this illustration, an SPDRAM memory 1900 includes memory banks 1305 and switch and port logic 1310, together with a test generator 1315 and error checker 1320. The memory further includes a serializer 1325 and deserializer 1330, which is coupled to a transition decoding unit 1360. A test of the functional path from the deserializer 1330 to the memory interface can be established by setting the test mode signals to test1='1', test2='0', test3='0' and test4='0'. The generated test patterns can be delivered to the error checker 1320 through the serial IO self-loopback 1550, the functional path under test and the memory interface.

A memory interface test structure may be used to provide an economical test interface for an external tester. The tester may apply desired test patterns to the memory interface via the proposed test structure. The test structure then functions as a test decompression hardware, as described above. If the tester provides a READ SPDRAM test, for example, the memory test interface unit decodes the READ command into four identical READ commands with distinct memory bank addresses. The expanded READ commands may be issued to four memory banks in parallel.

Figure 20:
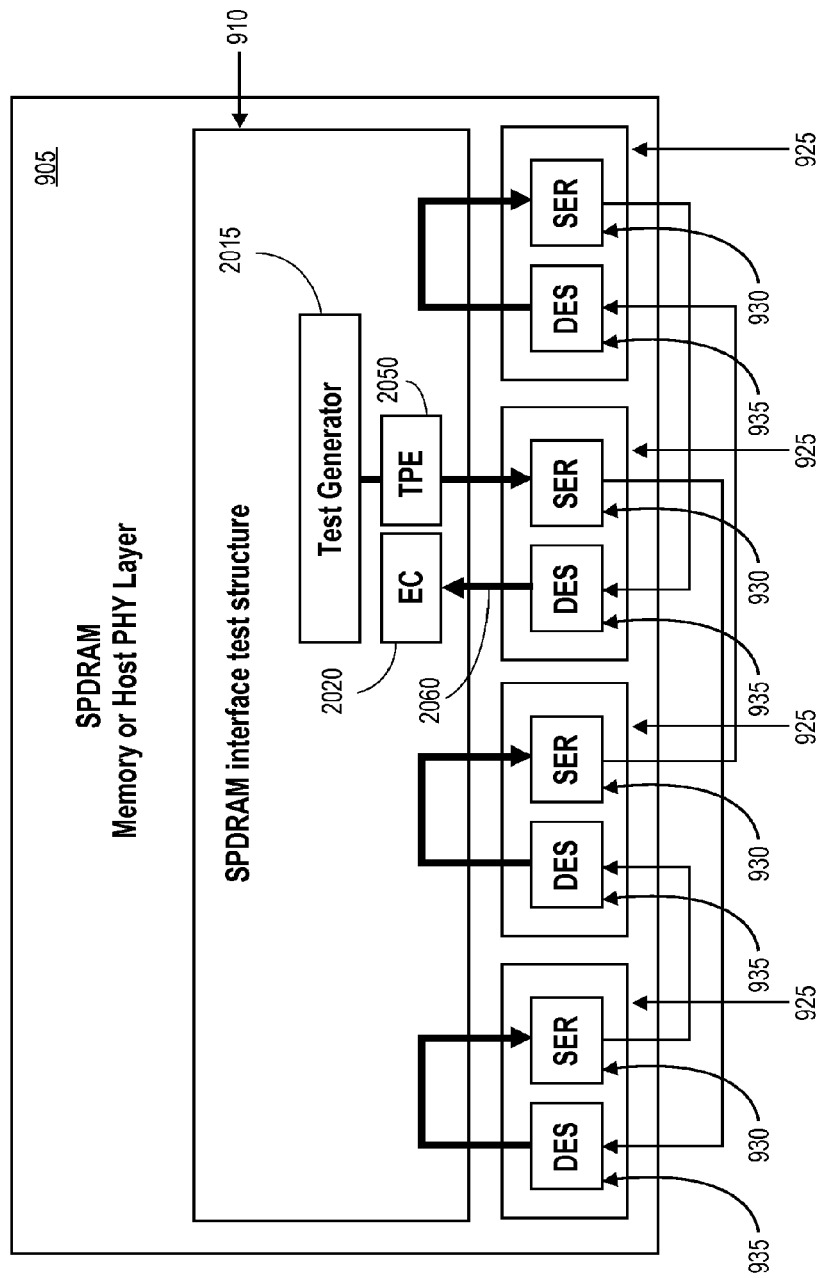
FIG. 20 illustrates an embodiment of an architecture of an SPDRAM test structure for a memory or PHY layer that employs a test generator coupled with a single port and a single error checker for the port.

If additional hardware optimization is desirable, a test generator and error checker may be shared among all ports. FIG. 20 illustrates an embodiment of an architecture of an SPDRAM test structure for a memory or PHY layer 905 that employs a test generator 2015 coupled with a single port and a single error checker 2020 for the port. In FIG. 20, all serial IO channels are connected in a serial fashion, with a serializer 930 of a first port connected to a deserializer 935 of a second port, which looped to the serializer of the second port, and the serializer 930 of the second port being connected to a third port, on so on. While the illustration provided in FIG. 20 provides one example, many different configurations are possible. In the illustrated system, generated test data may be applied to one end 2050 of the serially connected channels and the test response may be checked at the other end 2060. The proposed architecture in FIG. 20 may also efficiently be applied to conventional BIST systems in order to reduce hardware overhead.

Figure 21:
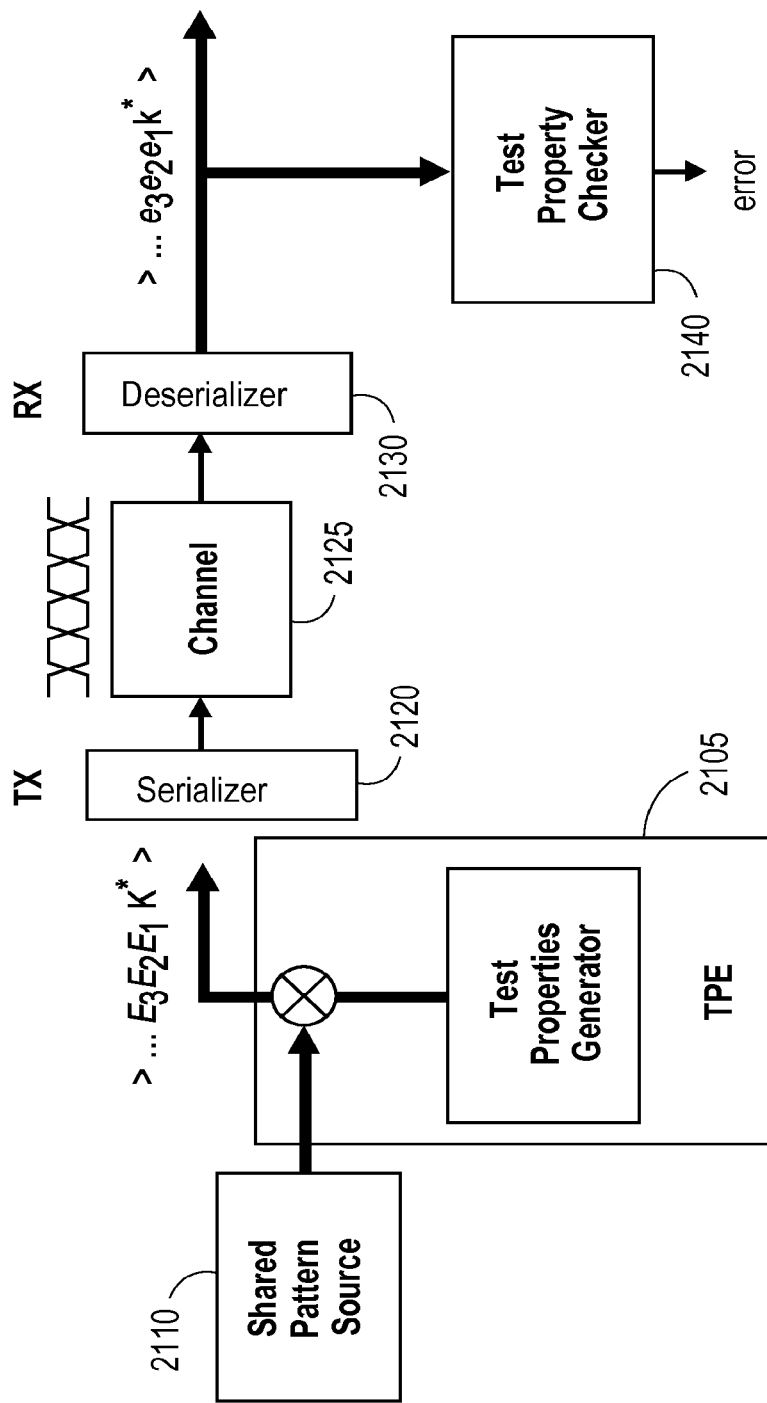
FIG. 21 is an illustration of an embodiment of a test system.

In some embodiments, the SPDRAM serial IO test structure may target errors in serial IO links. In some embodiments, the test structure may utilize a test encoding concept such as, for example, the test provided in presented in U.S. patent application Ser. No. 11/742,358, entitled "Interface Test Circuitry and Methods". In some embodiments, the serial IO test structure does not recognize SPDRAM commands, and may apply any test encoded 20-bit test patterns to the serial IO test. FIG. 21 is an illustration of an embodiment of a test system. The system includes a test properties generator 2105 and a pattern source 2110 coupled with a serializer 2120 for the transmitting side. The signals are transmitted across a channel 2125 and are deserialized by a deserializer 2130 for the receiving side, and examined by a test properties checker 2140 to detect errors. As illustrated, the system may embed or encode the test properties 2105 into the transmitted test patterns 2110. The test properties may then be extracted from the stream of received test patterns, and may be checked by the test properties checker 2140 for the existence of errors.

In some embodiments, a serial IO test structure may be utilized to offer a rich set of programmable test patterns at both the transmitter (TX) and the receiver (RX) for characterization, manufacturing test, and silicon debug. In FIG. 21, the upper and lower type characters are used to denote action of transmitter (TX) and of receiver (RX) respectively. The TX contains the serializer 2120 and the RX contains the deserializer 2130. The symbol K* may, for example, denote a number of repetitions of a sync command SYNC or SYNC2. Every test pattern is prefixed with a sequence of sync commands to synchronize the beginning of test patterns. Thus, the prefixed sequence of sync commands is not explicitly mentioned.

In some embodiments, the error check at the RX is decoupled from the serial IO test generator the TX. That is, the error checker is independent of the PRBS polynomial used to generate random test patterns. In such system, the test properties specify what kind of test patterns may be checked at the RX to validate device under test (DUT). In this sense, the test properties act as communication protocols do. In some embodiments, a system may specify types of test patterns to be transmitted over the channel during the test. The embedded properties may be extracted from the incoming stream of test patterns, and the received test patterns may be checked based at least in part on the extracted test properties to determine whether errors are present. In some embodiments, test properties may be embedded or encoded into a test pattern source. The test pattern source includes ATE vectors, PRBS patterns, and any other external pattern sources.

Figure 22:
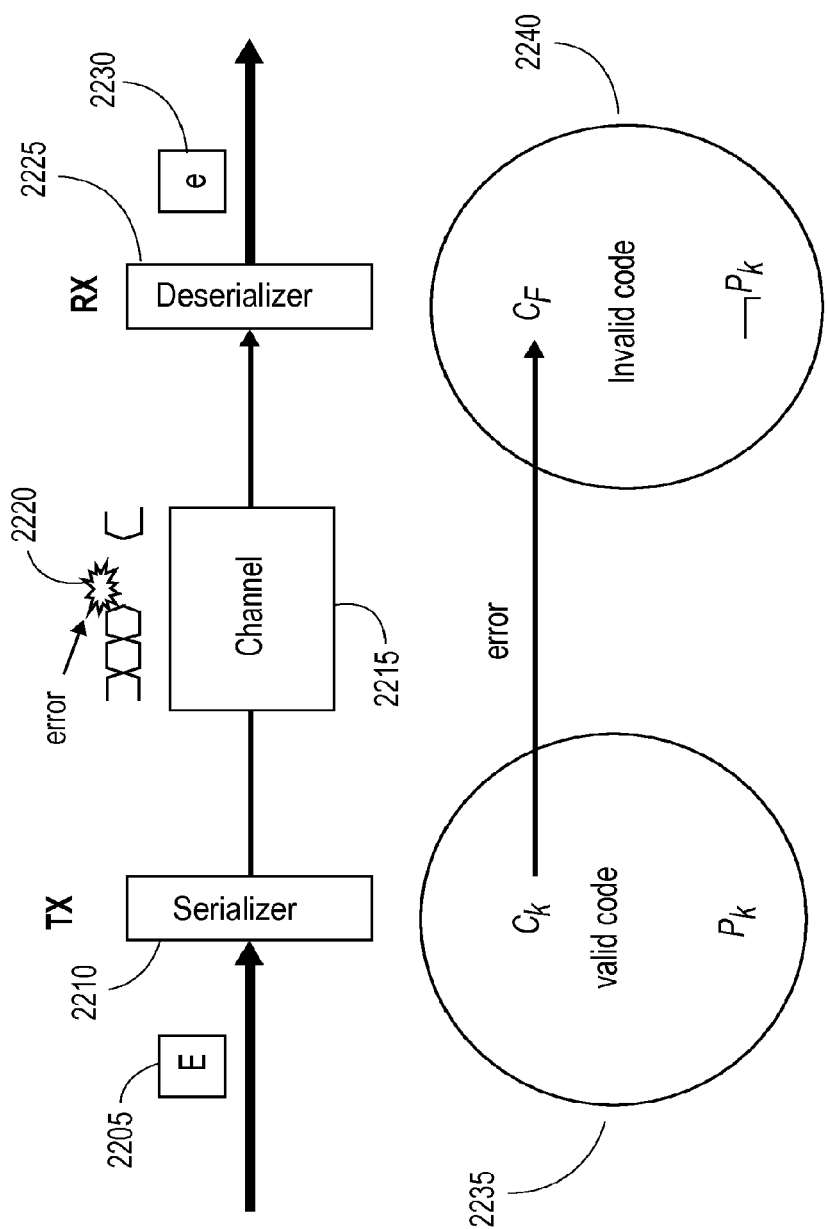
FIG. 22 illustrates an embodiment of a process for error detection.

FIG. 22 illustrates an embodiment of a process for error detection. In this illustration, test patterns 2205 with intended test properties may be serialized by a serializer 2210 and transmitted over a channel 2215, with received test patterns being deserialized by a deserializer 2225, resulting in pattern e 2230. If the error checker is capable of invalidating the test properties embedded in the transmitted data stream, the error may be checked and detected at the receiver. In this example, an error occurs 2220, thereby resulting in the received data containing a flaw, or the transformation of valid code 2235 into invalid code 2240.

The test patterns may be viewed as a sequence of 17-bit or 20-bit data. The sequence of test patterns is called a test pattern sequence. The test properties may be derived from the test pattern sequence by interpreting each test pattern as an n-tuple carrying inputs and outputs of some functions.

Figure 23:
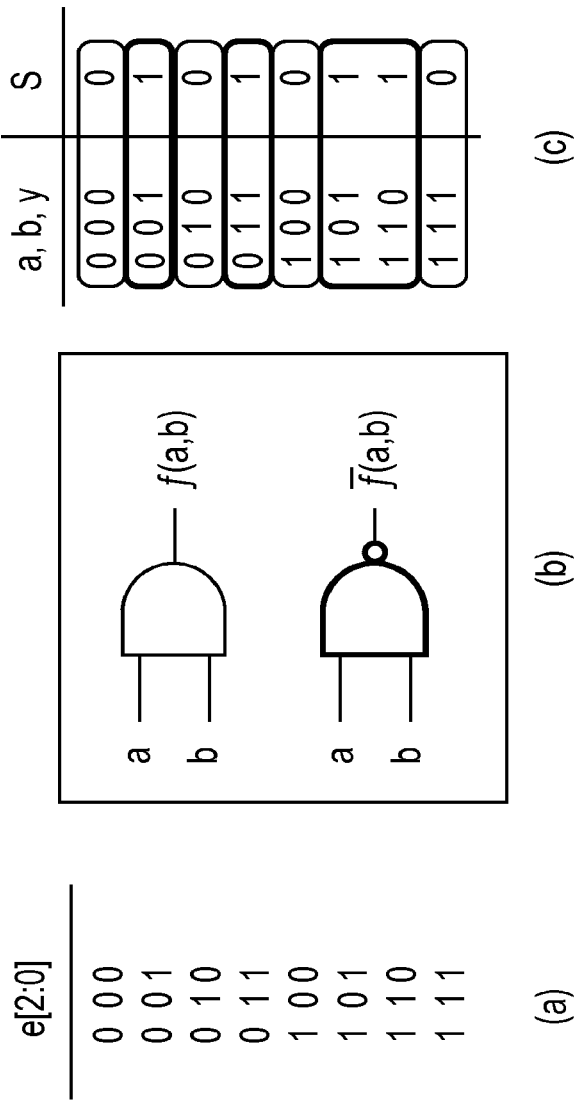
FIG. 23 illustrates a concept of test encoding functions for an embodiment of a test system.

FIG. 23 illustrates a concept of test encoding functions for an embodiment of a test system. FIG. 23 provides an illustration of an embodiment of test encoding using 3-bit data as an example. For 3-bit data or codeword, there are 8 possible codewords as shown in (a) of FIG. 23. The codeword e[2:0] is then interpreted as a triple (a, b, y) that carries input and output of some function f such that y=f(a,b). Any arbitrary Boolean function can be used to interpret the codeword. In the example, the 2-input AND function is used to interpret the codeword, as illustrated in (b) of FIG. 23. As shown in (c) of FIG. 23, the 3-bit codeword space is partitioned into 2 subsets; one subset satisfying y=f(a, b)=a & b and the other satisfying y=~f(a,b)=~(a&b), where ~f denotes complementation of function f. The column S whose each column element is a class signature indicates whether the function f(a, b) and the given output y is complemented or not. That is, if y=f(a, b), S=0 and if y=~f(a, b), S=1. For example, if E[2:0]= 000, y=0 and f(a, b)=0&0=0. Since y=f(a, b), S=0. If, however, E[2:0]=001, y=1 and f(a, b)=0. Since y≠f(a, b), y=~f(a, b) and hence S=1. The class signature sequence of test pattern is defined as a test property. If the test pattern consists of (000→110→010→101→100→011→111→001)*, the corresponding signature sequence is (0→1)* where * denote repetition. Since the test properties can be more compact than the original test patterns, they may significantly simplify the error checking task. Multiple test encoding functions may be employed if needed.

As an example shown below, each $e_i[19:0]$ in the test data stream > ... $e_3e_2e_1$> may be interpreted as 20-tuple that carries input and output of three functions. The symbol $x_k$ denotes input of function $f_k$ for k=2, 1, 0. The symbol $y_k$ denotes an output of interpretation function $f_k$, which is referred to as a test encoding function. The test encoding functions may provide interpretation of each $e_i[19:0]$ in the pattern sequence. For example, an n-bit data can be interpreted as an n-tuple vector carrying inputs and outputs of some functions. For 20-bit $e_i[19:0]$, $e_i[19:0]=(x_1, x_0, x_2, x_1, x_0, x_2, x_1, x_0, x_2, x_1, x_0, x_2, x_1, x_0, x_2, x_1, x_0, y_2, y_1, y_0)$ can be considered, for example, as 20-tuple vector that contains inputs and outputs of three arbitrary functions. The inputs and outputs are partitioned according to module-3 operation applied to indices of their bit positions. In general, module-n operation may be applied if there are n number of functions is considered. Partition of inputs and outputs according to modulo-3 operation is summarized below.

$X_0 = e_i[19:0]\uparrow\{3k | 1 \le k \le\}$ $X_1 = e_i[19:0]\uparrow\{3k+1 | 1 \le k \le 6\}$ $X_2 = e_i[19:0]\uparrow\{3k+2 | 1 \le k \le 5\}$ Where the projection operator ↑ is defined as selection of e[i] from e[19:0], if i i∈X, where a set X contains a collection of bit positions in range of 0≤i≤19. For example, $e[19:0]\uparrow\{15, 12, 9, 6, 3, 0\} = e[15, 12, 9, 6, 3, 0]$.

Each input set of encoding function $f_k$ that produce output $f_i(X_i)$ may be obtained by a projection operator defined as $e[19:0]\uparrow I$, where I denotes a set of indices of codewords. For example, as shown above, the input and output of each test encoding function may be obtained by projecting e[19:0] onto indices that are related to the test encoding function. An input set of each encoding function denoted as $X_i$ may be defined using the projection operator as in the above example. Inputs of functions may be partitioned based on modulo-3 of indices. A modulo-N based partition may provide improved error detection capability. In some embodiment, any double error can be detected if they are not NK bits apart, where K>0 and N denotes number of encoding functions employed. For example, if two errors are 3, 6, 9, 12, 15, and 18 bits apart. The minimum number of bits in between two masked errors is defined as an error masking distance δ, i.e. δ=N. the number of masked double faults η can be defined as η=W−δ, where the symbol W denotes width of codeword. For 20-bit codeword with 3 test encoding functions, W=20, δ=3 and η=W−δ=20−=17. Since errors often occur in burst, two errors which are fixed distance apart may not be common. In some embodiments, burst errors are defined as consecutive multiple bit errors in e[19:0]. For example, burst errors may occur as e[7:4]. In some embodiments, any burst errors of e[n:m] may be detected, except for the cases |n−m|+1=2NK. If, for example, three encoding functions were used, all burst errors except 6, 12, and 18 consecutive errors would be detected. The minimum burst error length of 2N is defined as the burst error masking length λ, i.e. λ=2N or 2δ. If more robust error aliasing prevention is required, the increased number of test encoding functions can be introduced or hierarchical arrangement of test encoding functions can be considered.

Figure 24:
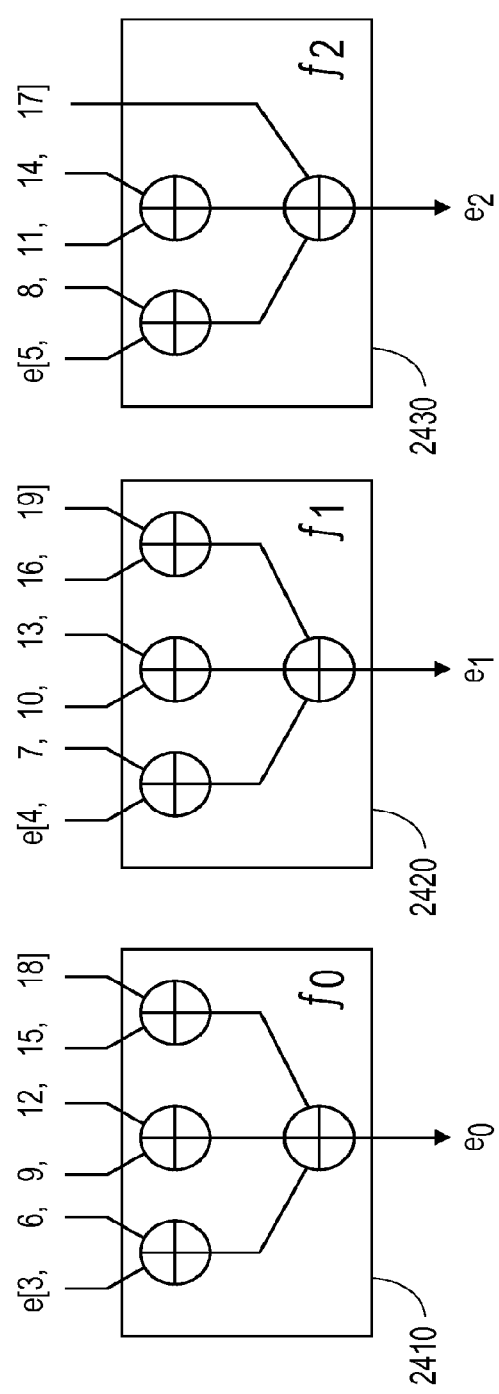
FIG. 24 illustrates an embodiment of combinational test encoding functions.

In some embodiment, test encoding functions may be combinational or sequential [2]. In order to keep discussion simple, the combinational test encoding functions are assumed in this specification. FIG. 24 illustrates an embodiment of combinational test encoding functions. In this illustration, there are three test encoding functions, $f_0$ 2410, $f_1$ 2420, and $f_2$ 2430. The functions need not be the same. In FIG. 15, the output of encoding functions $f_0$, $f_1$, and $f_2$ or their complements may be computed and placed in e[2:0] to form a desired 20-bit codeword. In some embodiments, any test encoding functions may be employed, depending on types of errors to be handled.

Figure 25:
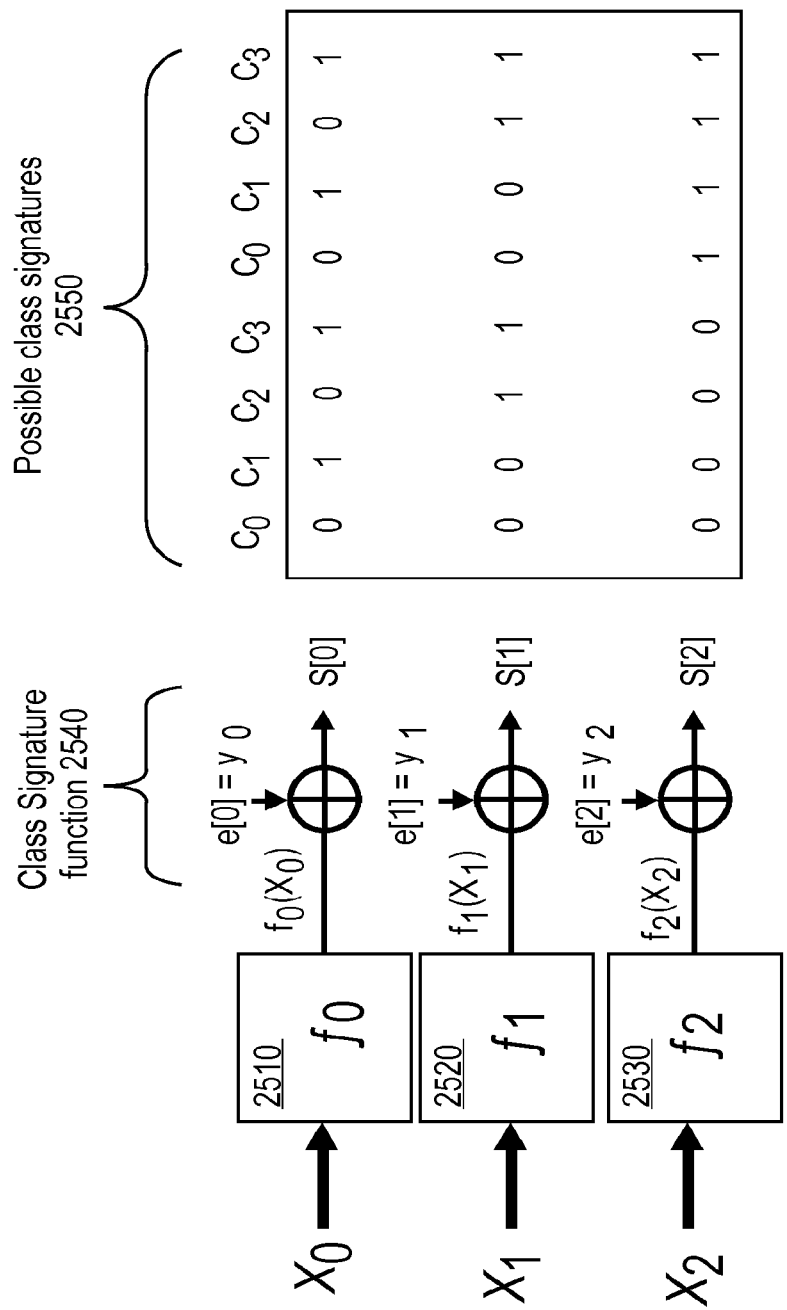
FIG. 25 is an illustration of a class signature of test data that may be utilized in an embodiment of a testing system or process.

In order to identify whether the test encoding function output is complemented or not, the mentioned class signature may be introduced in a system. FIG. 25 is an illustration of a class signature of test data that may be utilized in an embodiment of a testing system or process. As shown, the output of functions $f_0$ 2510, $f_1$ 2520, and $f_2$ 2530 are processed by a class signature function 2540, resulting in possible class signatures 2550.

In some embodiments, the class signature may be utilized to indicate how the calculated outputs of functions $f(X_2)$, $f(X_1)$, and $f(X_0)$ are related to the $e[2:0]=(y_2, y_1, y_0)$. In order to derive the intended relationship, some functions may be employed to interpret their relations. These functions are called class signature functions. In the example, the XOR functions are used to calculate class signatures. In this case, the logical 0 and 1 of class signature function output indicates $y_i=f(X_i)$ and $y_i=\neg f(X_i)$, respectively. The symbol ¬ denotes logical negation or complement. The class signature functions may be summarized as:

$$S[i] = f_i(X_i) \oplus e[i], 0 \le i \le 2$$

$$f_i(I_{y_i}) = \bigoplus_{k=1}^{|X_i|} e[3k + i], 0 \le i \le 2$$

where $|X_i|$ denotes number of elements in $X_i$

The class signature function may be expressed as $SW=f_i(X_i)\oplus e[i]$. The XOR operation indicates relationship between the output of function and the corresponding bit content in the codeword. The S[i]=0 indicates the e[i] contains the test encoding function output, i.e. $e[i]=f_i(X_i)$. Otherwise, the e[i] contains the complemented output of test encoding function.

Figure 26:
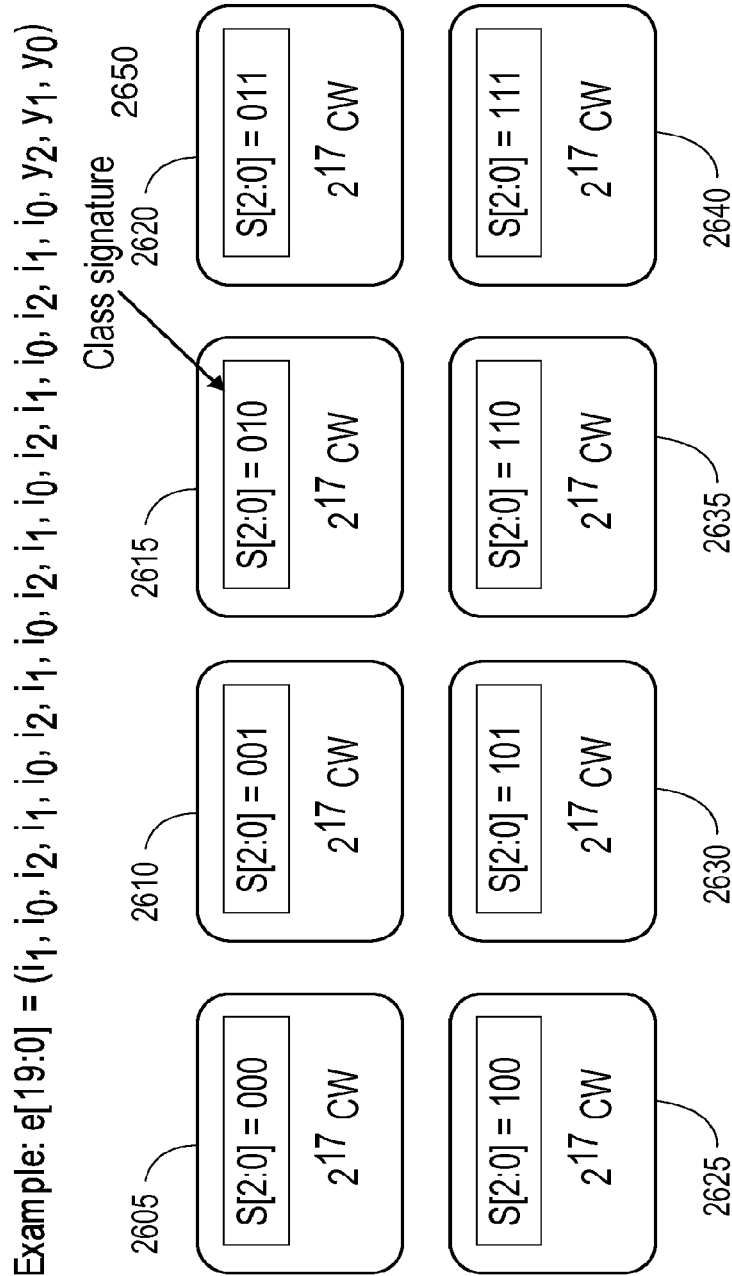
FIG. 26 is an illustration of class signatures for an embodiment of a testing structure.

FIG. 26 is an illustration of class signatures for an embodiment of a testing structure. Based on the class signature functions in the above example, there may be 8 class signatures, illustrated as signatures 2605-2640. Any codeword or test pattern must result in one of the 8 signatures. Stated in another way, the class signature functions may partition a set of all possible code words into a number of subsets. In this example, the number of subsets is $2^N$, where N is the number of test encoding functions or of class signature functions. In the example, there are 3 class signature functions denoted as S[2:0] and therefore there are 8 ($2^3$) class signatures, as shown in FIG. 26.

Figure 27:
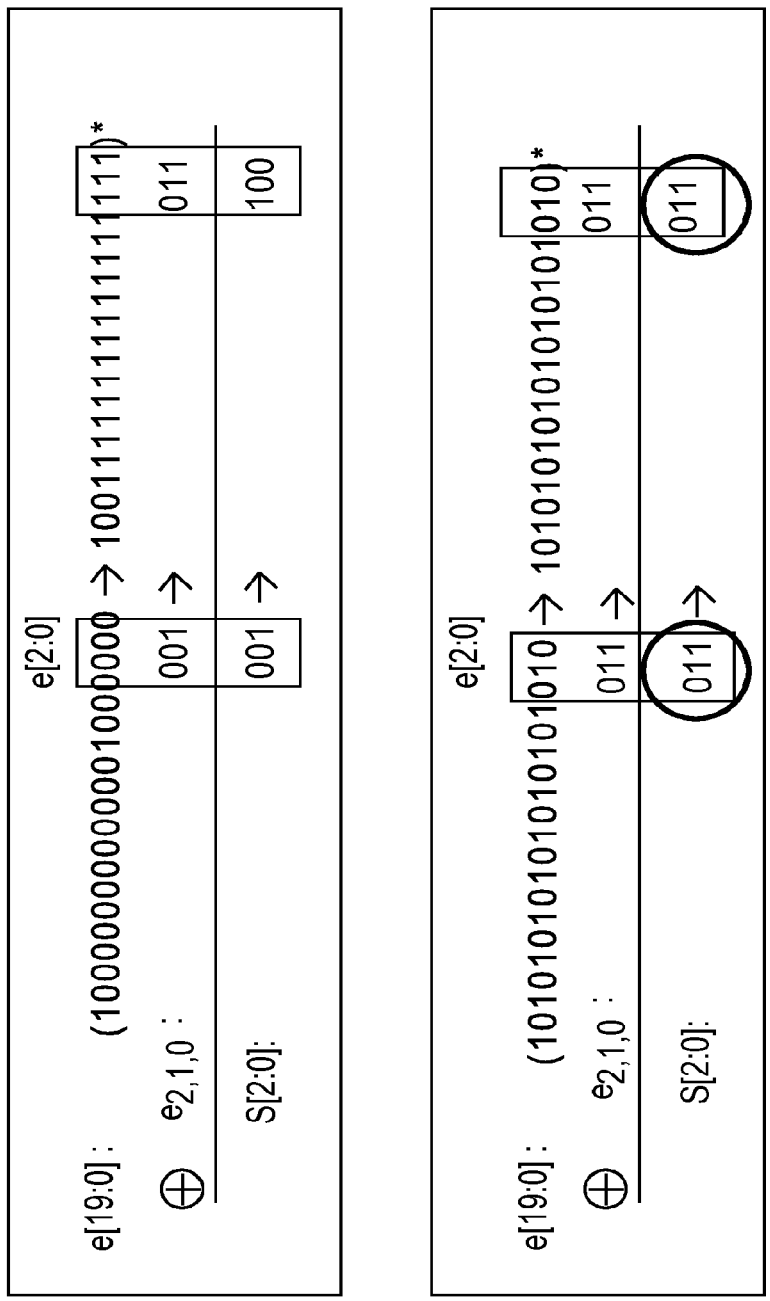
FIG. 27 is an illustration of an embodiment of a class signature sequence.

The test patterns may be viewed as an ordered list of test data that implements desired test. The test pattern sequence may be represented by the corresponding class signature sequence. FIG. 27 is an illustration of an embodiment of a class signature sequence. In an example, two code words, e[19:0]=10000000000001000000 and 10011111111111111111, are repeated in the test patterns. Then, the test encoding function outputs are 001 for the first and 110 for the second code words. The class signature for each test data may be calculated by performing bit-wise XOR functions on $f_k(X_k)$ and e[k] for k=2, 1, 0. The resulted class signature sequence is (001→100)* as depicted in FIG. 27. The symbol * denotes any number of repetitions. In the figure, the function outputs $f_2(X_2)$, $f_1(X_1)$ and $f_0(X_0)$ are denoted as $f_{210}(X_{210})$. The S[2:0] sequence of second example test pattern may similarly be obtained.

In some embodiments, the class signature functions may also be considered as an equivalence relation. Each class signature may be viewed as a representative of each class. For example, in FIG. 26, there are $2^{17}$ code words in each class which is represented by e[2:0]. Any two test patterns that have the same class signature would be equivalent.

Similarly, any test pattern sequences may be represented by their class signature sequence. For this reason, a class signature sequence may specify a class of test patterns. In the proposed approach, test properties may be expressed using the class signature sequences. In some embodiments, a system may increase a set of available test patterns at a reduced hardware overhead, with a downside that the may increase error masking compared to the conventional PRBS-based test method. Errors have the potential to change the valid test pattern sequence to a non-valid sequence that produces the same signature sequence. Based on the discussed test encoding functions, examples of errors that may be masked may include any two errors that are exactly NK apart in 20-bit codeword and 2NK burst errors mentioned earlier, where N denotes number of employed test encoding functions and where integer K>0.

Figure 28:
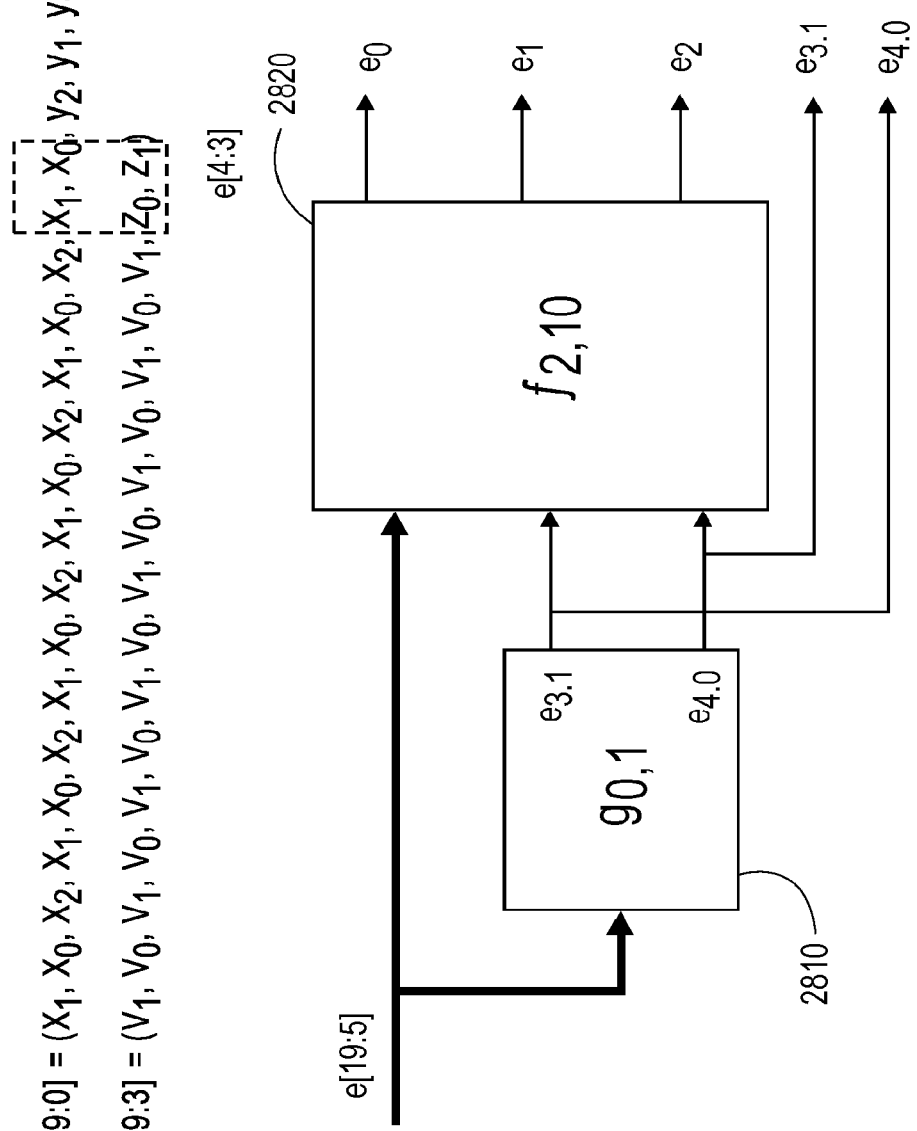
FIG. 28 is an illustration of an embodiment of hierarchical test encoding functions.

If the error masking is not acceptable for the targeted test application, then in some embodiments a different set of test encoding functions may be employed to meet system requirements. For example, two sets of odd and even numbers of test encoding functions may be hierarchically organized to embed test property into the test patterns. FIG. 28 is an illustration of an embodiment of hierarchical test encoding functions. Hierarchical test encoding functions and their interpretation is summarized in FIG. 28 using an example utilizing functions g (with odd and even inputs) and f. Similar to interpretation of [2:0] using the test encoding functions $f_{2,1,0}$ 2820, the e[3] and e[4] may also be interpreted using independent test encoding functions $g_1$ and $g_0$ 2810 respectively. The inputs of $g_1$ and $g_0$ may be obtained by modulo-2 partition of e[17:5]. That is, the input of $g_1$ is e[17, 15, 13, 11, 9, 7, 5] and the input of $g_0$ e[16, 14, 12, 10, 8, 6]. Each set of test encoding functions may be manipulated independently during the test. A separate class signature may also be defined for the portion of codeword e[17:3]. The hierarchical test encoding scheme can be denoted as TE(W, N1, N2, ..., Nm), where W and Ni denote the width of codeword and the number of test encoding functions in the hierarchical level i, respectively. For example, the test encoding scheme in FIG. 28 can be expressed as TE(20, 3, 2). The hierarchical level is determined from the width of codeword being incorporated in test encoding under consideration. The width of codeword in the (i+1)th hierarchical level, denoted by W(i+1), can recursively be determined as W(i+1)=W(i)−Ni, where W(1)=W and i>0. The (i+1)th level of codeword, denoted as CW(i+1), is defined as a codeword with the bits that carry test encoding information removed. For example, the codeword widths of first and second level of test encoding shown in FIG. 28 are W(1)=20 and W(2)=20−3=17, respectively. The hierarchical codeword can similarly be obtained as CW(1)=E[19:0] and the CW(2)=E[19:3]. Since errors are independently observed in each level of hierarchy, the error masking can occur if two errors are $$\underset{i}{\times} Ni$$

bits in the CW(max(i)), where $$\underset{i}{\times} Ni$$

denotes multiplication of all Ni in hierarchical test encoding scheme and where max(i) indicate the lowest level of hierarchy. Thus, for the hierarchical test encoding TE(W, N1, N2, ..., Nm), the error masking distance $$\delta = \underset{i}{\times} Ni,$$

the total number of masked double errors $\eta$=W(max(i))−δ and the burst error masking length λ=2δ. In FIG. 28, for example, δ=N1×N2=3×2=6 bits apart in CW(2), $\eta$=17−6=11 and λ=2δ=12. Compared to non-hierarchical test encoding expressed as TE(20, 5) where δ=5, $\eta$=15 and λ=2δ=10, the hierarchical encoding can provide improved error masking capability. Since the double error masking is possible, there can also be possible error masking with $2^n$ errors in CW(max(i)) for n=2, 3, and so on. In order to avoid double error masking, test encoding scheme can be enhanced to TE(20, 5, 3). In this encoding scheme, CW(2)=E[19:5] and W(2)=15. The masked error can occur 15 bits apart which is outside of CW[2] because the first and the last bits in the E[19:5] are 14 bits apart. Hence no error can be masked. To ensure the error masking tolerance, the test encoding scheme satisfies the followings. For test encoding scheme TE(W, N1, N2, ..., Nm),
1. No common divisor between Ni and Nj, where i≠j;
2. min (Ni)=Nm, where min(x) denotes minimum of x;
3. Number of hierarchies in test encoding scheme can be determined from total number of test encoding functions, say N, such that $$N = \sum_i Ni$$

and that $$\underset{i}{\times} Ni$$

is maximum.

For example, if ten test encoding functions were to be incorporated into the encoding scheme in 20-bit codeword, the encoding scheme TE(20, 6, 4) may not be as efficient as TE(20, 7, 3). This is because the common divisor of 6 and 4, which is 2, reduces error masking distance to be 12 and not 24. Since the error masking distance is less than in the W(2)= 14, there can be 2 masked double errors. On the other hand, there is no common divisor between 7 and 3 in the TE(20, 7, 3) and the error masking distance of 21 is maintained. Since the error masking distance exceeds the W(2)=13 or W(2)− 21=−8 which is less than zero, no error masking can be possible in TE(20, 7, 3). The width of codeword in the lowest level of hierarchy, say W(m), can affect the error detection capability. Since no error can be masked when W(m)—error masking distance<0, the W(m) should be the smallest among all W(Ni). Improvement in partition of the total number of test encoding functions can also reduce chance of error masking or increase error detection capability. The ten encoding functions in a 30-bit codeword, for example, can be implemented in 3 levels of hierarchy consisting of 5 encoding functions in the first level, 3 functions in the second and 2 functions in the third resulting the TE(30,5,3,2). The TE(30,5,3,2), for example, can detect more errors than the TE(30, 7, 3). This is because the error masking distance of TE(30, 5, 3, 2)=5×3×2=30 and W(3)=30−5−3=22 resulting W(3)−30=−8 which indicates no error masking is possible. The number of masked double errors in TE(30, 7, 3), however, can be W(2)−21=23−21=2, indicating 2 masked double errors that are 21 bits apart. The test encoding scheme for 20-bit SPDRAM codeword that allows no error masking is TE(20,5,3,2). The double errors cannot be masked in the TE(20,5,3,2) because 6=30 is significantly larger than W(3)=12. No burst error masking is possible because the burst error masking length $\lambda$ is $\lambda=2\delta=60$. Any odd number of errors can be detected by the test encoding functions in every level of hierarchy. Even number of errors which can occur as groups of smaller burst errors separated by the error-free bits can be detected at the different level of test encoding hierarchy. For example, any number of groups of errors that are separated by error-free bits within CW(3)=e[11:0] can be detected at the one or more levels of test encoding hierarchy. The N2 (or 3) number of errors that are N1−N2=2 error-free bits apart, can be detected by test encoding scheme in the level 3. The N2 number of errors that are N2−N3=1 error-free bit apart can be detected by the test encoding scheme in the level 1.

In effect, an embodiment of a hierarchical test encoding system or process may generate different and independent interpretations of the same code word. Thus, the errors masked by one interpretation may be detected by another. In this manner, the hierarchical test encoding may reduce likelihood of error masking.

Because an embodiment of a hierarchical test encoding process may be applied in the same manner as the non-hierarchical process, the non-hierarchical test encoding process is assumed here to describe the underlying concepts. A hierarchical encoding system or process is mentioned separately in this description only where necessary or appropriate, but the hierarchical process may also be employed.

The following summarizes the test property expressed in the class signature sequence of test patterns:

$$\text{seq}(\text{Test Patterns}) \Rightarrow \text{seq}(S[4:3]) \wedge \text{seq}(S[2:0])$$

Where $\text{seq}(S[4:3]) \wedge \text{seq}(S[2:0])$ denotes conjunction of test properties satisfied by the test patterns.

A test property may be understood as a specification of test patterns. The test property may specify a class or type of test pattern sequences and not a particular test pattern sequence. The logical equation with implication states that a test pattern sequence is an implementation (or member) of a corresponding class signature sequence. Composition operations may be defined for class signatures. The size of the class signature depends on the number of encoding functions to generate the class signature. For example, a 3-bit signature is considered in this document, but embodiments are not limited to any particular number of bits. In a particular implementation, if the TE(20, 5, 3, 2) hierarchical encoding implementation is applied, the 10-bit signature sequence consisting of 5-bit, 3-bit, and 2-bit hierarchical class signature sequences obtained from interpretation using the corresponding test encoding functions may also need to be satisfied.

Figure 29:
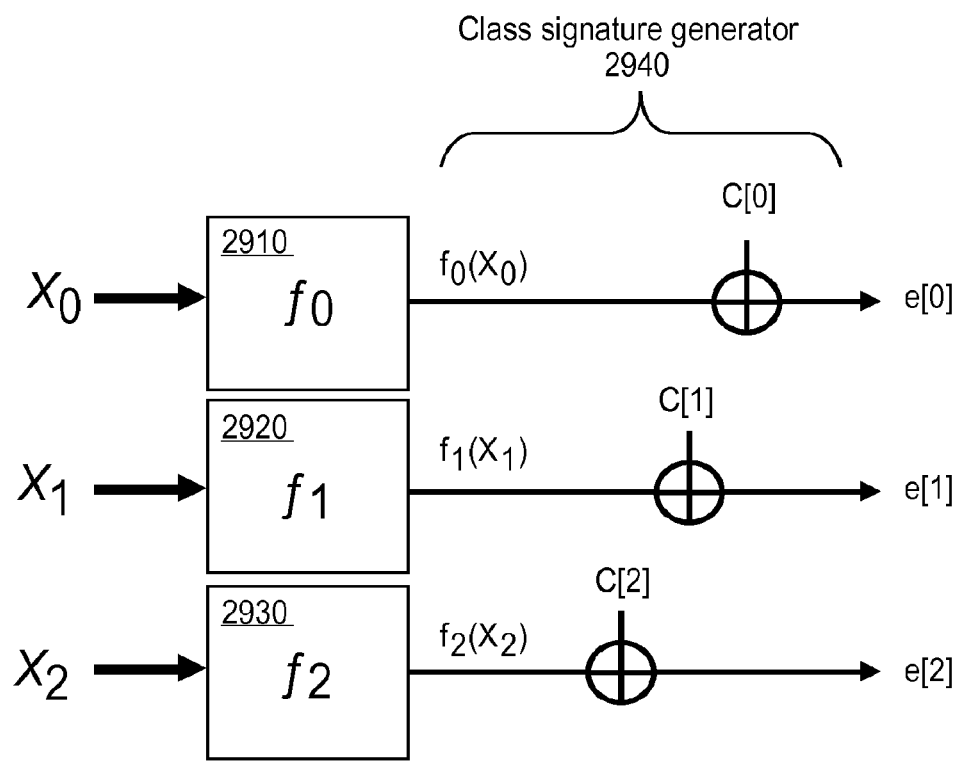
FIG. 29 illustrates an embodiment of class generating functions.

In order to embed or to check test properties in the stream of test patterns, a desired sequence of class signature may require manipulation. In some embodiments, any desired class signatures may be embedded in the test pattern sequence using class generating functions. FIG. 29 illustrates an embodiment of class generating functions. The outputs of functions $f_0$ 2910, $f_1$ 2920, and $f_2$ 2930 are processed by a class signature generator 2940. As an example, an implementation of class generating functions using XOR gates is depicted in FIG. 29. In addition, control inputs C[2:0] are used to manipulate the signature S[2:0]:

$$C[0]=f_0(X_0) \oplus e[0]=S[0]$$

$$C[1]=f_1(X_1) \oplus +e[1]=S[1]$$

$$C[2]=f_2(X_2) \oplus e[2]=S[2]$$

Optionally, the parity of 20-bit data E[19:0] can also be computed from the C[2:0] as shown below without considering actual 20-bit data. Test encoding ensures the validity of computation.

$$\text{parity}(E[19:0])=\neg(C[2] \oplus C[1] \oplus C[0])$$

FIG. 29 provides that any class signature, S[2:0], may be directly controlled from the C[2:0]. In some embodiments, since the C[2:0] may be utilized to directly control the S[2:0] for the chosen class generation functions, any desired S[2:0] may be generated by applying the same S[2:0] to the C[2:0]. In this description, for illustration purposes the XOR implementation of class generating functions is assumed. However, other functions may be employed to generate class signatures depending on test applications.

Figure 30:
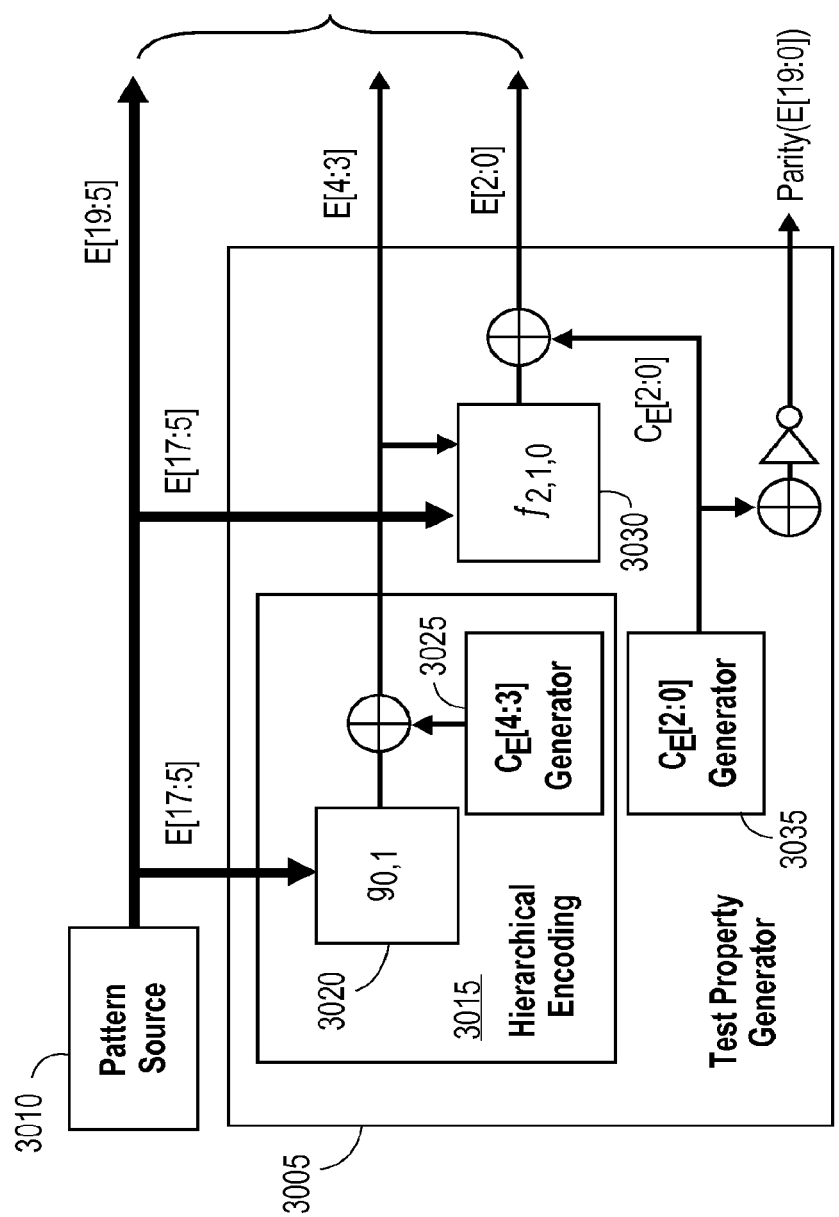
FIGS. 30 and 31 illustrate embodiments of processes for embedding test properties into a test data stream using hierarchical encoding.
Figure 31:
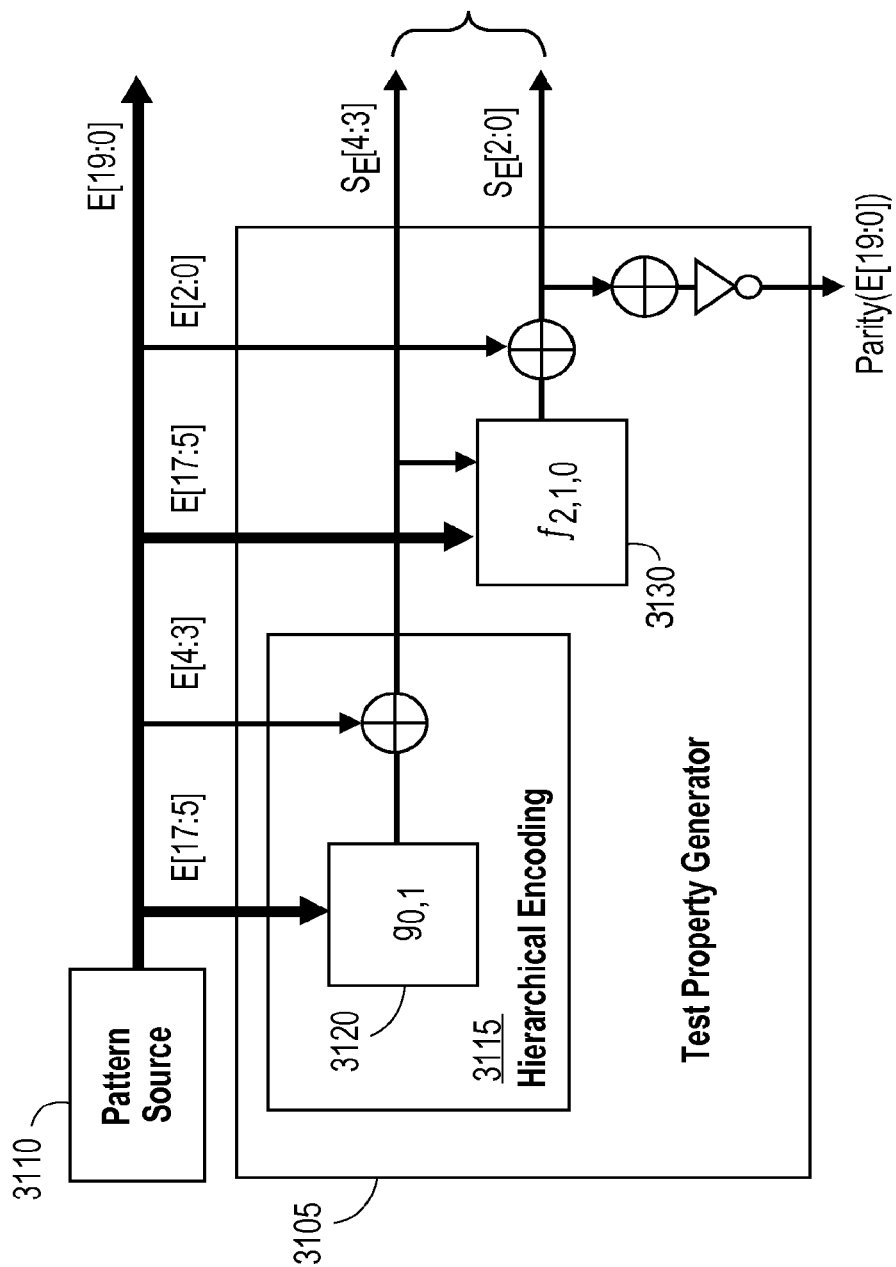

FIGS. 30 and 31 illustrate embodiments of processes for embedding test properties into a test data stream using hierarchical encoding. FIG. 30 includes a pattern source 3010 coupled with a test property generator 3005. In this illustration, the test property generator 3005 includes hierarchical encoding 3015, utilizing functions $g_{0,1}$ 3020 and $C_E[4:3]$ generator 3025, together with the $C_E[2:0]$ generator 3035 and function $f_{2,1,0}$ 3030. Because embedding test properties is commonly an action provided by the transmitter TX, the subscript E in capital letter is used. As shown in FIG. 30, the E[17:5] is interpreted by functions $g_{0,1}$ 3020. The output of the functions may be modified by the class signature provided the $C_E[4:3]$ generator 3025 via XOR logic in order to produce the required class signature sequence, $\text{seq}(S_E[4:3])$. The $C_E[4:3]$ generator 3035 may be a finite state machine (FSM) and may be programmed to generate the required $\text{seq}(S_E[4:3])$. The generated class signature sequence may be embedded into E[4:3]. The E[17:5] and the $S_E[4:3]$ may similarly be interpreted by the functions $f_{2,1,0}$ 3030 and the signature sequence $\text{seq}(S_E[2:0])$ may also be embedded into E[2:0]. The parity of e[19:0] may also be computed from the class signature using XOR function and inverter.

FIG. 31 illustrates a similar structure 3105 as FIG. 30 without $C_E[4:3]$ generator 3025 and $C_E[2:0]$ generator 3035. In some embodiments, a signature sequence may be extracted from the generated test patterns as shown in FIG. 31. The extracted class signature sequence may be made available for error checking. This method may be utilized when, for example, the device under test contains both serializer and deserializer. When the test pattern to be transmitted is being generated, the expected class signature of test pattern to be received may also be generated. The test pattern source and the error checker may synchronize with respect to the class signature sequence.

Figure 32:
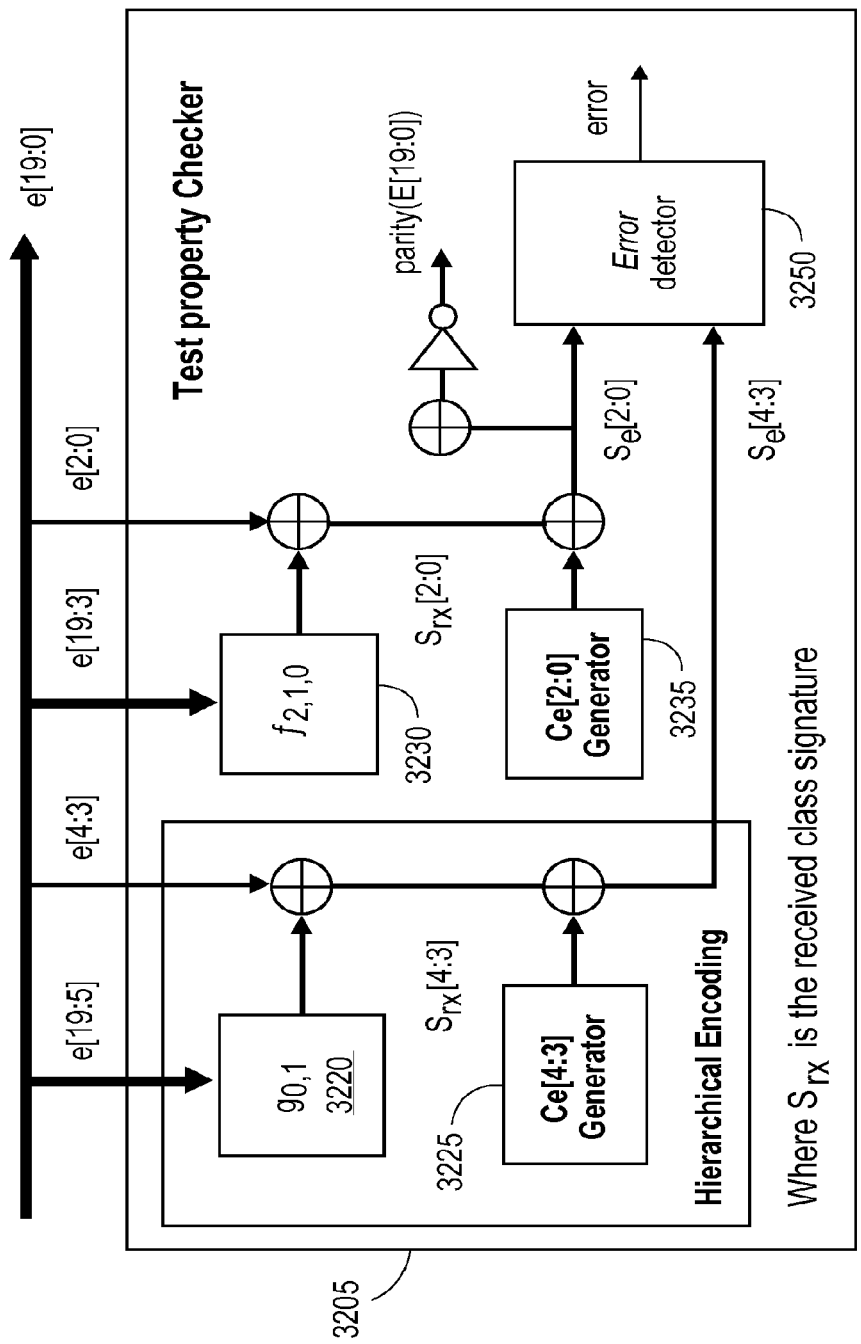
FIG. 32 illustrates an embodiment of a process for checking test property embedded test patterns at a receiver.

FIG. 32 illustrates an embodiment of a process for checking test property embedded test patterns at a receiver. In this illustration, a test property checker 3205 may include hierarchical encoding, shown as functions $g_{0,1}$ 3220 and Ce(4:3) generator 3225, together with functions $f_{0,1}$ 3230, Ce(4:3) generator 3225, and error checker 3250. Embedded test properties may be extracted from a stream of incoming test data and checked against an expected signature sequence. The received sequence of class signatures, denoted as seq($S_{rx}$[2:0]), may be constructed by the test encoding functions at the receiver. The constructed $S_{rx}$[2:0] may be used to calculate parity and may be compared with the expected class signature to determine presence of error.

In some embodiments, the sequence of expected class signatures seq($S_{RX}$[2:0]) may be generated from the $C_e$[2:0] generator 3235. The extracted seq($S_{rx}$[2:0]) may be checked against seq($S_{RX}$[2:0]) to detect errors. If seq($C_e$[2:0]) is the same as the seq($C_E$[2:0]), as summarized above, the seq($S_e$[2:0]) contains a sequence of zero class signatures if no error is present, i.e. seq($S_e$[2:0])=<(000)(000)(000) ... <. Stated in another way, any non-zero class signature may be considered as an error. Thus, errors may be detected by OR-ing the class signature bits.

If the hierarchical test encoding is employed, the same error checking process may be applied to the hierarchical encoding part in parallel as shown in FIG. 24. The test encoding functions and the class generator functions do not have to be the same as those of pattern source. They are independent in general and may be different if the different test encoding functions and class generator functions may offer a preferred optimization.

If $C_e[i]=S_{RX}[i]=C_E[i]$ for $0 \leq i \leq 4$, $$S_e[i] = C_e[i] \oplus S_{rx}[i],$$
$$= S_{RX}[i] \oplus S_{rx}[i],$$
$$= C_E[i] \oplus S_{rx}[i],$$
$$= \begin{cases} 0, & \text{if } S_{rx}[i] = C_E[i] \\ 1, & \text{otherwise} \end{cases}$$

The $S_{RX}$ denotes the expected class signature.

Figure 33:
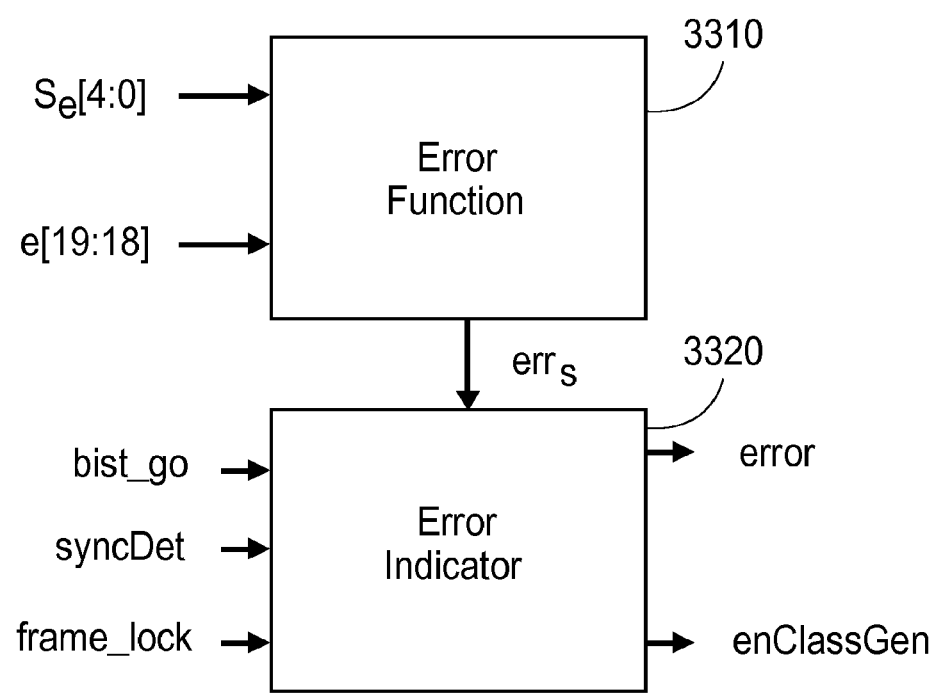
FIG. 33 illustrates an embodiment of an error detector.

The error detector flags errors that are detected. FIG. 33 illustrates an embodiment of an error detector. The error detector consists of error function block 3310 and error indicator 3320. The error function block 3310 may be utilized to check error based on the $S_e$[4:0]. If an error is detected, the detector may then flag the output $err_S$ that is inputted to the error indicator to flag error.

In some embodiments, the error indicator is a finite state machine (FSM) and may be activated if the bist_go signal is asserted. The error indicator waits for the frame_lock signal to be asserted. The frame_lock signal may indicate that the link is established between the serial IO links under test. The frame_lock signal may be asserted by the sequence of prefixed sync commands in the test patterns. The error indicator may assert the enClassEn based on the frame_lock signal to initiate the class signature generation. The syncDet signal indicates reception of the sync command.

The error functions block may be combinational, such as:

$$err_s = \bigvee_{i=0}^{4} S_e[i], \text{ if } C_e[i] = S_{RX}[i]$$

where $S_{RX}$[i] denotes expected class signature

If the zero class signature sequence is to be checked, the OR function may be utilized to compute the errors in the received 20-bit test pattern as indicated in error function $err_S$.

Figure 34:
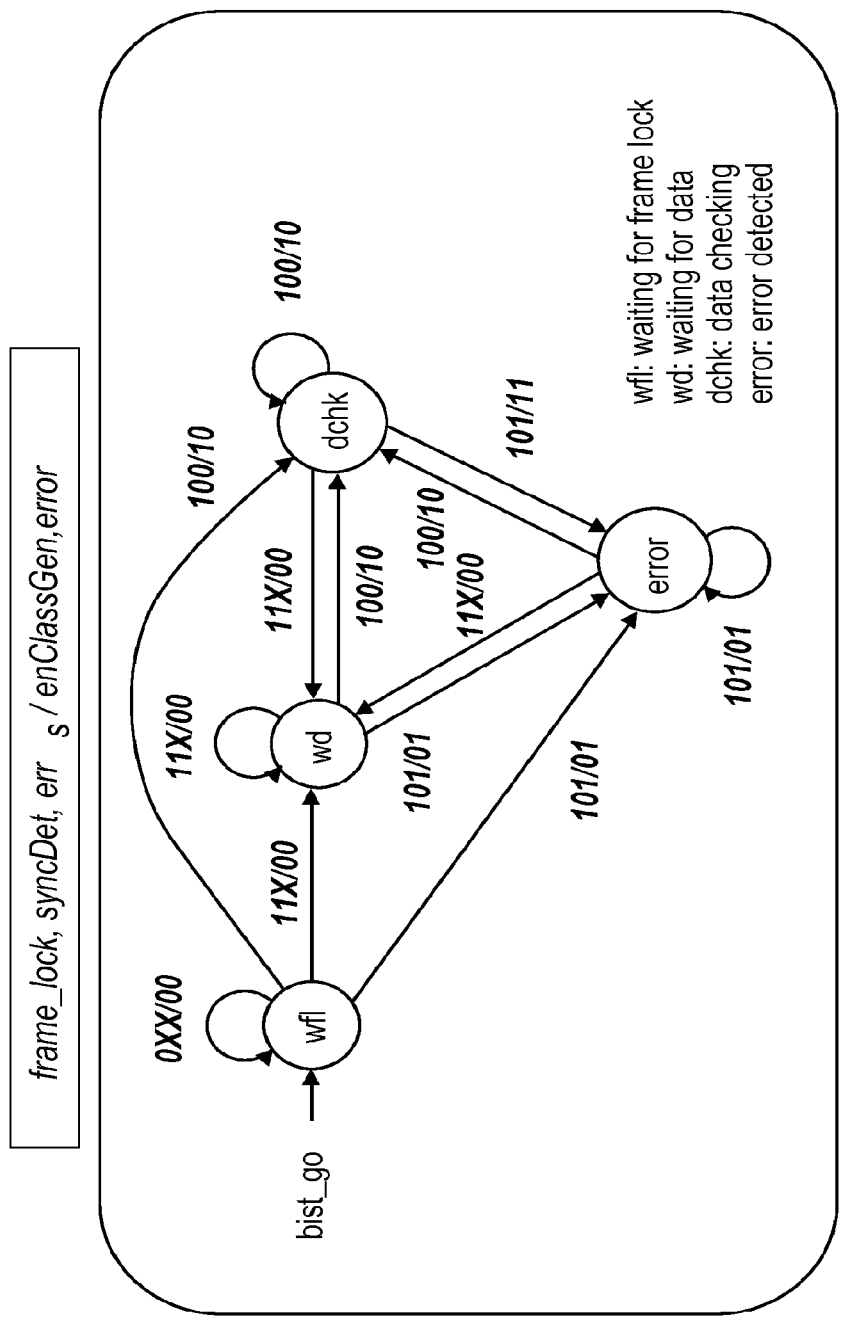
FIG. 34 is an illustration of behavior of an embodiment of an error indicator.

FIG. 34 is an illustration of behavior of an embodiment of an error indicator. In this illustration, the error indicator may handle sync error detection and recover from error for continuous and uninterrupted observation of error behavior. If the error indicator is activated by asserting bist_go=1, the error indicator is waiting for the frame_lock=1 and ignores all other inputs. If the sync command is received after the frame_lock=1, the state error indicator changes to the wd state waiting for a non-sync test pattern. If the non-sync test pattern were provided, it would change from the wd state to the dchk state, which would check non-synch test patterns. In the wd state or the dchk state, state change may occur depending on test pattern received. If an error is detected in any state after the frame_lock is set, the error state is resulted and reports error. If the valid test data or the sync command is received after the error is reported, the state is changed to the dchk state or to the wd state respectively and resumes error checking.

Figure 35:
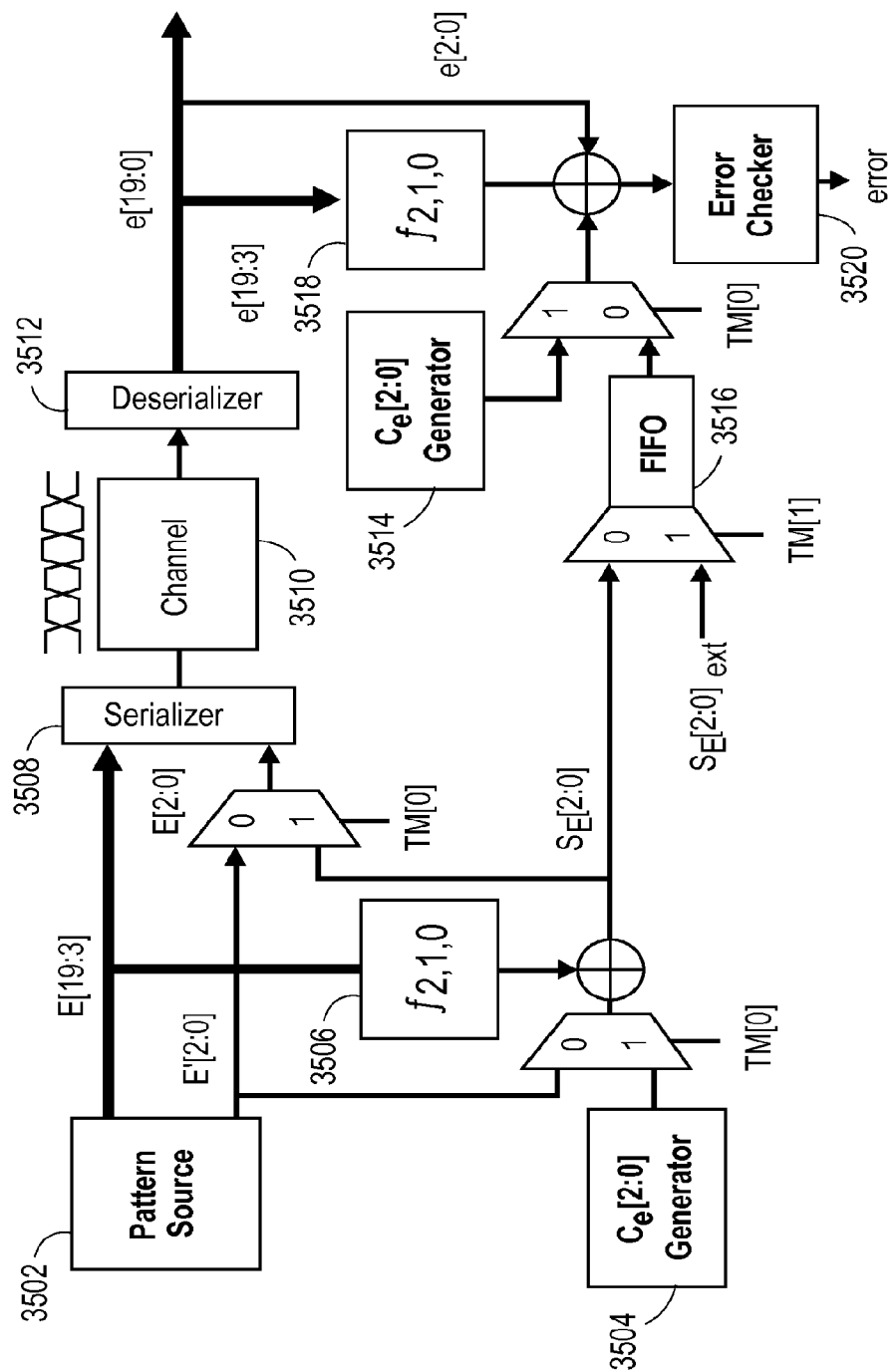
FIG. 35 is an illustration of an embodiment of a serial IO test structure.

The serial IO test generator discussed in TX and the error checker in RX may be connected via serial IO interface under test to form the serial IO test structure. FIG. 35 is an illustration of an embodiment of a serial IO test structure. The structure includes a pattern source 3502, a class function generator 3504, and a function $f_{2,1,0}$ 3506 to operate to produce test signals for serialization by serializer 3508 for transmission across a channel 3510 to a deserializer 3512. The receiver may include a class function generator 3514 and a function $f_{2,1,0}$ 3518 to provide a signal for an error checker 3520. On the transmitter side, test properties may be embedded in the test pattern using the test encoding functions and the class function generator ($C_E$[2:0]) 3504, or they may be extracted from the stream of test patterns and transmitted to the RX, as shown in FIG. 35. A test mode, denoted by TM[1:0], may be controlled to select the preferred implementation. The serial IO under test may involve the TX and the RX on the same device or different devices. The proposed implementation may be utilized to allow the class signatures from the same device or from the different device to be incorporated into error checking. If only an internal class signature needs to be incorporated, the external path may be removed. The extracted class signature $S_E$[2:0] may be directly connected to the FIFO 3516 or buffer.

Figure 36:
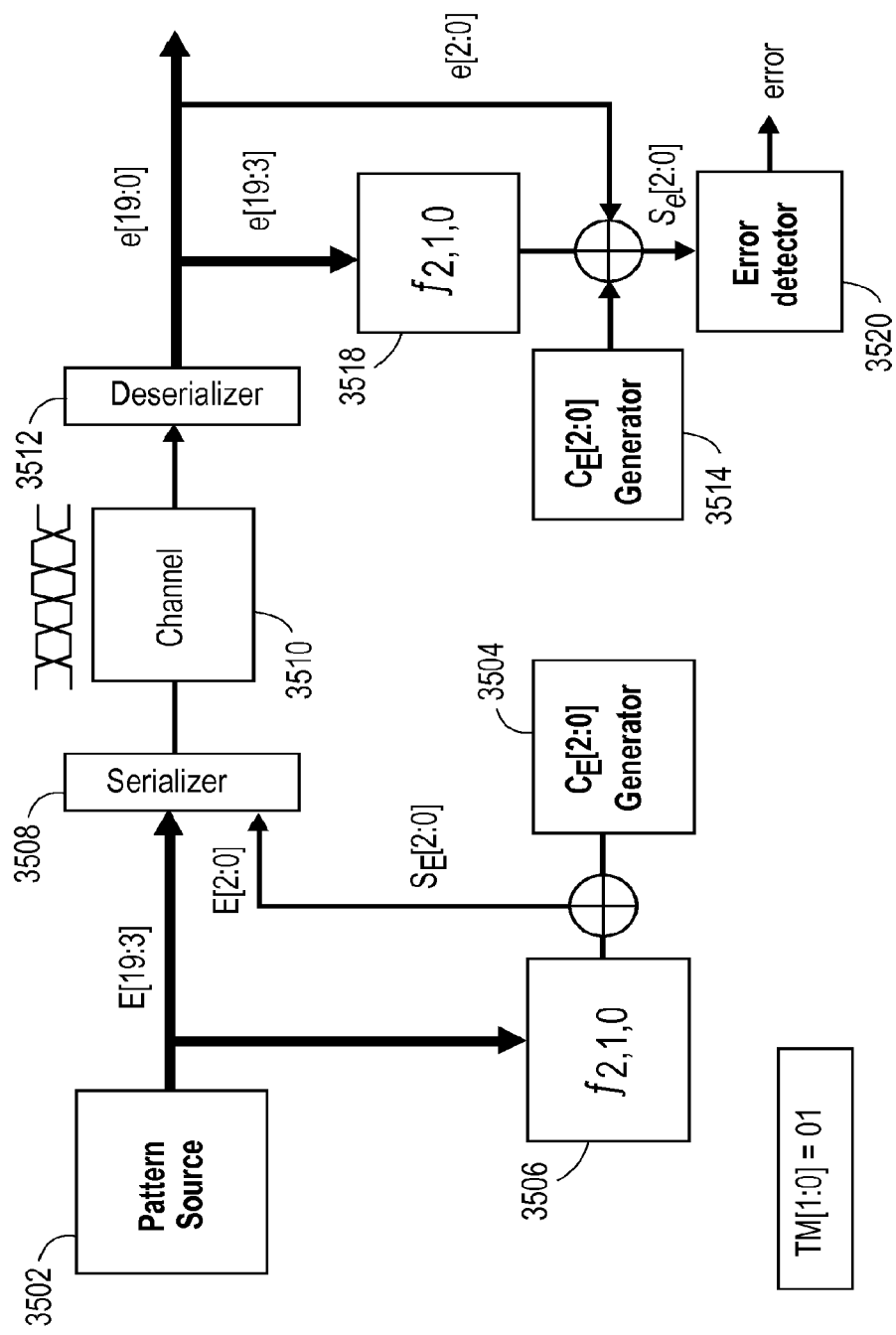
FIGS. 36 and 37 illustrate embodiments of test modes.
Figure 37:
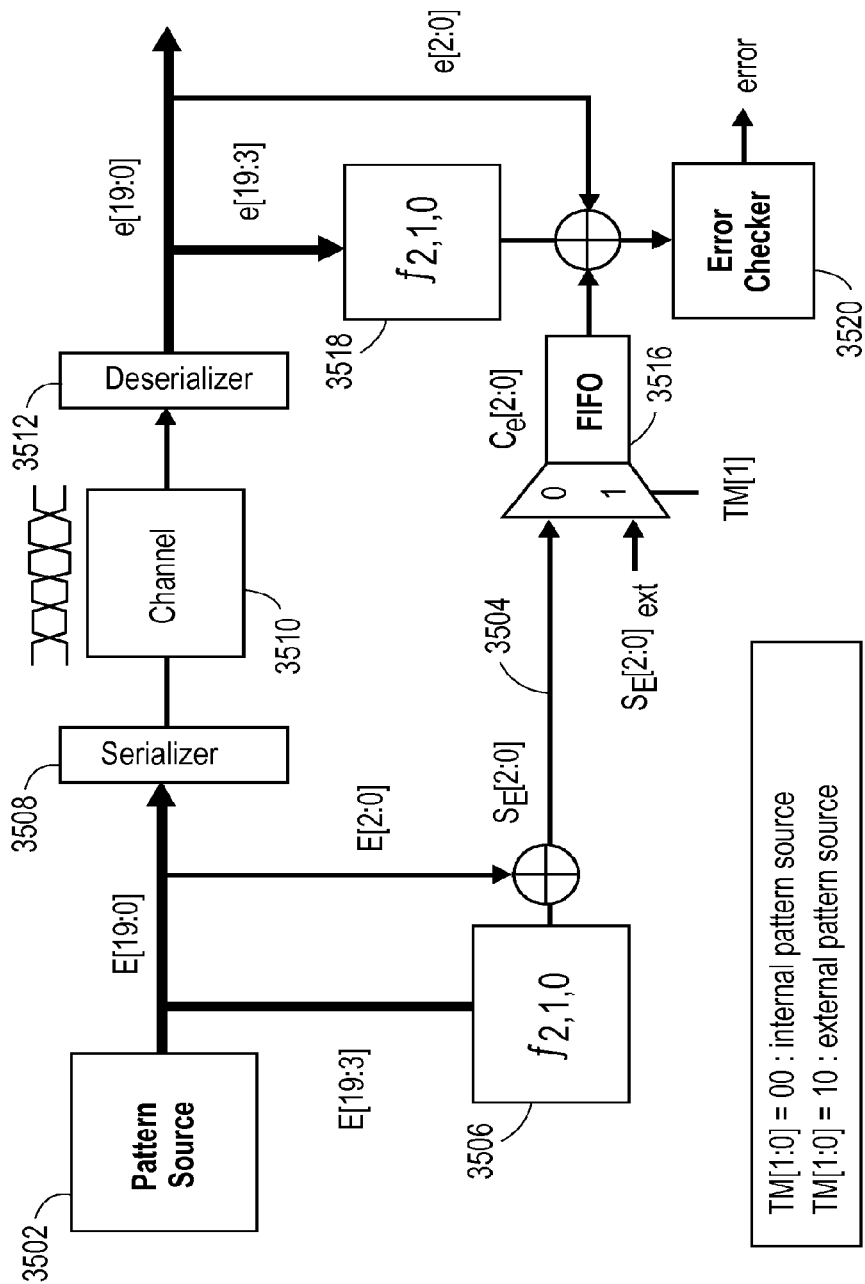

FIGS. 36 and 37 illustrate embodiments of test modes. If the test mode TM[1:0]=01, the test properties may be embedded using the test encoding functions and the class generating functions. In FIG. 36, the structure includes a pattern source 3502, a class function generator 3504, and a function $f_{2,1,0}$ 3506 to operate to produce test signals for serialization by serializer 3508 for transmission across a channel 3510 to a deserializer 3512. The receiver may include a class function generator 3514 and a function $f_{2,1,0}$ 3518 to provide a signal for detection by an error checker 3520. The stream of test patterns generated from the pattern source is test encoded, serialized, and transmitted over the channel 3510. At the receiver, the transmitted stream of test patterns is recovered, interpreted, and checked against expected class signature sequence. An error is flagged if the error changes the class signature sequence or the test property of test patterns.

In some embodiments, a system operates to extract test properties from any sequence of test data. The embodiment of a serial IO test structure illustrated in FIG. 37 may allow any arbitrary test patterns to be used in serial IO test without complicating the design of error detector. In FIG. 37, the structure includes a pattern source 3502 and a function $f_{2,1,0}$ 3506 to operate to produce test signals for serialization by serializer 3508 for transmission across a channel 3510 to a deserializer 3512. The receiver may include a function $f_{2,1,0}$ 3518 to provide a signal for detection by an error checker 3520. The stream of test patterns generated from the pattern source is test encoded, serialized, and transmitted over the channel 3510. The class signature, $S_E[2:0]$, is extracted from the sequence of test data being transmitted. The class signature $S_E[0:1]$ may provided to the $C_e[0:1]$ via a FIFO or a buffer 3516. The FIFO 3516 may synchronize the test data with its class signature at the RX. If, for example, there is latency between the generated class signature and the corresponding transmitted test data, the class signature may be buffered to tolerate latency. If the test data and its class signature are synchronized, the resulting $seq(S'_e[2:0])$ is always a sequence of zeros. In some embodiments, buffering the class signature may offer a hardware advantage over the test data because the size of class signature can be less than or equal to 10-bit, i.e. TE(20,5,3,2), which is significantly smaller than direct comparison of 20-bit test data.

Figure 38:
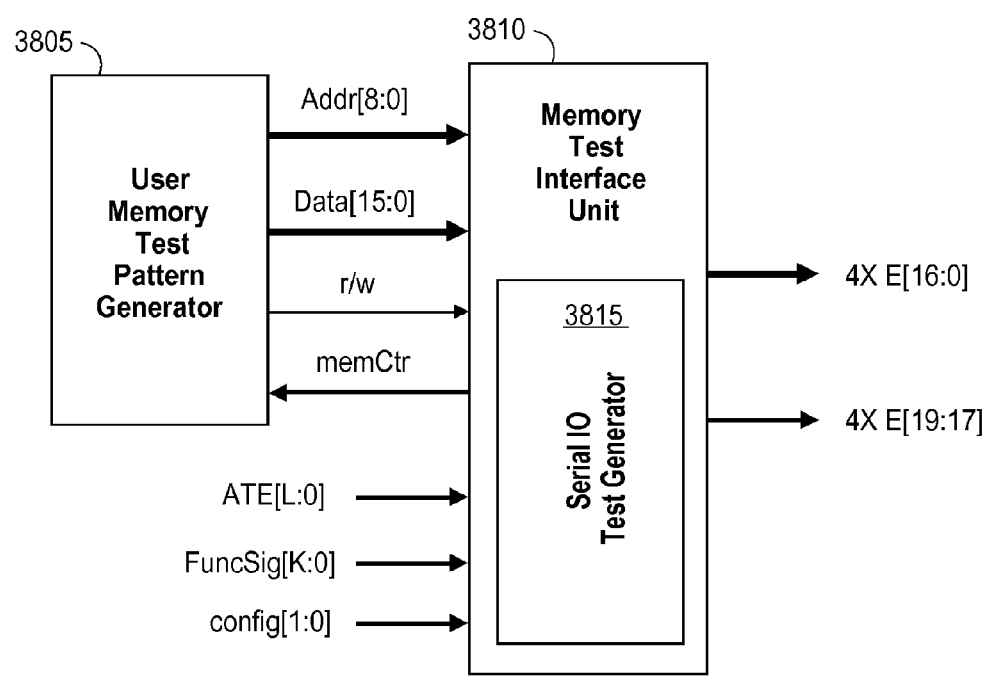
FIG. 38 illustrates an embodiment of shared test pattern source.

FIG. 38 illustrates an embodiment of a shared test pattern source called a memory interface test unit (MITU) 3810. The MITU is shared in the SPDRAM test generator which is coupled with the error checker for each receiver. The MITU 3810 includes a serial IO test generator 3815, is illustrated as being coupled with a user memory test pattern generator 3805. The MITU 3810 may generate four 20-bit SPDRAM tests necessary to perform memory read and write operations to test memory and interface. The generated SPDRAM tests may be issued to all four channels in parallel, if needed.

Depending on the state of configuration control signal config[1:0], for example, the MITU 3810 may be configured to perform serial IO test, memory interface test with pseudo-random address read-write, memory test using user defined test patterns and external test patterns from the tester, such as automatic test equipment (ATE). The tester inputs, denoted as ATE[L:0] in FIG. 38, may provide an interface to the tester so that the test patterns may be applied directly from the tester. The input FuncSig[K:0] may be used to utilize functional signals from the system logic in order to optimize flexibility and hardware overhead. If, for example, a long wait to be implemented or link integrity to be checked, the desired functionalities may be provided from the functional circuitry. Note that the frame_lock is a functional signal that was in used in the example of error indicator illustrated in FIG. 34.

In some embodiments, a user defined memory test generator may be incorporated into the MITU so that the user defined test pattern may be utilized in the test. The user memory test pattern source, for example, may generate 12-bit address and 16-bit data. The registers in the serial IO test generator may be shared for the memory interface test unit. If the memory interface or memories need to be tested from the external tester instead of on-chip user test pattern generator, the tester may provide SPDRAM tests directly to the MITU.

The control interface provided by ATE[L:0] for L>20 may be utilized to lower the required number of tester channels and test data volume because the test data may be expanded internally and distributed by the MITU to all port logic so that any number of memory banks may be tested in parallel. The MITU may be considered to be a hardware that decompresses the test data and the input of MITU as compressed test data.

In some embodiments, the error checker may check for the valid read data from the memory and for the sync commands. If the user memory test patterns were not provided, the MITU may issue memory commands using pseudo-random data and address. For example, the pseudo-random data may be written to the pseudo-random address and read from the same pseudo-random address.

Figure 39:
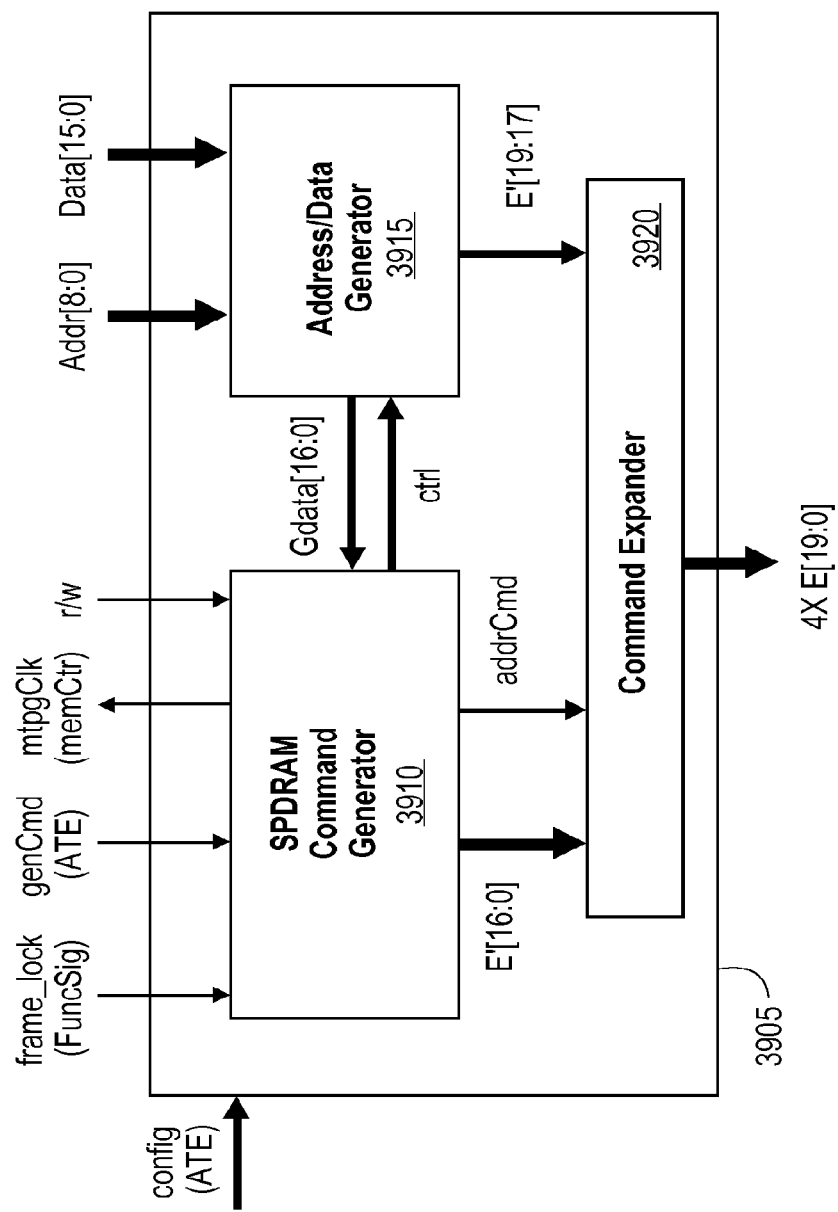
FIG. 39 illustrates an embodiment of a memory interface test unit.

FIG. 39 illustrates an embodiment of a memory interface test unit. The MITU 3905 consists of a command generator 3910, a data and address generator 3915, and a command expander 3920. The command generator 3910 together with the data and address generator 3915 may, for example, generate 20-bit SPDRAM test patterns. The SPDRAM commands are generated from the command generator 3910 and the command argument that involves data to be written or address may be obtained from the data and address generator. The data and address generator 3915 may provide 17-bit input to the command generator for address and data and 3-bit input to the command expander for the serial IO test pattern. The 17-bit input contains 16-bit data for write data command and address for write and read commands. If the serial IO test pattern is to be generated, the Gdata[16:0] is bypassed to its output E'[16:0]. The adduced signal indicates that generated command addresses memories. The command expander 3920 may create multiple commands and distribute them to all ports in parallel. The generated command may be expanded to any number of commands up to a maximum, 8 in this example.

The MITU 3905 may also provide economic test interface to external tester and to the user test pattern generator. The user defined test patterns may provide the data, address and read/write (r/w) control signal. Based on the status of r/w control signal, a sequence of SPDRAM commands to perform read or write operation may be issued, or read after write from the same address may be performed to validate the memory interface logic.

The data and address generator 3915 may include the serial IO pattern generator discussed above. It may also generate 16-bit memory data and address internally using the serial IO pattern generator.

In some embodiments, the command generation may be orchestrated by a tester via ATE[L:0] interface. The tester may provide the SPDRAM commands with accompanying data or address to the MITU 3905. If data and address are generated internally, the generated data may be used for both data and address. The commands may enable the data and address generator 3915 to provide the required data or address. If the commands do not involve data or address, they may be generated from the command generator 3910.

In some embodiments, the command expander 3920 may decode any 20-bit test data into 8 times (8×) 20-bit test data. For discussion purposes, this description generally describes a system or process using a 4× test data expander. An embodiment of a system may be scalable, in that what may be said about 4× expansion would be also valid for 8× expansion. The structure of a 4× test data expander is depicted in FIG. 39 as an example. Each 20-bit of expanded test data may be distributed to each serial IO port or port logic inside the SPDRAM memory chip. FIG. 39 illustrates an embodiment of a test data expander in which an SPDRAM command carries an address which may be indicated by addrCmd=1, and thus the command may be duplicated 4 times, except for the bank address. The bank address which occupies bit locations from 11 to 8, i.e. E'[11:8], is transformed into four different mutually exclusive bank addresses to perform memory test in parallel.

Figure 40:
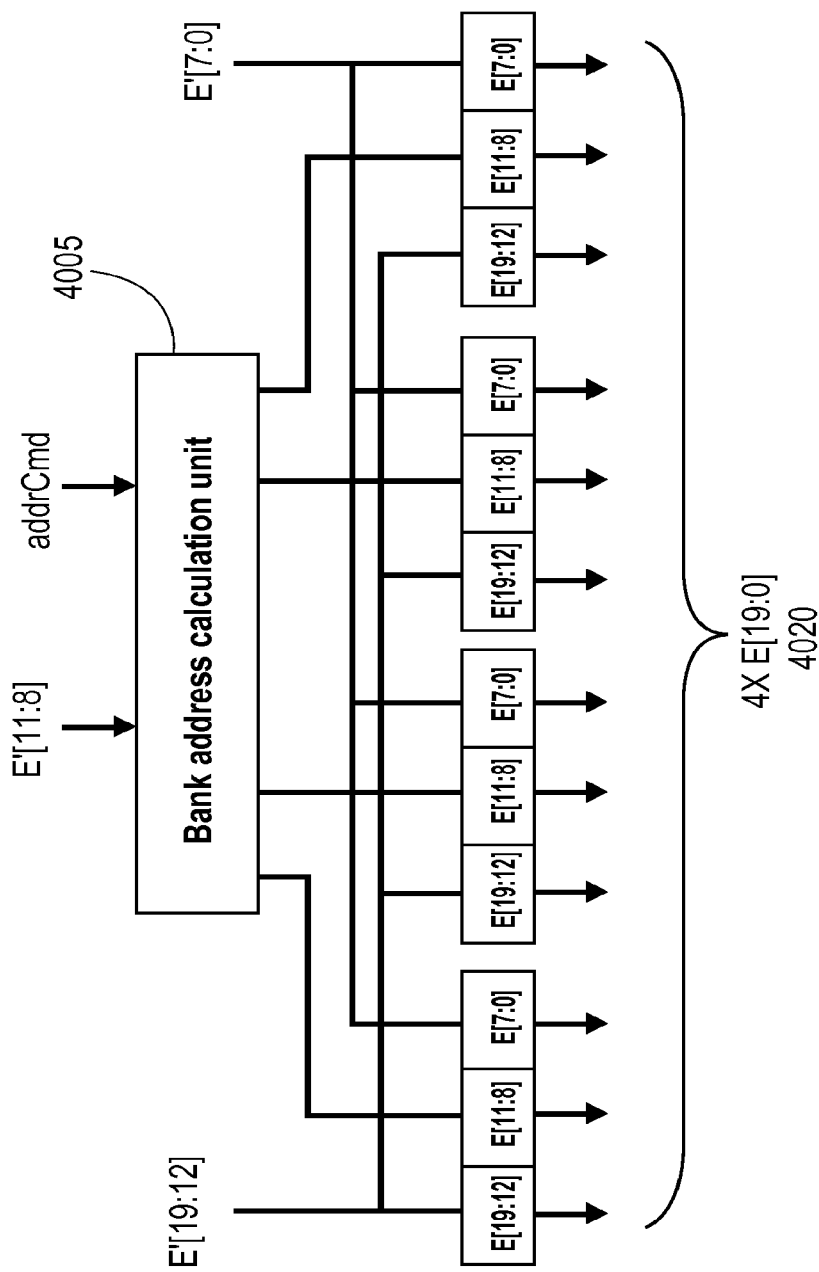
FIG. 40 illustrates an embodiment of a test data expander.

FIG. 40 illustrates an embodiment of a test data expander. A bank address transformation utilizing a bank address calculation unit 4005 is summarized in the illustration provided in FIG. 40. If addrCmd=0, for example, transformation is not carried out and the command is duplicated four times 4020 and distributed to the port logics or serializers. Otherwise, the bank address is transformed by the memory bank calculation unit which computes 4 non-overlapping bank addresses based on E'[8]. If E'[8]=1, for example, the bank addresses for the memory banks 1, 3, 5 and 7 may be generated and otherwise, the bank addresses for 0, 2, 4 and 6. The generated commands may be issued to all ports to access the memory banks in parallel.

Figure 41:
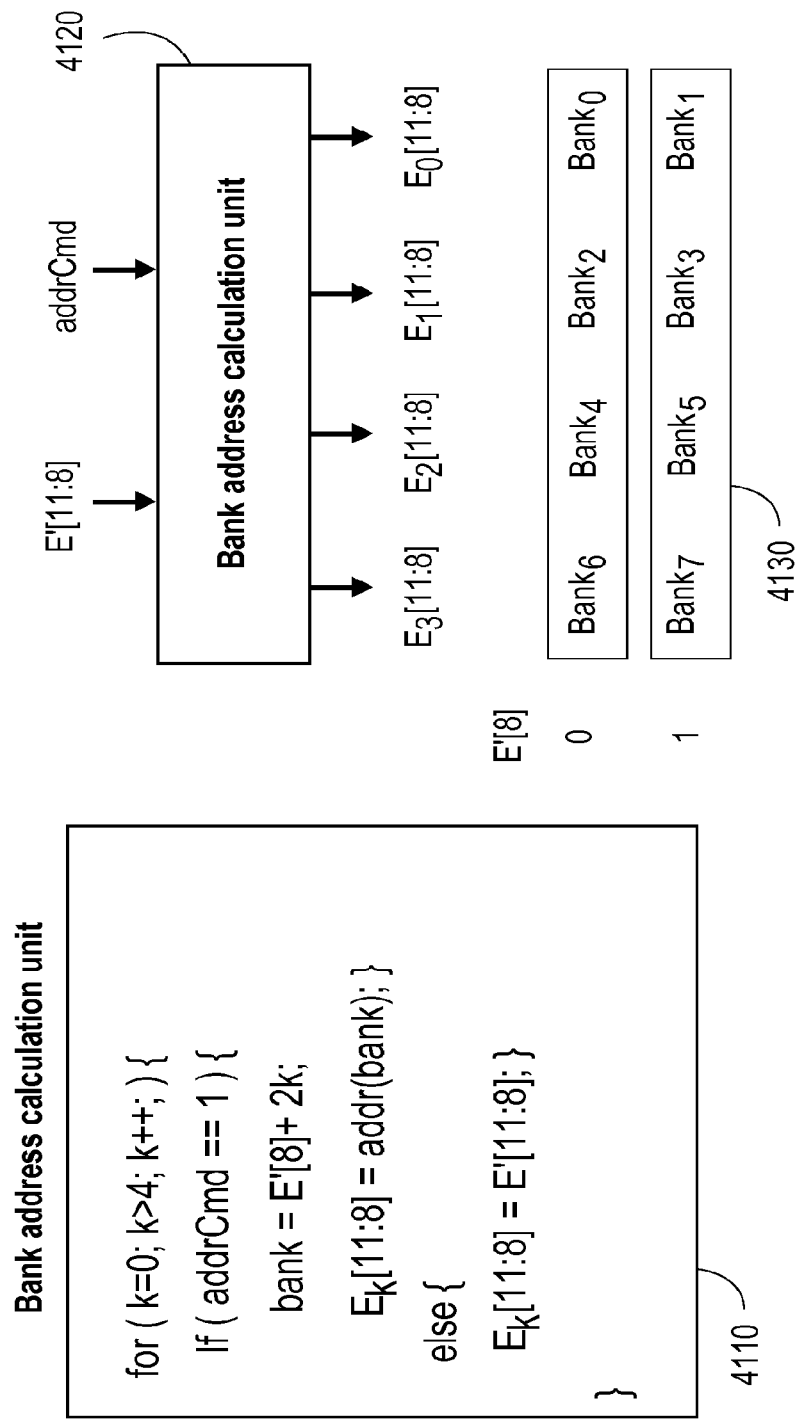
FIG. 41 is an illustration of an embodiment of a bank address calculation unit.

FIG. 41 is an illustration of an embodiment of a bank address calculation unit 4120. In the example shown in FIG. 41, the bank address may be used to encode a combination of banks 4130 to be accessed in parallel. For example, the value of E'[8] was used to determine whether the banks 4130 with even or odd addresses are to execute the same command in parallel. The remaining bank address field E[9:8] can be utilized to accommodate different scenarios of desirable memory access. If, for example, two memory banks need to be accessed at a time for the power consideration, the E' [9:8] may be used to decode the banks addresses. The sync commands may be issued to the ports that do not activate the memory banks.

In an embodiment of an encoding system, the memory access contention situations may easily be created to check functionality of a priority process. Memory access contention may occur when more than one host try to write the same memory location at the same time. The SPDRAM port logic would resolve the contention by blocking one of hosts based on priority. In SPDRAM, priority is determined by the port that received the ABNK command. The priority is assigned according to the port number and is decreasing as the port number increases. For example, if the same memory bank activation command were received from the port 0 and 1, the request made in the port 0 has a higher priority.

Figure 42:
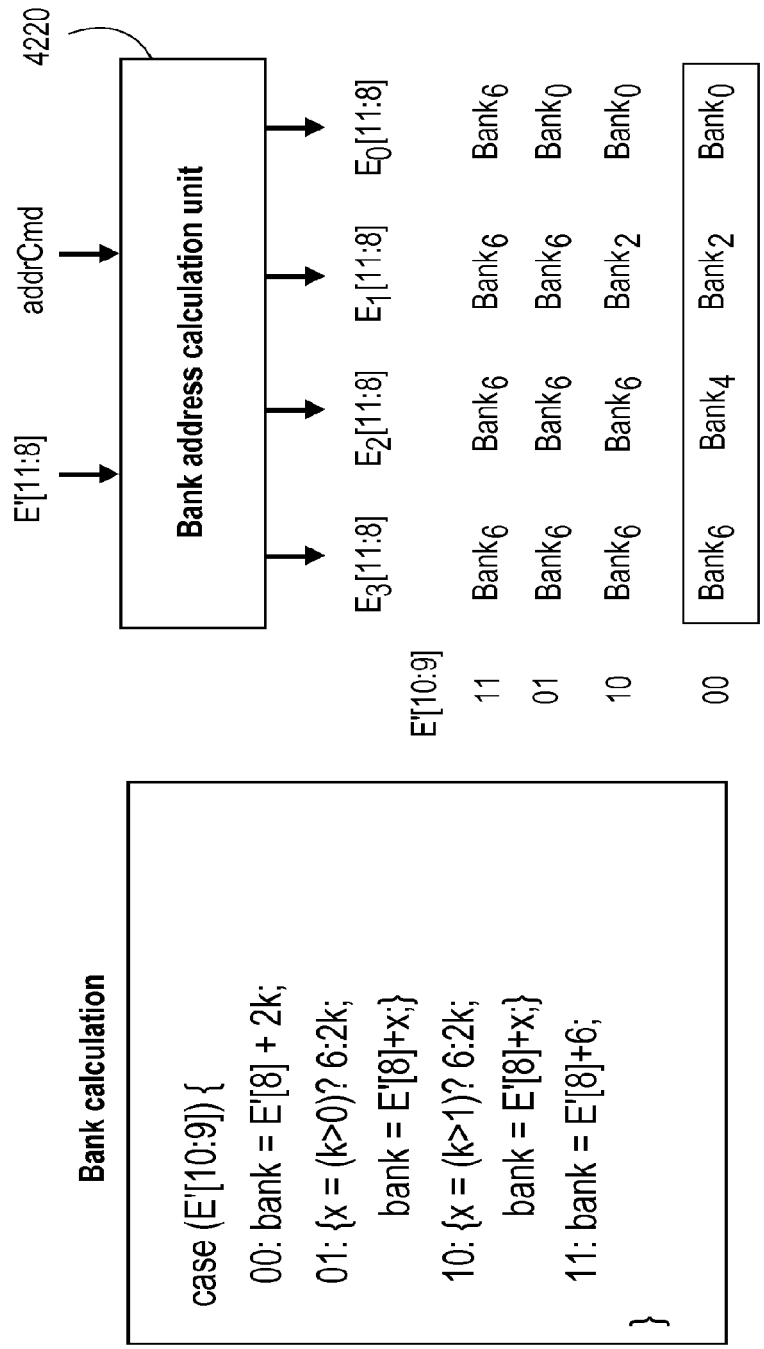
FIG. 42 illustrates an embodiment of command generation to check a function of priority.

FIG. 42 illustrates an embodiment of command generation to check a function of priority. The illustration includes a bank address calculation unit 4220. In some embodiments, the function of priority may be tested by simultaneously issuing four ABNK commands from all ports to open the same memory bank as specified in FIG. 42. For example, if the ABNK command is issued from all ports in parallel, the memory bank is opened for the port 0 and the commands from all other ports are suspended. When the ABNK command is suspended, the NACK command is sent to all ports except the port 0. To validate priority function, the port 0 may check for normal functional test and all other for the NACK.

In some embodiments, a SPDRAM test generator may be configured to provide test solutions for diversified test applications. FIGS. 43 to 47 illustrate embodiments of an SPDRAM test generator. In some embodiments, the SPDRAM test generator may include a command decoder to reduce size of external inputs. Since only a small number of different SPDRAM commands are required to test the memory interface logic, the external input may be considered as encoded. The reduced number of external IO may be beneficial, especially when the test pattern is provided from the tester.

Figure 43:
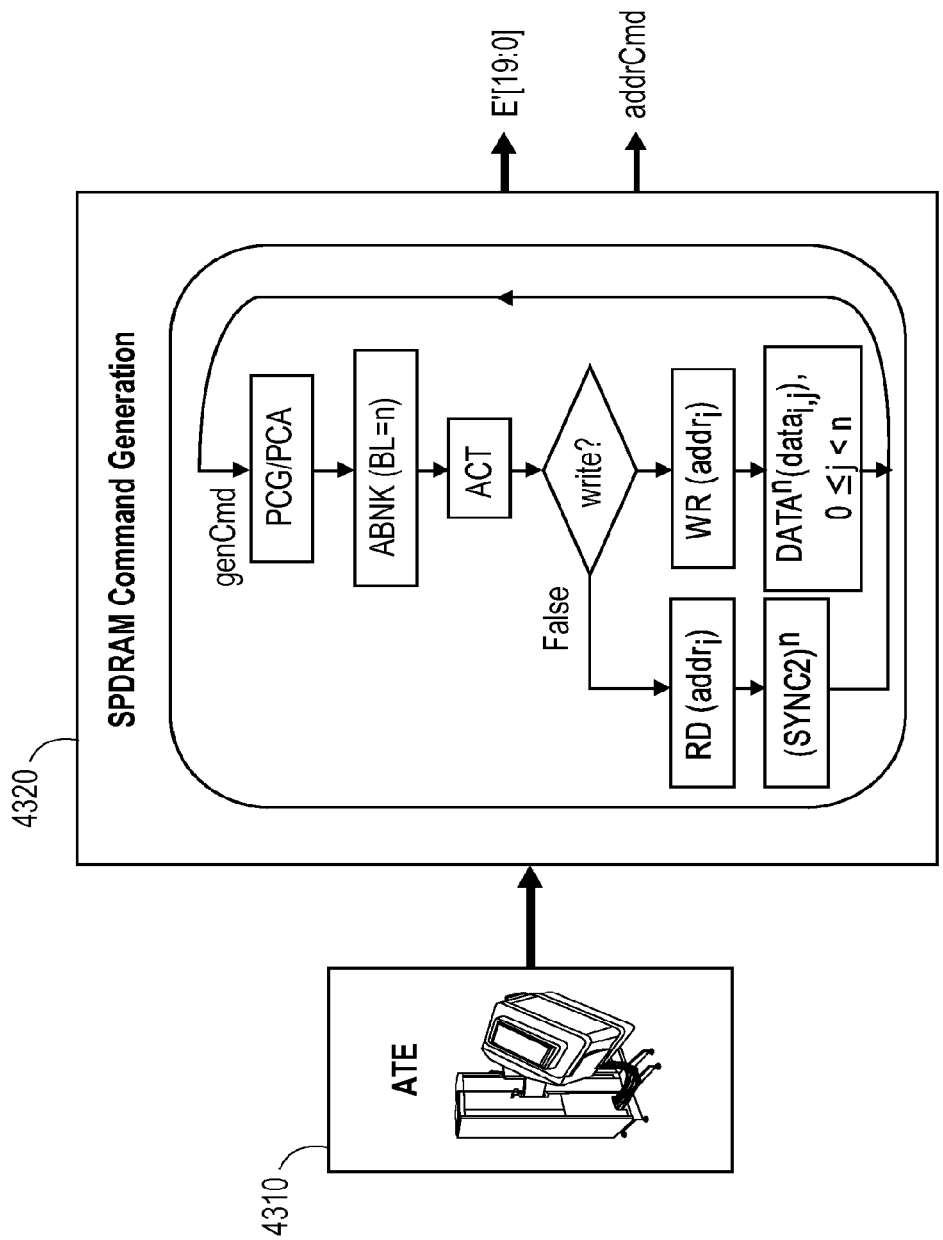
FIGS. 43 to 47 illustrate embodiments of an SPDRAM test generator.

FIG. 43 is an illustration of SPDRAM command generation for a memory test. In this illustration, a tester (ATE) 4310 provides input for SPDRAM command generation 4320. As shown, the commands PCG, ABNK and ACT are always issued prior to data read or write. During the memory test, the data read and write are carried out in burst with maximum burst length to optimize test time. If test data is to be written, a burst of n number of data elements is written to the address starting at addr$_i$. If the data is to be read, the same n number of data elements is read in burst. While the data is being read, the command generator issues n number of SYNC2 commands. The notation DATA$^n$(x) and (SYNC2)$^n$ denotes generation of n number of consecutive DATA and SYNC2 commands respectively. In some embodiments, employment of the burst data approach may reduce the address bit size of user memory test pattern source to (9−log$_2$n) and hence reduce hardware overhead.

Figure 44:
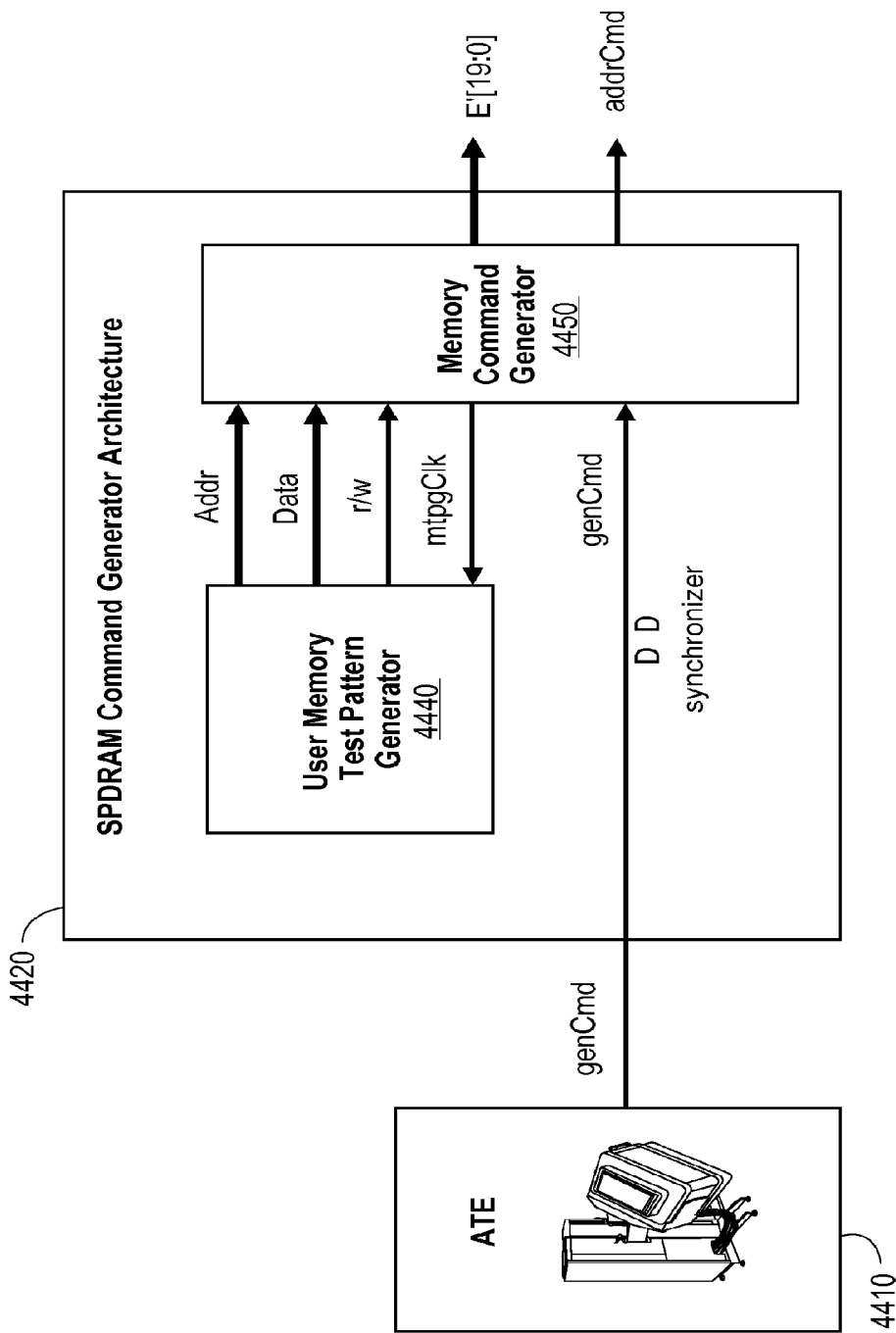
Figure 45:
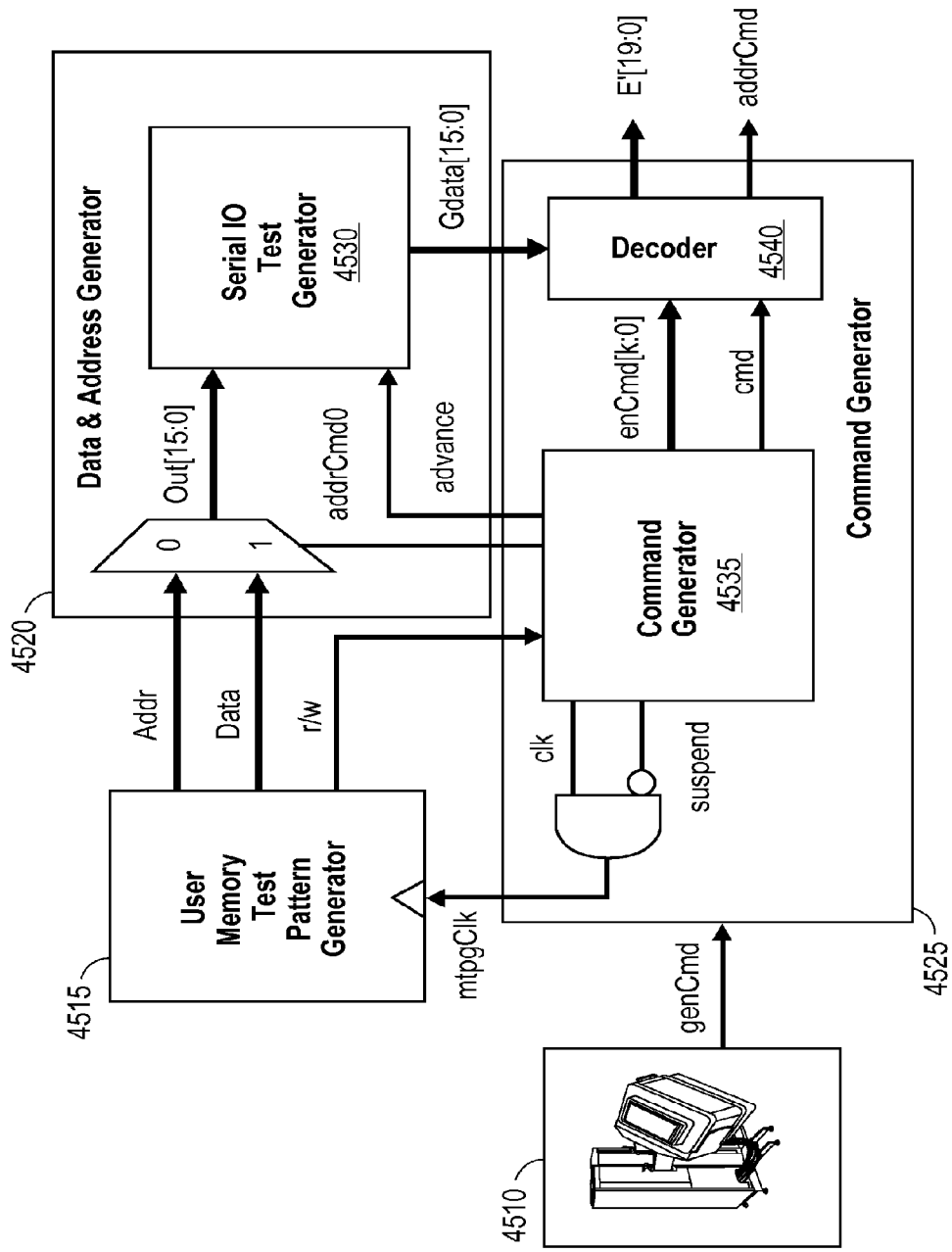

A simple SPDRAM test generator that incorporates a user test pattern generator is depicted in FIGS. 44 and 45. In FIG. 44, the tester 4410 is shown coupled with an SPDRAM command generator architecture (MITU) 4420, including a user memory test pattern generator 4440 and memory command generator 4450. The tester 4410 may provide the command generation signal called "genCmd" to initiate or to pause the memory test. When the genCmd signal is issued, the command E[19:0] and the addrCmd signal are produced from the test generator. During the SPDRAM command generation mode, the MITU 4420 generates either a memory command or a sync command. The MITU 4420 makes read/write decision based on the r/w (read/write) signal from the user memory test pattern generator. The genCmd signal is synchronized to the system clock through the synchronizer. Using the asynchronous interface provided by the genCmd signal, the tester 4310 can initiate and pause anytime. The provided user test can be operational under the control of MITU 4420. In some embodiments, the MITU 4420 advances the user memory test pattern generator by controlling the clock of memory test pattern generator.

Using the same asynchronous interface, the tester may orchestrate test using the user defined test pattern generator. FIG. 45 is an illustration of such SPDRAM memory test generator. In this illustration, a tester 4510 is coupled with a command generator module 4525, including a command generator and 4535 and decoder 4540. The command generator 4525 is coupled with a data and address generator module 4520, including a serial IO test generator 4530, and with a user memory test pattern generator 4515. A desired sequence of test may, for example, be implemented in the encoded command generator. The encoded command generator may be a finite state machine that issues a sequence of commands to implement the memory interface tests. Assertion of the genCmd=1, for example, causes the mentioned commands to be generated. If the data or address command needs to be generated, the command generator may interact with the user defined pattern source. The generated user pattern may be registered and provided to the command decoder. The serial IO in this mode may be set to function as a buffer.

When the user pattern is consumed, the command generator may provide a clock pulse to advance the user memory test pattern generator to obtain the next memory address and data. The user pattern source may be paused for an indefinite time if the genCmd is asserted to genCmd=0. When the genCmd=0, the command generator issues the SYNC characters.

Figure 46:
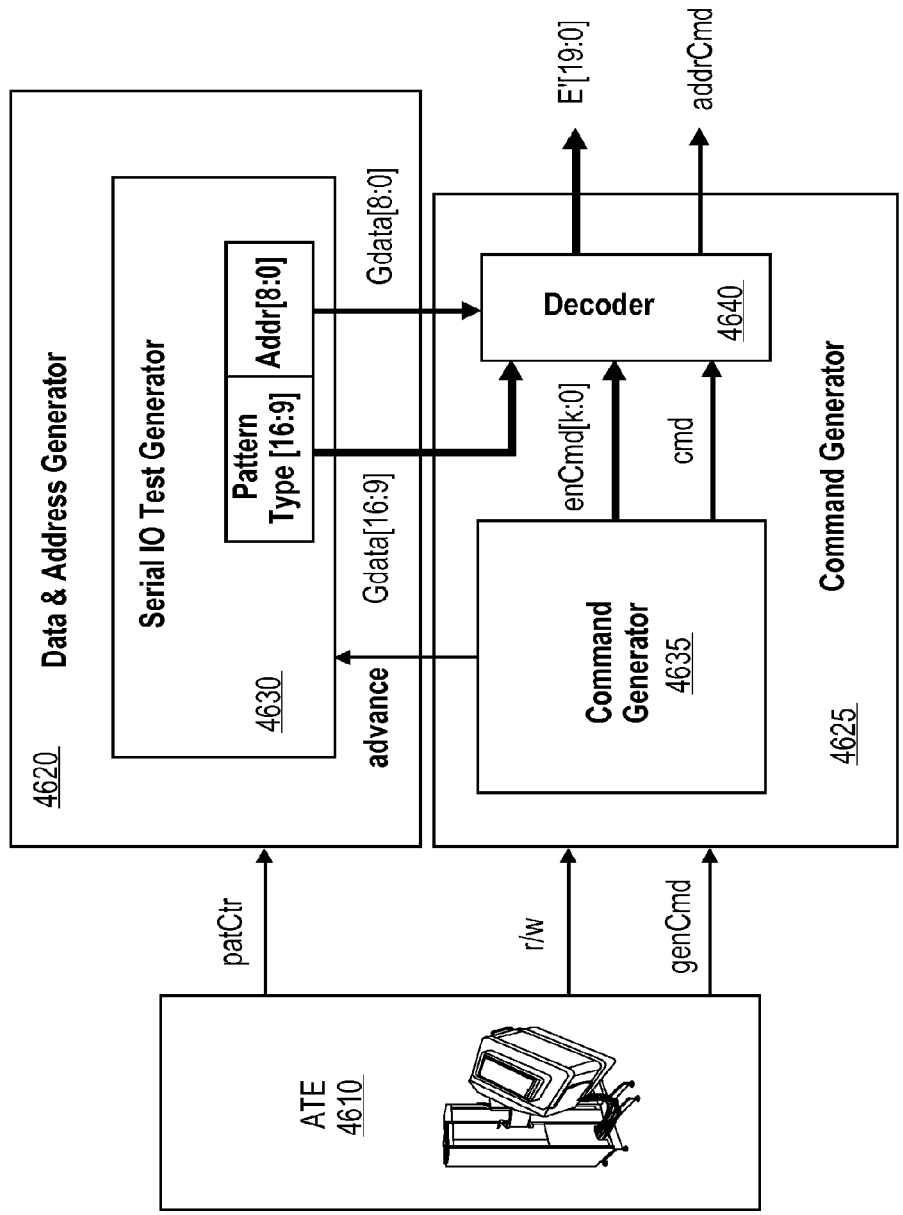

If no external test pattern source is provided, the test patterns for memory and memory interface can be generated internally using the serial IO generator. FIG. 46 is an illustration of such SPDRAM memory test generator. Because the memory test data may be highly repetitive and complementary in nature, these can be provided from the serial IO test generator 4530. For example, one test data example may provide for writing all memory locations with ones followed by reading the one values in all location again, followed by writing zero in all locations, and so on. In this illustration, the G[16:9] values can be used to provide the required test data patterns. The decoder can produce the desired test data pattern based on the content of G[16:9]. The complementary test data may then be provided from the same serial IO test generator or obtained from complementing the corresponding test data using a pattern control input (patCtr). The read/write control signal can also be provided from the ATE 4510. The test data pattern field G[16:9] can be increased, if needed, because the burst test data generation number of address bits may be fewer than 9 bits in G[8:0], as indicated above.

If a memory interface is to be tested, a pseudorandom data and address can be used for the testing. FIG. 46 is an illustration of command generation using pseudorandom data and addresses. In this illustration, a tester 4610 is coupled with a data and address generator module 4620, including a serial IO test generator 4630, and with a command generator module 4625, including a command generator 4635 and decoder 4640. In testing, a write command may precede a read command, and both the write and read commands access the same addresses. Further, the test data is derived from the address, with the address being obtained from serial IO pseudorandom test patterns. During the SPDRAM test command generation, the address generated is the shared pattern source and is stable for both the write and the read commands. The test data, however, can be changed by the TPE (test property embedding unit). In some embodiments, the test data may be the same as the address, or may be the complement of the address.

Figure 47:
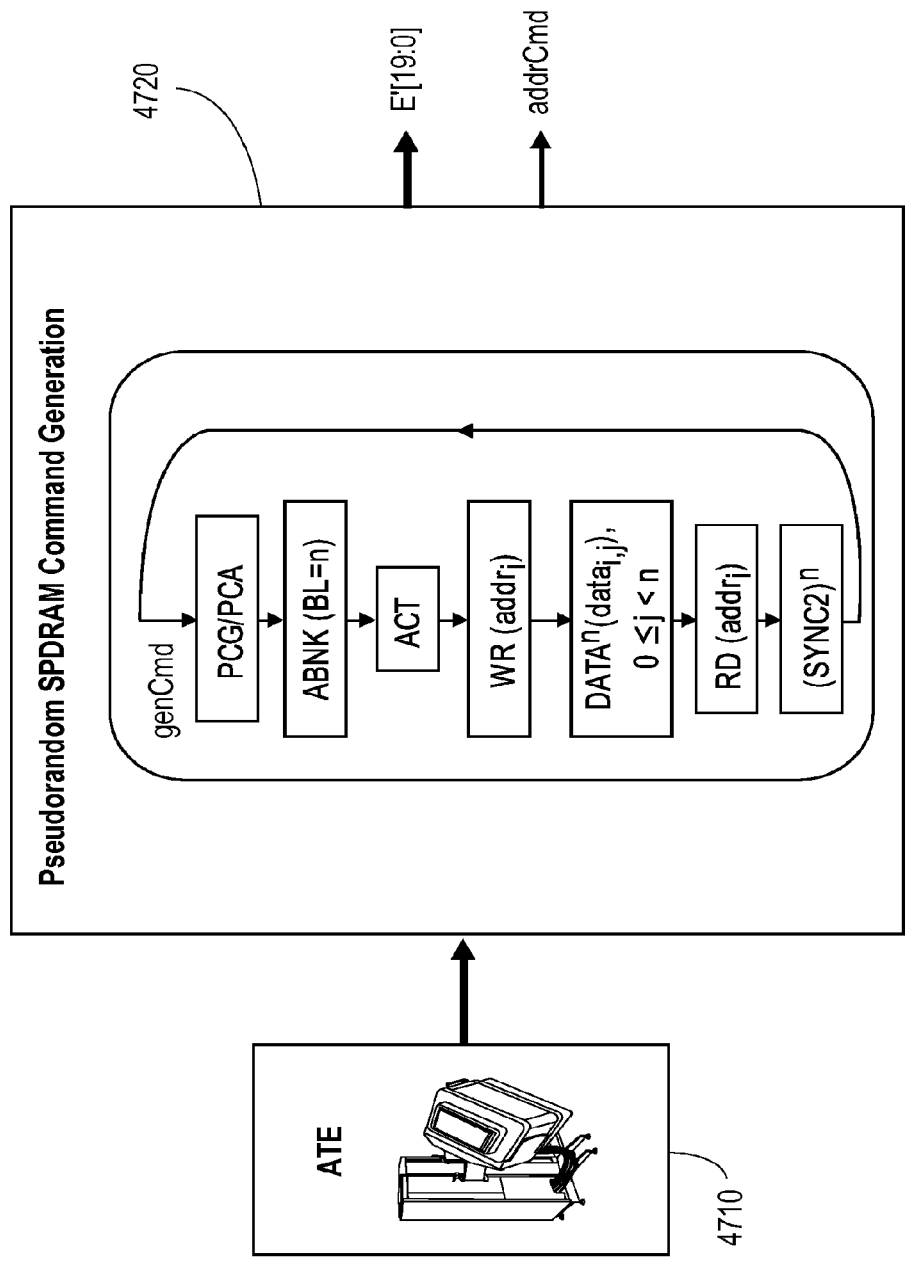

FIG. 47 is an illustration of a pseudorandom test generator for an embodiment of a memory test. As illustrated, a tester 4710 may provide an input for pseudo-random command generation 4720 to produce date E[19:0] and address addrCmd. If the pseudo-random data and address were to be generated internally using the serial IO test generator, the command generator may also control the serial IO test generator to provide required test patterns. In this illustration, a command generator may use an advance control signal to sequence the data and the address. For example, if the advance=1, the next data or address may be provided from the serial IO test generator.

Figure 48:
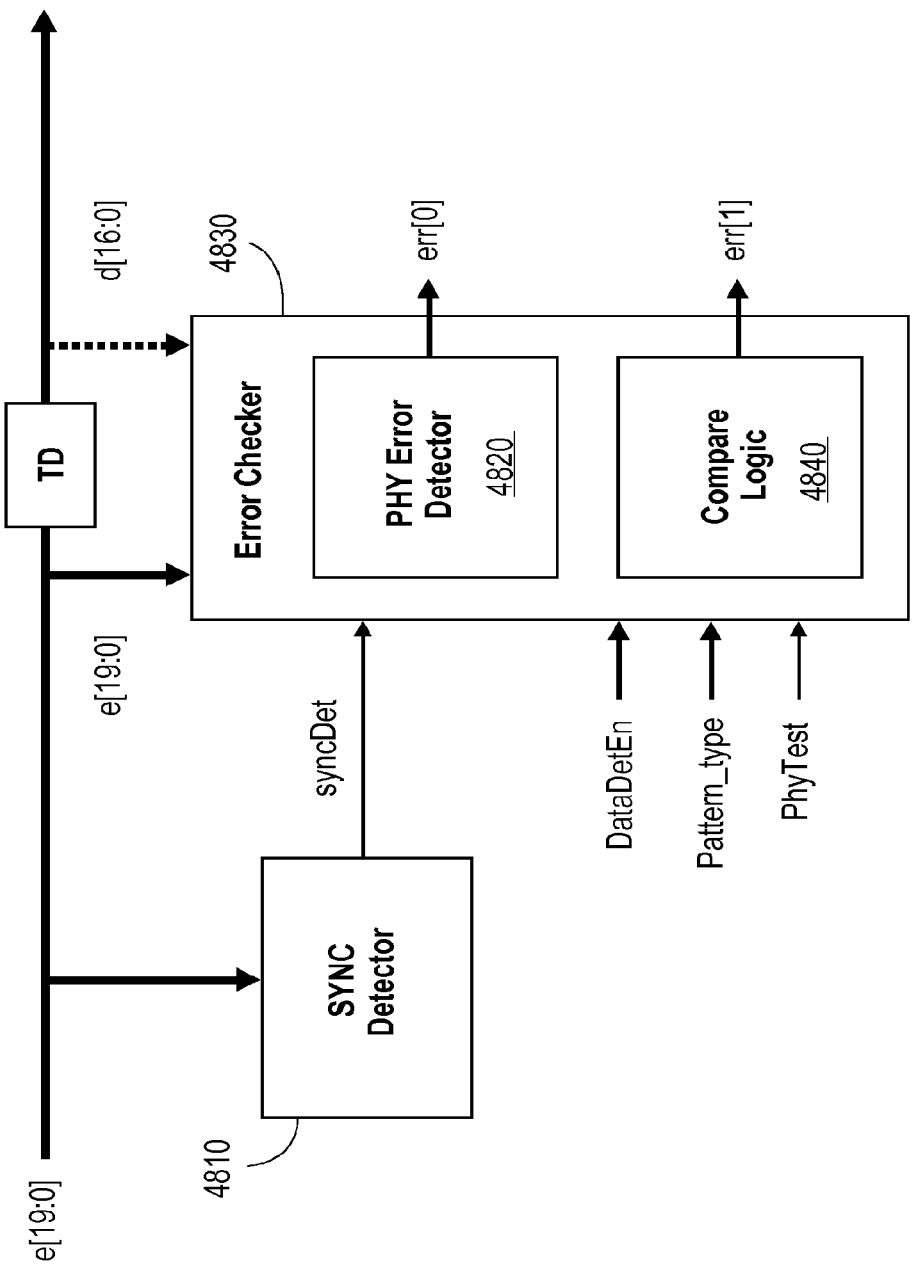
FIG. 48 depicts an embodiment of an error check.

A proposed error checker may handle both serial IO test patterns and SPDRAM command based test patterns. FIG. 48 depicts an embodiment of an error check. In the illustration, the error checker includes a sync detector 4810 coupled with and error checker 4830, the error checker including a PHY error detector 4820 and compare logic 4840. For a test that requires SPDRAM commands, the error checker may be utilized to recognize the DATA command and all sync commands. In some embodiments, the error checking for memory can be carried out in a 17-bit data domain. During the test, for example, the d[16:0] may be occupied with the DATA command or the SYNC command. If the d[16:0] carries any other than the intended commands or any invalid read data in d[15:0], the error checker operates to flag an error.

The DATA command consists of 2 bytes (d[15:0]) of data with 1-bit command field (d[16]) in 17-bit data domain. The d[16] is equal to e[19] in 19-bit encoded data domain, i.e. d[16]=e[19]. The detection of DATA command is flagged by e[19]=1 in the ECEn equation and may be used to enable the error checker. If the error detector detects the SYNC command, it may operate to maintain the previous state.

The memory test patterns may be repetitive, as described above. The content of upper and the lower bytes may often be the same. The memory test patterns, for example, may write zeros (ones) in all memory locations followed by read zeros (ones). Alternatively, the test data and its complement may be written in all even and odd memory locations respectively. In some embodiments, a system may efficiently extract test properties from the existing repetitive test patterns. It may also embed the test property into the pseudo-random memory test patterns.

Figure 49:
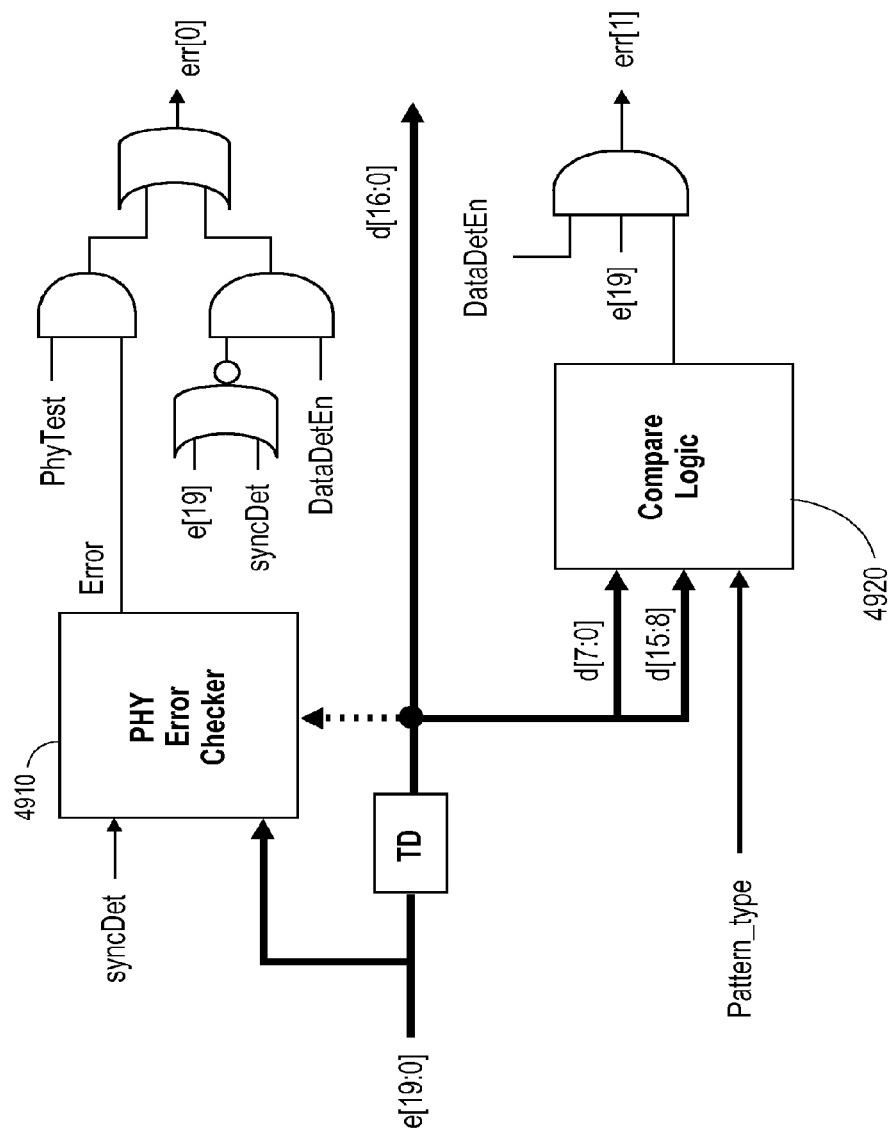
FIGS. 49 and 50 illustrate embodiments of a serial IO error checker.
Figure 50:
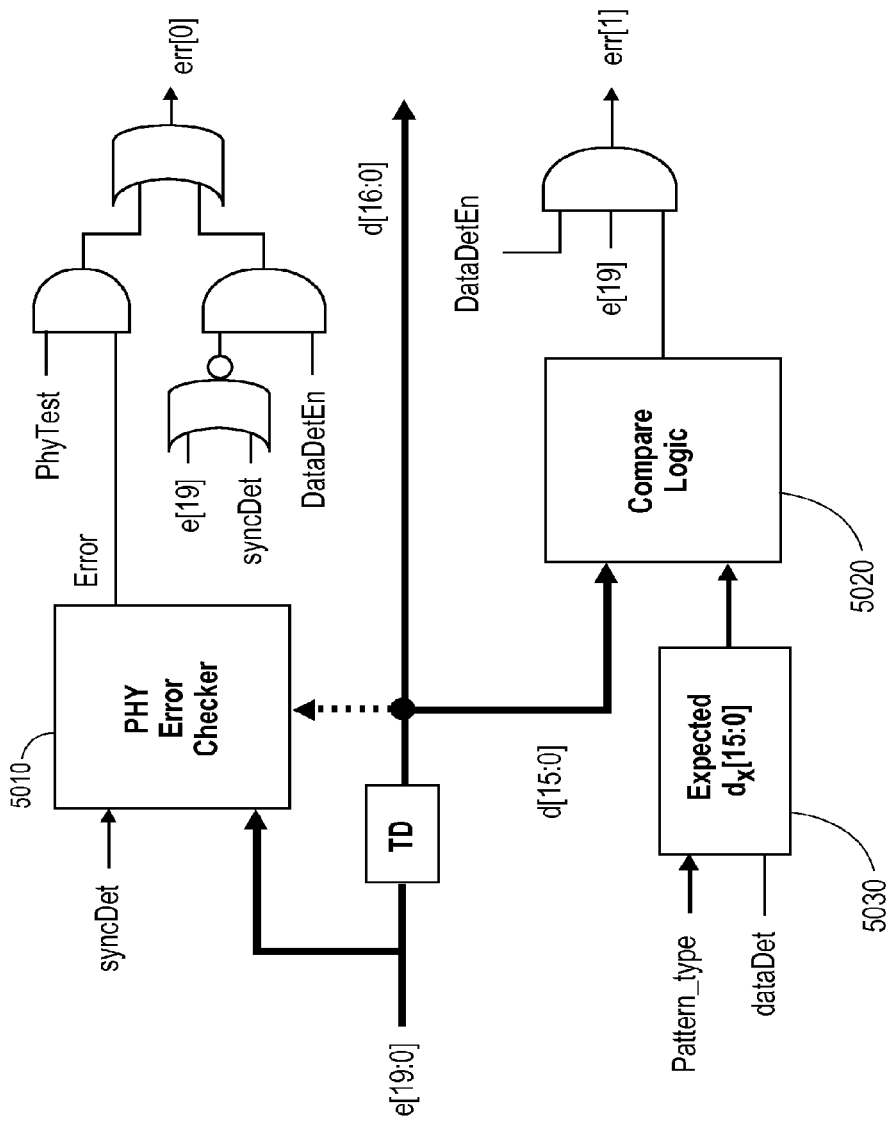

FIGS. 49 and 50 illustrate embodiments of a serial IO error checker. In some embodiments, the serial IO error checker, as shown in FIG. 49, may be enabled to reduce hardware overhead for the test involving the SPDRAM tests. In this illustration, the error checker includes a PHY error checker 4910 and compare logic 4920. In some embodiments, signal syncDet indicates detection of a sync command on the d[16:0] or e[19:0] signal. The control signal PhyTest then enables error functions available in the serial IO error detector. The PhyTest can be enabled during the memory test. A control signal DataDetEn activates detection of invalid commands during a test that involves the SPDRAM commands. If enabled, the error is issued if the received input is neither a READ command nor a sync command. In SPDRAM, the received input is DATA command if e[19]=1 or d[16]=1. If the sync command is detected, the syncDet is asserted to syncDet=1. During the memory test mode, if the read command were detected, then the data field d[15:0] is checked by the serial IO error checker. Optionally, at the same time the lower byte and the upper byte may be compared to detect error. The serial IO error detector may extract the test property and detect errors that may be missed by the compare logic. The proposed error check may simplify design because all information that is needed to determine error is contained in the DATA command. The error check does not require knowledge of an expected memory test data to determine error and no synchronization with expected memory test data is necessary.

Alternatively, the expected read data may be generated on-chip and provided to the compare logic. FIG. 50 includes a PHY error checker 5010 and compare logic 5020, together with an expected $d_x$[15:0] generator 5030. As shown in FIG. 50, when a DATA command is detected, the expected $d_x$[15:0] generator 5030 provides the expected read data to the compare logic 5020, which may be utilized to determine validity of the read data. The error detections to produce the err[1] are optional, if the serial IO error checker is equipped with a test encoding scheme that allows no error masking such as TE(20, 5,3,2).

The error functions e[1:0] in FIGS. 49 and 50 may be summarized as:

$$err[0] = (PhyTest \wedge \text{error}) \vee (DataDetEn \wedge invalCmd),$$

where $$invalCmd = \neg\, (e[19] \vee syncDet)$$

$$err[1] = \begin{cases} dataDet \wedge \left( \bigvee_{i=0}^{7} (d[i] \oplus d[i+8]) \right) \\ dataDet \wedge \left( \bigvee_{i=0}^{15} (d[i] \oplus d_x[i]) \right) \end{cases}$$

where dataDet=e[19] ∧ A DataDetEn

In some embodiments, both the PhyTest and DataDetEn signals are asserted to PhyTest=1 and DataDetEn=1. In this mode, the error function $err_s$ may be utilized to detect errors resulted from violating the test properties. The invalCmd signal indicates the presence of invalid commands. The error function e[1] may indicate the result of comparison made by the compare logic. During the memory interface test, the error function e[1] in FIGS. 49 and 50 performs bitwise comparison between upper and lower bytes and between the received test data and the expected, respectively. Thus, if any error is induced from the SPDRAM test, the error may be detected.

Figure 51:
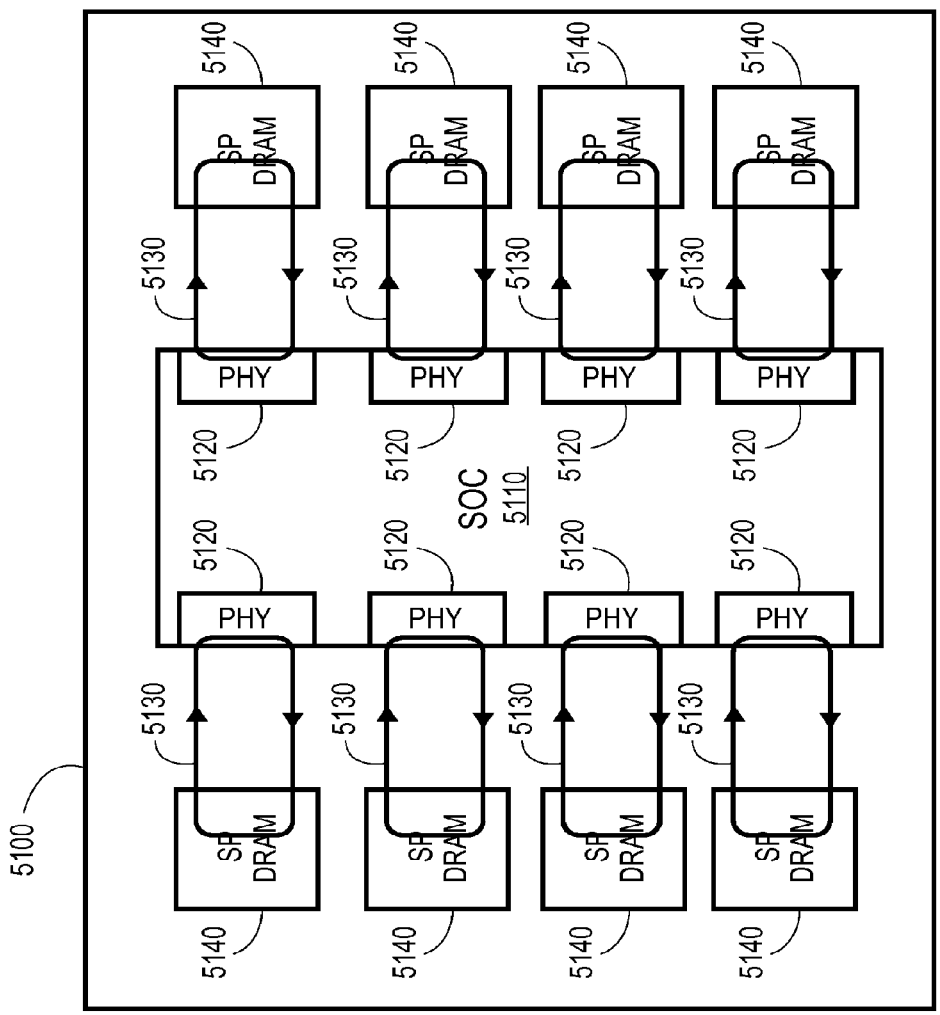
FIG. 51 illustrates an embodiment of a system for board testing.

FIG. 51 illustrates an embodiment of a system for board testing. As illustrated, a board 5100 may include a system on a chip (SOC) 5110, including a physical layer (PHY) 5120 linked with an SPDRAM memory 5140 via an interface 5130. When the SPDRAM memories and the SOC chip are placed on the system board as shown in FIG. 51, the PHY cores embedded in the SOC chip may interact with the SPDRAM memories to test the SPDRAM interface. The functional paths may be exercised to validate intended functionality on the system board.

Figure 52:
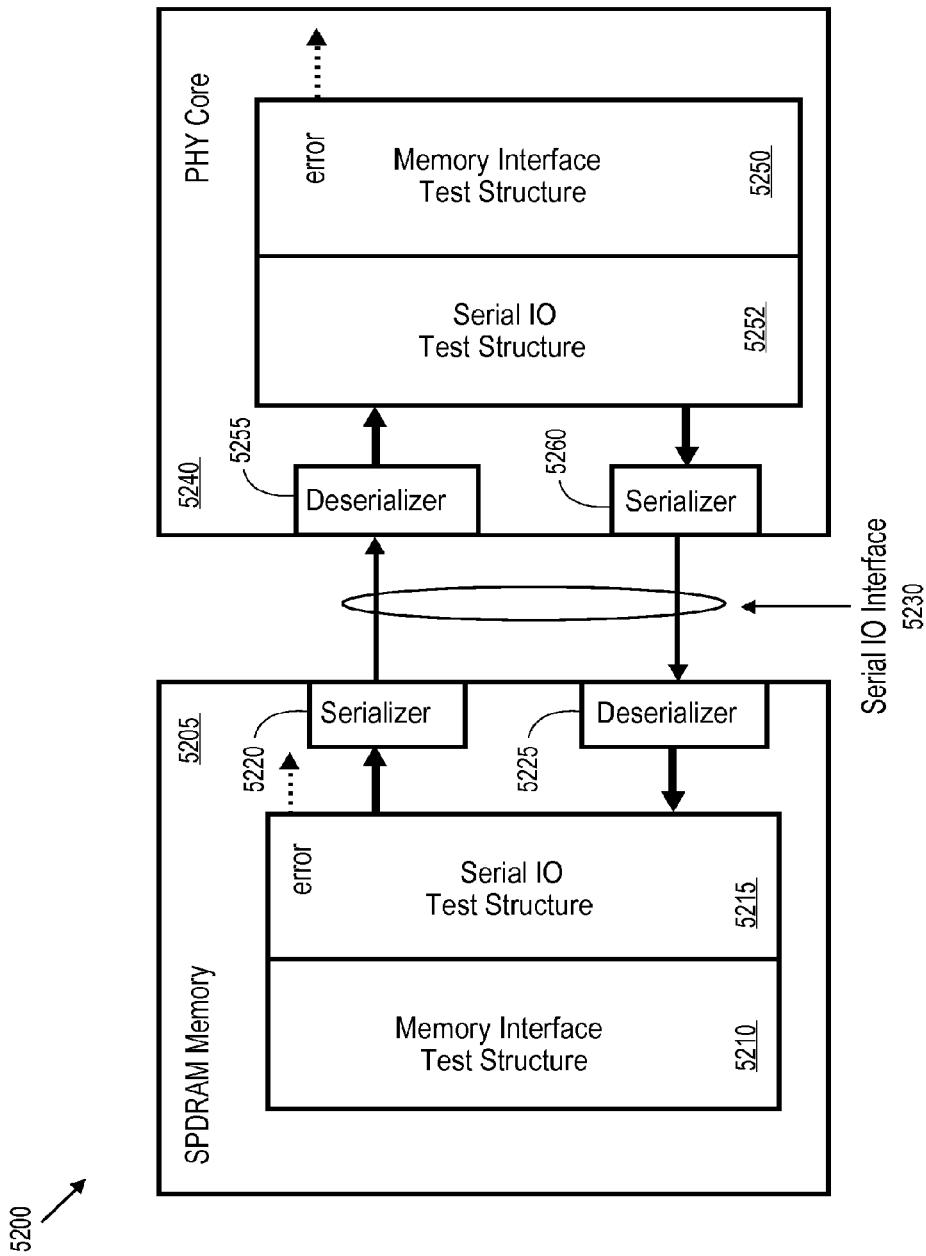
FIG. 52 illustrates an embodiment of a board-level test structure.

FIG. 52 illustrates an embodiment of a board-level test structure. As illustrated, a system 5200 includes an SPDRAM memory 5205 and a PHY core 5240, linked by a serial IO interface 5230. The SPDRAM memory 5205 includes memory interface test structures 5210 and serial IO test structures 5215, as well as serializers 5220 and deserializers 5225 to link to the PHY core 5240 via the serial IO interface 5230. In one example, the memory may include four ports having four serializers and four deserializers. In this illustration, the PHY core 5240 includes memory interface test structures 5250 and serial IO test structures 5252, together with serializers 5260 and deserializers 5255 to link to the memory 5205 via the serial IO interface 5230. In this illustration, a test structure employed in the SPDRAM memory and the PHY core may be combined to form a board-level test structure. In some embodiments, there may be two test data flows, the data flows being from the SPDRAM memory to the PHY core and from the PHY core to the SPDRAM memory. In some embodiments, test data may be generated independently in the SPDRAM memory and in the PHY core. In some embodiments, the received test data may also be checked independently at both ends of the communication. Depending on the particular test applications, different SPDRAM test generators may be employed for the SPDRAM memory chip and for the SOC PHY core.

Figure 53:
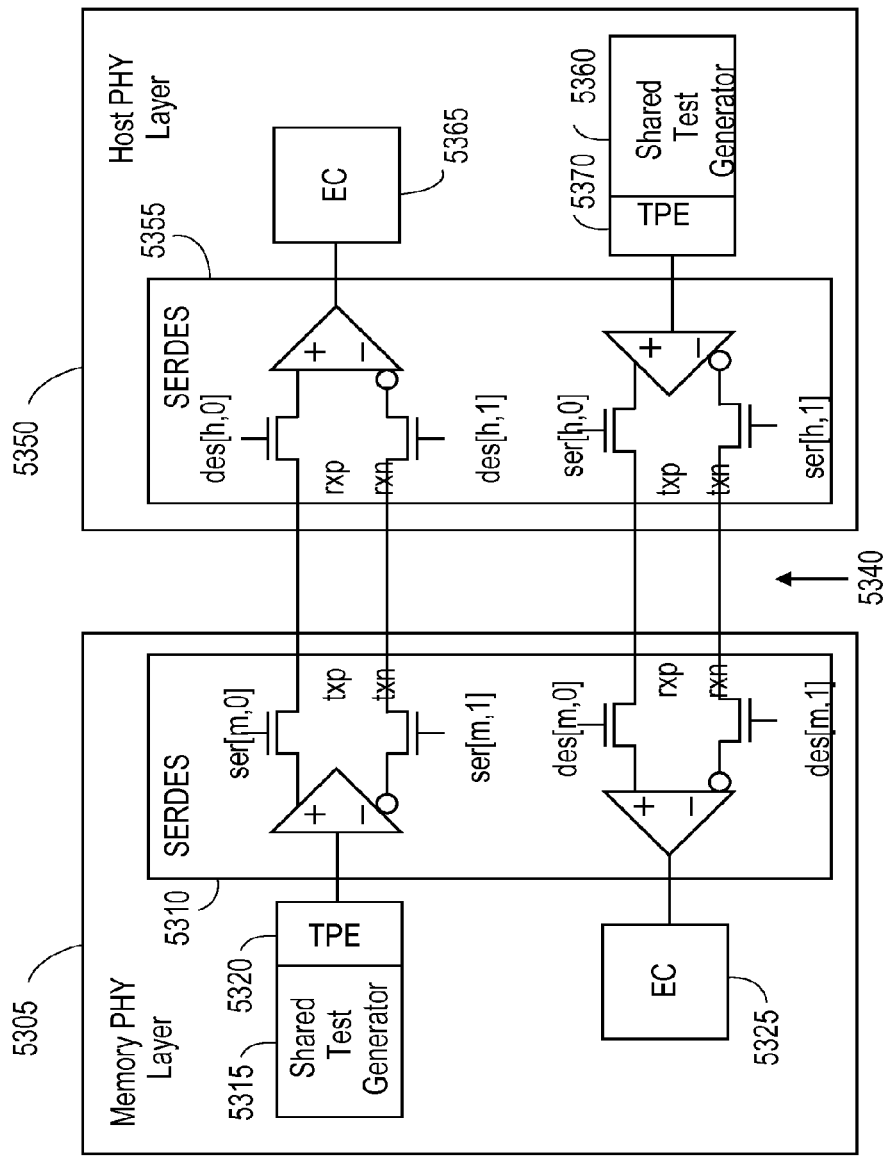
FIG. 53 is an illustration of an embodiment of a serial IO interconnection test structure.

FIG. 53 is an illustration of an embodiment of a serial IO interconnection test structure. In some embodiment, the test structure may relate to a test structure provided in U.S. patent application Ser. No. 12/359,025, entitled "Fault Testing for Interconnections." In some embodiments the serial IO interconnection test structure can provide test paths to test and locate faults such as open and bridging faults. In some embodiments, a test path can be setup by turning on or off switch functions, which are denoted in FIG. 53 by transistors with control inputs. However, the transistor view is a conceptual view and the switching function can be implemented in various ways depending on applications. In some embodiments, the switching function may be added to the functional control logic in such a way that the serial IO path is not directly affected.

As illustrated, a system may include memory PHY layer 5305 coupled with a host PHY layer 5350. The memory PHY layer includes a shared test generator 5315 and one or more test property embedding (TPE) units 5320 coupled with a serializer of a serializer-deserializer (SERDES) 5310. The serializer of SERDES 5310 is linked via an interface 5340 with a deserializer of a SERDES 5355 of the host PHY layer 5350, with deserializer coupled with an error checker 5365 of the host PHY layer 5350. The host PHY layer 5350 further includes a shared test generator 5360 and one or more TPE units 5370 coupled with a serializer of the SERDES 5355, which is linked via interface 5340 to a deserializer of SER-DES 5310 of the memory PHY layer 5325, which is coupled with an error checker of the memory PHY layer 5325.

In some embodiments, the behavior of the switching functions may be summarized as follows: If a control input is provided, for example ser[m,0]=1, the corresponding switch is closed and the connection is established. If, however, ser[m,0]=0, the switch is open and no signal can pass through. In some embodiments, the switch functions of SERDES 5310 and SERDES 5355 are set as required to direct the test signals through the links of the interface 5340.

Figure 54:
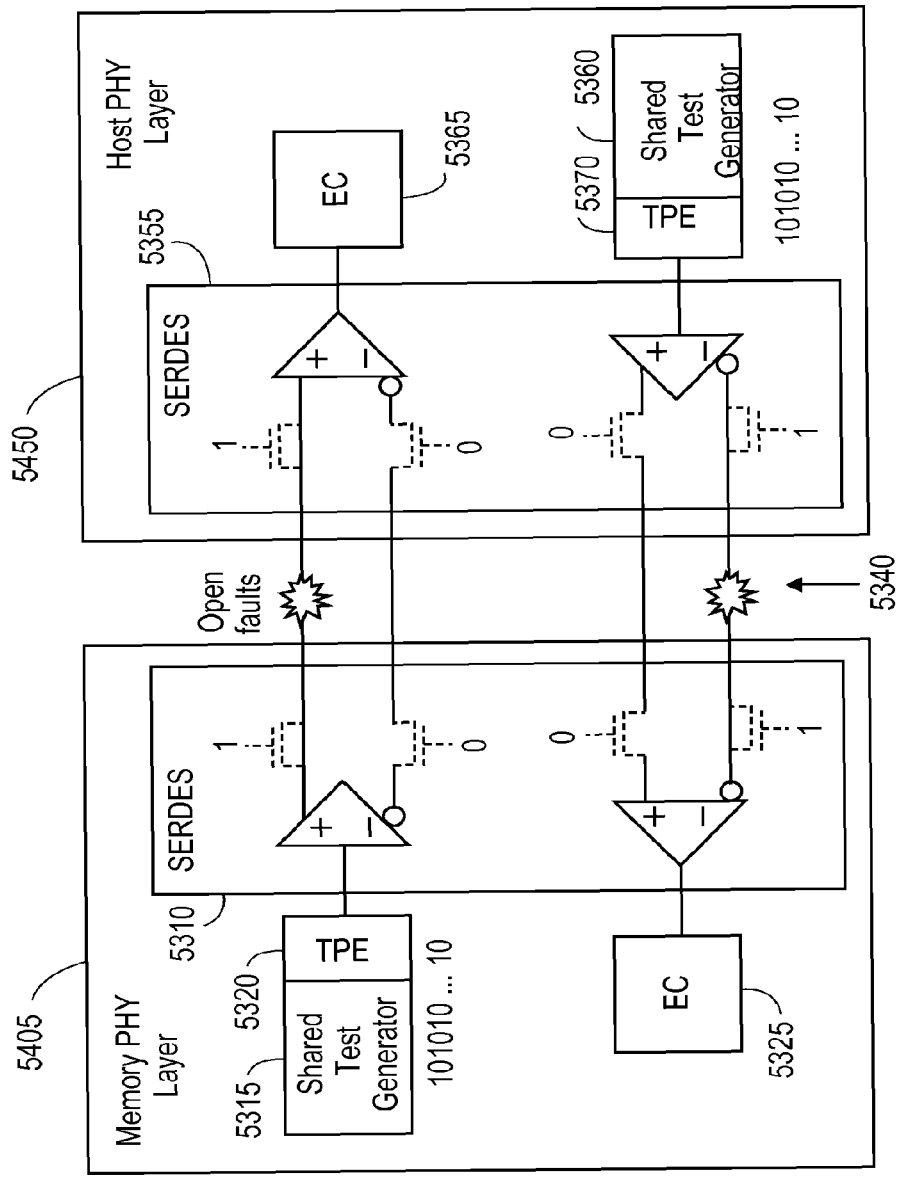
FIG. 54 illustrates of an embodiment of open fault detection.

FIG. 54 illustrates an embodiment of open fault detection. FIG. 54 illustrates a memory PHY layer 5405 and host PHY layer 5450 having the components provided for FIG. 53. In this illustration, an open fault would break one or both the differential interconnections of interface 5340, which may be referred as the positive and negative interconnections. A commonly cited problem of serial IO that employs differential signaling is that the serial IO has not necessarily failed in the presence of an open fault in one of the connections. In some embodiments, an interconnection test structure may setup the test path shown in FIG. 54 to detect the open faults. In some embodiments, for open fault detection, the test generator 5310 in the memory PHY layer 5405 can send the test pattern of 1010 . . . 10 through the path under test, which has been established by the switch functions of the SERDES. For example, FIG. 54 illustrates a test path through the positive interconnection from the memory PHY layer 5405 to the host PHY layer 5450, and a test path through the negative interconnection from the host PHY layer 5450 to the memory PHY layer 5405. If an open fault is present, no data will be received and hence the error will detected. Otherwise, the data is received and no open fault can be concluded.

Figure 55:
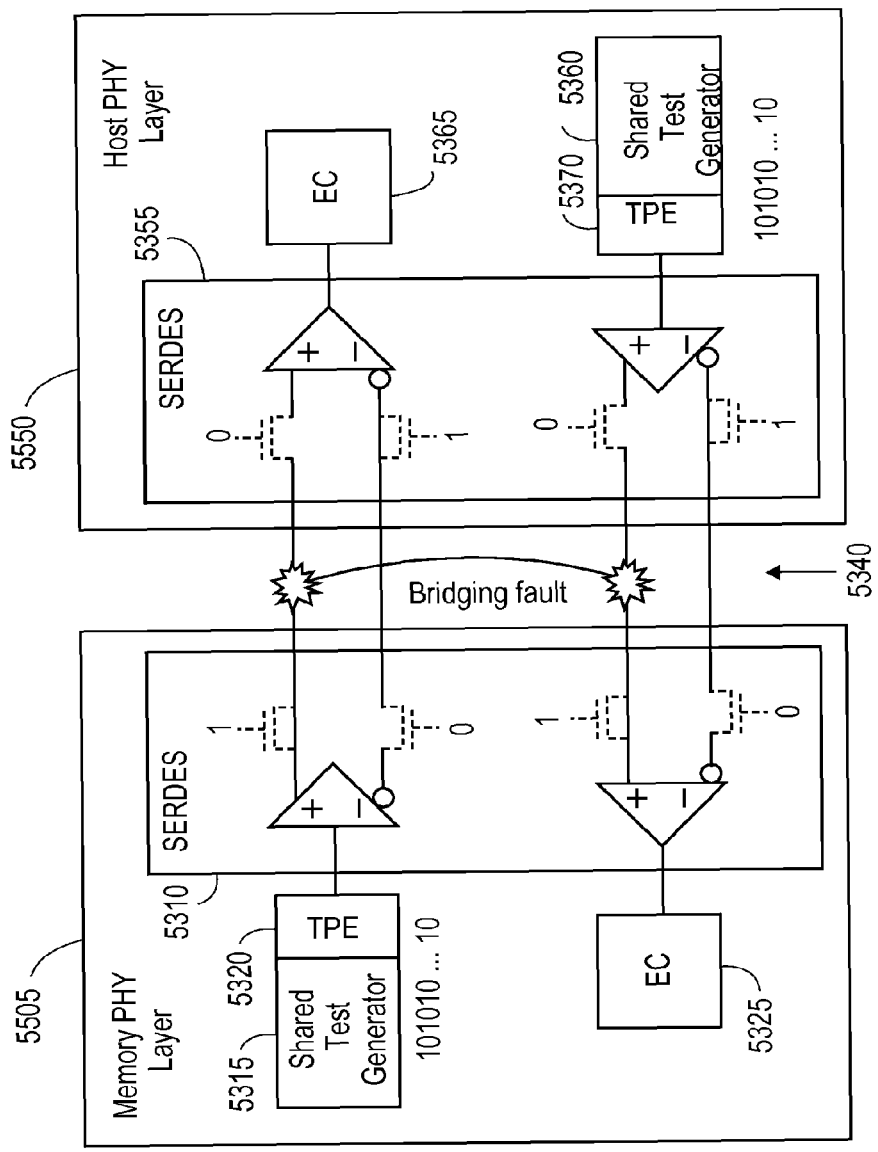
FIG. 55 illustrates an embodiment of bridging fault detection.

FIG. 55 illustrates an embodiment of bridging fault detection. FIG. 55 illustrates a memory PHY layer 5505 and host PHY layer 5550 having the components provided for FIG. 53. Bridging faults create non-functional signal paths crossing interconnection. In some embodiment, a nonfunctional signal path can be set up to detect one or more bridging faults. As shown in FIG. 55, differential connections that are not connected functionally may be enabled to form the test path to detect the targeted fault. If the bridging fault shorts the two connections, the transmitted test pattern will be received via the non-functional test path. Otherwise, no test pattern is received and no bridging fault can be concluded. For example, as shown in FIG. 55, the positive interconnections are shorted together, allowing a signal path from one of the units back to the same unit.

Figure 56:
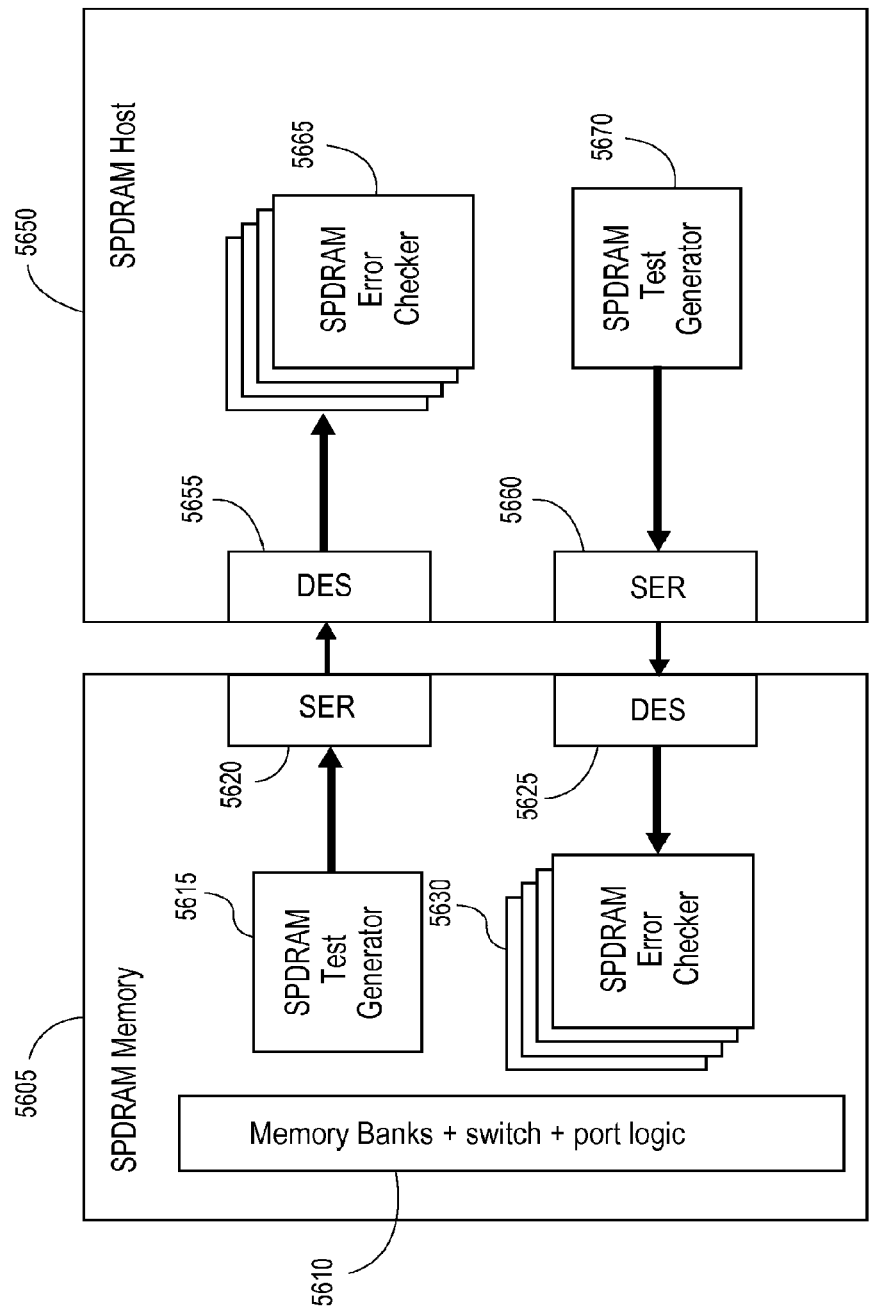
FIG. 56 is an illustration of an embodiment of a serial IO board test.

FIG. 56 is an illustration of an embodiment of a serial IO board test. In some embodiments, for serial IO interconnection test on the board, the test paths are configured via the switch functions and the MITU internally provides the test pattern, for example 1010 . . . 1010. The MITU and the controls for the switch functions can be programmed via the IEEE STD 1149.1 Boundary Scan interface. The test pattern can be transmitted from the TX and received via the test path at the RX. If the received test pattern is different from the expected, the serial IO interconnection under test is concluded to be defective. In some embodiments of a board-level test, the serial IO interface test may be followed by the memory interface test. During the serial IO test, as shown in FIG. 56, the 80-bit test data may be independently generated from the SPDRAM memory and the host and transmitted over four channels in parallel. The 20-bit test pattern received in each channel may be independently checked to detect errors in the serial IO interface. In this illustration, an SPDRAM 5605, including memory banks, switches, and port logic 5610, is coupled with a host 5650. A first serial IO generator

5615 of the SPDRAM 5605 produces a test signal E[79:0] for serialization by serializer 5620 for transmission to a deserializer 5655 of the host 5650. The received data is deserialized and checked by multiple serial IO error checkers 5665. Similarly, a second serial IO generator 5670 of the host 5650 produces a test signal E[79:0] for serialization by serializer 5660 for transmission to a deserializer 5625 of the SPDRAM 5605. The received data is deserialized and checked by multiple serial IO error checkers 5630. If no errors are detected in the serial IO test, the memory interface test may be initiated.

Figure 57:
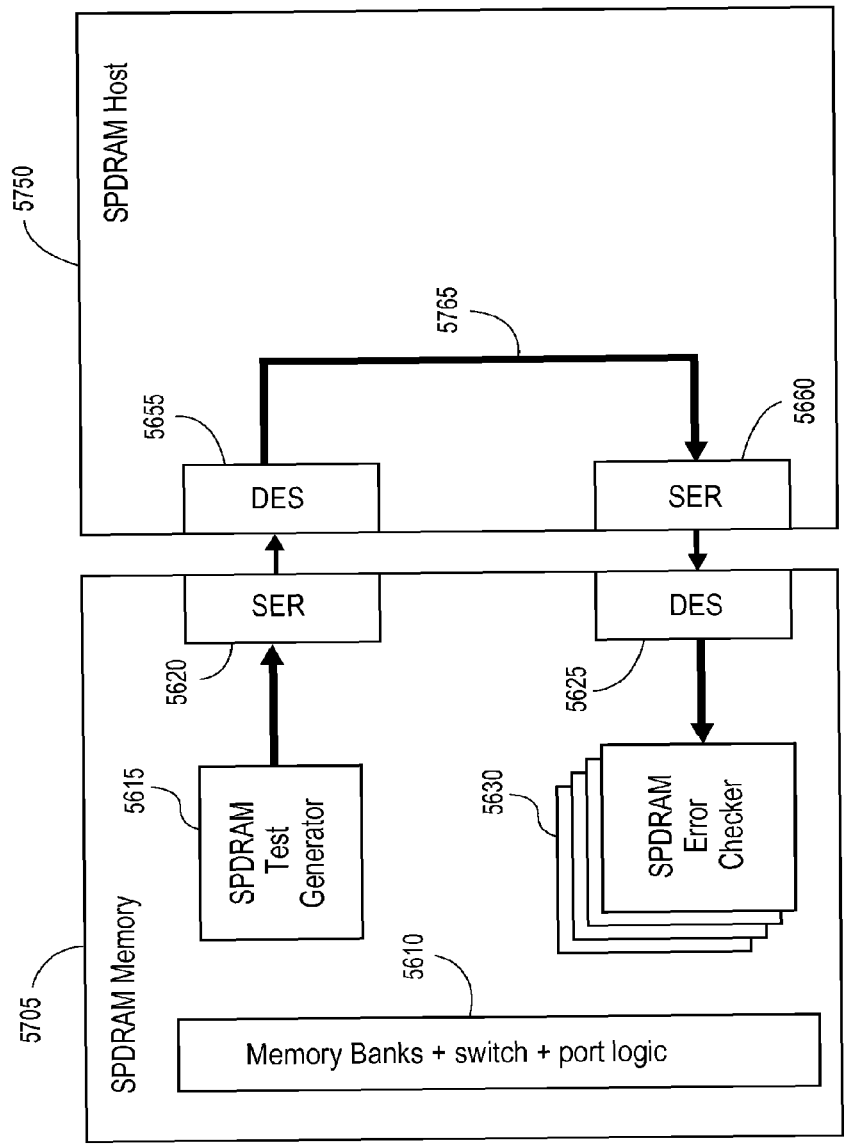
FIG. 57 illustrates an interconnection test through a host bypass loopback path.

The same interconnection test can performed via the memory or a host bypass loopback path. FIG. 57 illustrates an interconnection test through a host bypass loopback path. In this test configuration, the host test structure is bypassed. In this illustration, an SPDRAM 5705, including memory banks, switches, and port logic 5610, is coupled with a host 5750. A first serial IO generator 5615 of the SPDRAM 5705 produces a test signal E[79:0] for serialization by serializer 5620 to deserializer 5655 of the host 5750. The received data is deserialized and fed back via feedback loop 5765. The data is serialized by serializer 5660 for transmission to a deserializer 5655 of the host 5750. The received data is deserialized and checked by multiple serial IO error checkers 5630. If no errors are detected in the serial IO test, the memory interface test may be initiated. Thus, the test pattern is generated from and checked at the test structure in the SPDRAM memory. This test configuration may be beneficial if, for example, the coupling SPDRAM and host contain incompatible test structures.

Figure 58:
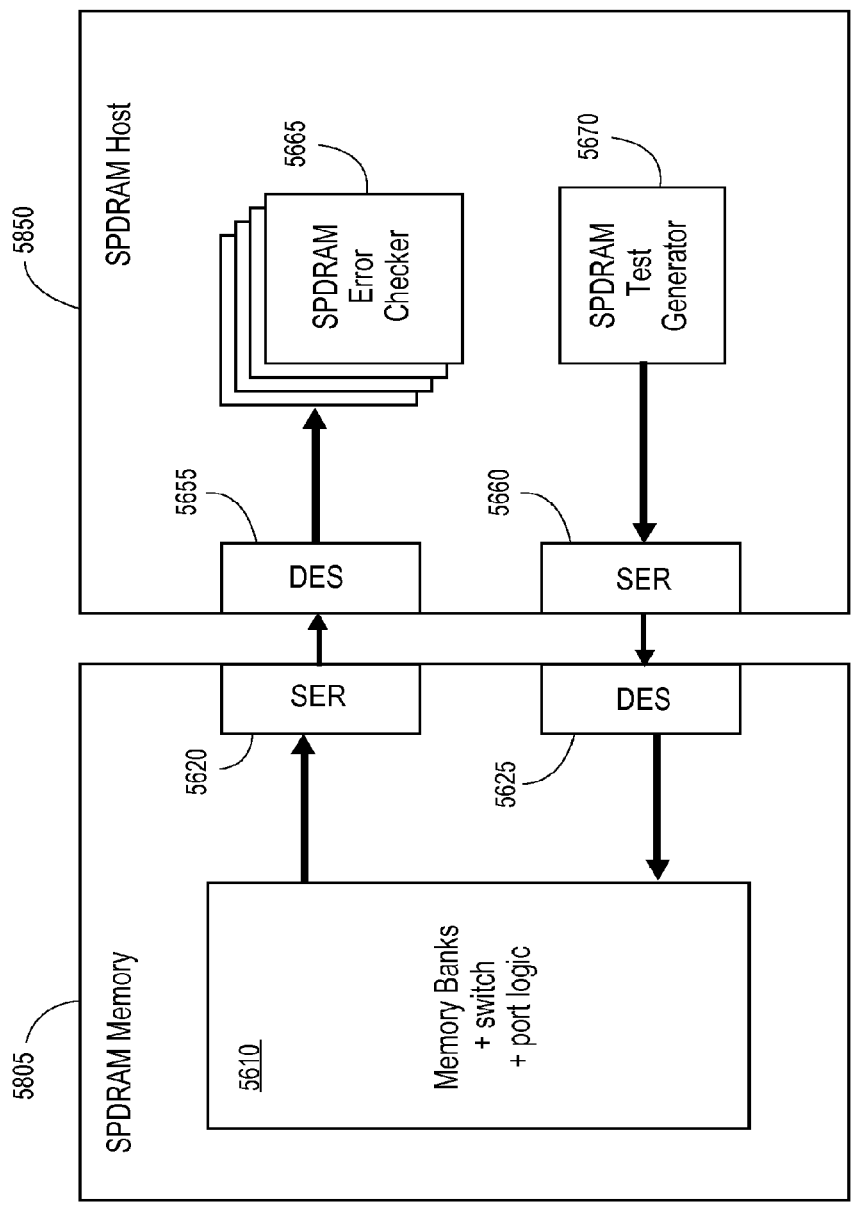
FIG. 58 is an illustration of an embodiment of a memory interface test with test patterns originating in a host.

In some embodiments, after a serial IO test, as shown in FIG. 56, the SPDRAM test structure that includes the SPDRAM test generator and the error checker may be configured to test the memory interface from the host. FIG. 58 is an illustration of an embodiment of a memory interface test with test patterns originating in a host. In this illustration, a test structure includes an SPDRAM memory 5805, including memory banks, switches, and port logic 5610, coupled with a host 5850, such as a system on chip including a PHY core. In some embodiments, an SPDRAM test generator 5670 in the host 5850 may be programmed to provide SPDRAM test patterns to the memory interface, with the test structure in the memory chip being bypassed. If a user memory test generator is implemented on a host, user test patterns may be accommodated in the memory or memory interface test. Otherwise, the SPDRAM test patterns may be generated internally and may be written to and read from pseudo-random addresses. In this illustration, a memory test pattern E[79:0] may be generated by a host test generator 5670 to be provided to a serializer 5660 of the host 5850. In another embodiment, a user memory test may be provided to a host, such as to a memory test interface unit, which provides the test pattern E[79:0] to the serializer 5660 of the host 5850. The serialized data is deserialized by a deserializer 5625, which provides a deserialized test pattern (e[79:0]) to the port logic (within the illustrated memory banks, switch, and port logic 5610) via a transition decoder for memory access. The test data is read by the port logic 5610 and provided to SPDRAM serializer 5620. The serialized data is received and deserialized by PHY core deserializer 5655, with the deserialized data being checked by error checkers 5665 of the host 5850. Test control signals (such as genCmd to generate a command) may be utilized to orchestrate the memory interface test and may be provided via the, for example, IEEE Standard 1149.1 boundary scan interface.

In some embodiments, a memory bypass loopback path may also be used to test the serial IO by bypassing the memory interface and connecting the output of deserializer directly to the serializer. The serial IO may be tested before the memory interface to ensure link integrity. The structure illustrated in FIG. 58 may allow the serial IO to be tested even when incompatible third party built-in self-test (BIST) circuitry is presented.

Figure 59:
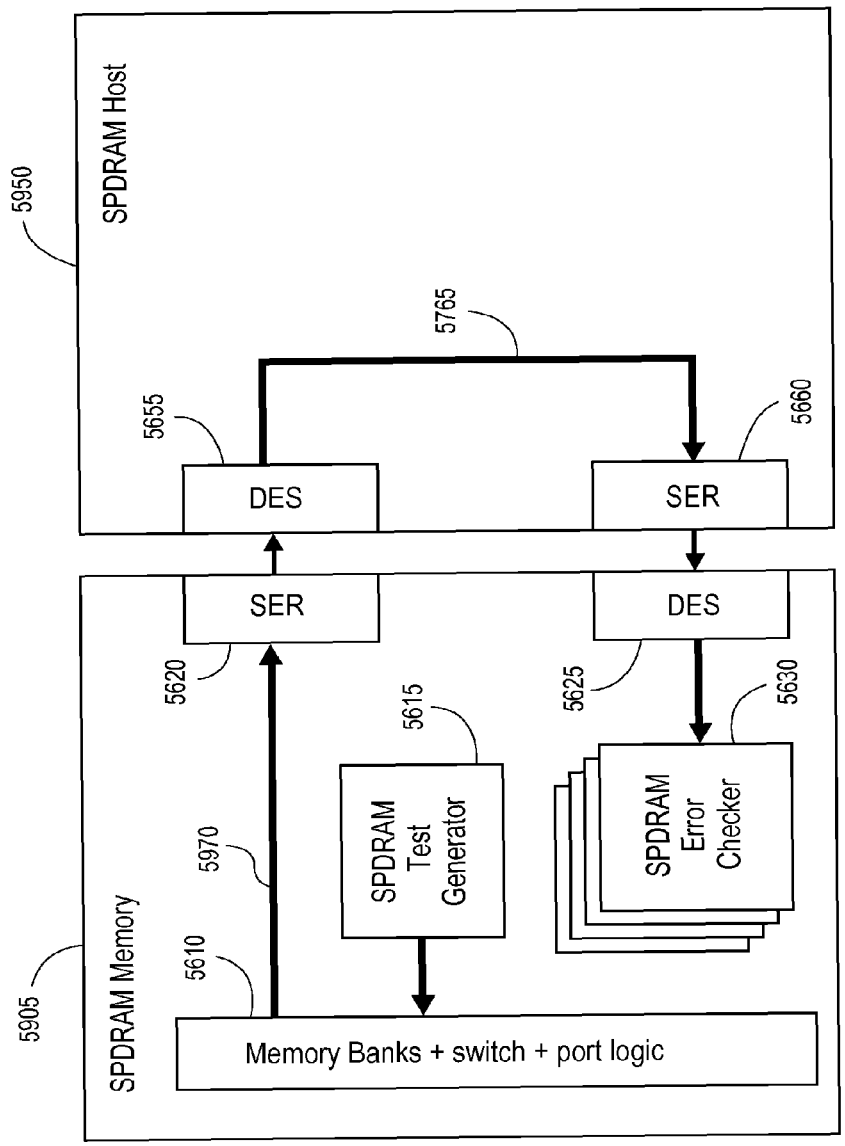
FIG. 59 is an illustration of and embodiment of a memory interface test through a self-loopback path with test patterns originating in a memory.

FIG. 59 is an illustration of and embodiment of a memory interface test through a self-loopback path with test patterns originating in a memory. As illustrated in FIG. 59, a memory interface may also be tested using an SPDRAM command generator and the error checkers in the SPDRAM memory chips. As illustrated, a test structure includes an SPDRAM memory 5905, including memory banks, switches, and port logic 5610, coupled with a host 5950. For the serial IO test, the SPDRAM test generator 5615 may be utilized to directly supply the serial IO test patterns to the serializer. The test patterns received via the serial IO loopback path are checked for error. In this illustration, a test generator 5615 provides a test pattern E[79:0] to the memory banks through switches and port logic 5610 of the memory 5905. The test pattern is then provided to and serialized by serializer 5620. The serialized data is deserialized by deserializer 5655 of the host 5950, and is fed back by a serial IO bypass loopback 5765 to serializer 5660 of the host 5950. The data is deserialized by SPDRAM deserializer 5625, and the test pattern e[79:0] is checked by error checkers 5630. The serial IO bypass loopback 5765 may also be utilized if an incompatible BIST is implemented in the host.

Figure 60:
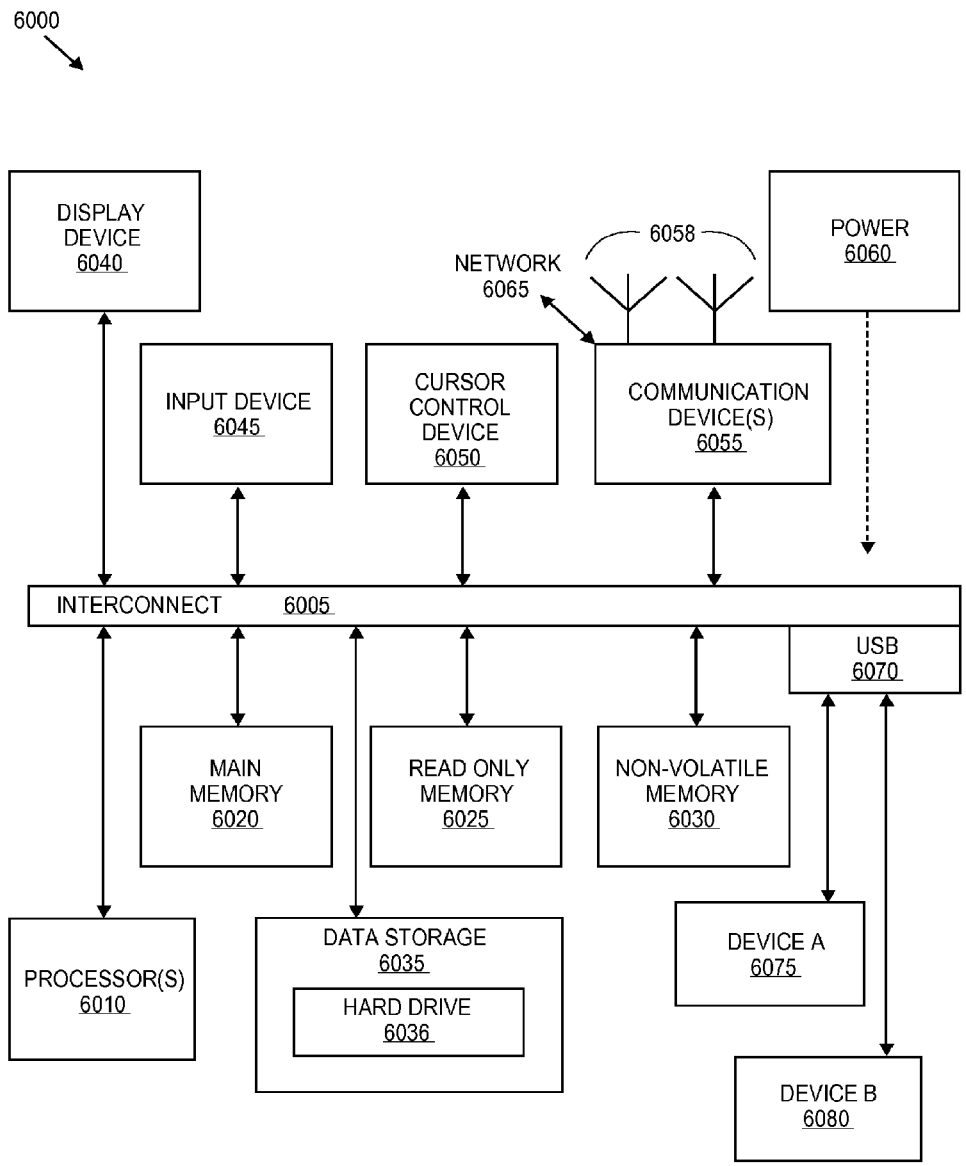
FIG. 60 is an illustration of an embodiment of a computing device that may be utilized in an embodiment of the invention.

FIG. 60 is an illustration of an embodiment of a computing device that may be utilized in an embodiment of the invention. In this illustration, certain standard and well known components that are not germane to the present description are not shown, and certain illustrated elements may not be contained in an embodiment of a particular device. Under some embodiments, the device 6000 comprises an interconnect or crossbar 6005 or other communication means for communicating information, which may include high speed data transport. The device 6000 further includes a processing means such as one or more processors 6010 coupled with the interconnect 6005 for processing information. The processors 6010 may comprise one or more physical processors and one or more logical processors. Further, each of the processors 6010 may include multiple processor cores. The interconnect 6005 is illustrated as a single interconnect for simplicity, but may represent multiple different interconnects or buses and the component connections to such interconnects may vary. The interconnect 6005 shown in FIG. 60 is an abstraction that represents any one or more separate physical buses, point-to-point connections, or both connected by appropriate bridges, adapters, or controllers. The interconnect 6005 may include, for example, a system bus, a PCI or PCIe bus, a HyperTransport or industry standard architecture (ISA) bus, a small computer system interface (SCSI) bus, a IIC (I2C) bus, or an Institute of Electrical and Electronics Engineers (IEEE) standard 1394 bus, sometimes referred to as "Firewire". ("Standard for a High Performance Serial Bus" 1394-1995, IEEE, published Aug. 30, 1996, and supplements) The device 6000 further may include a serial bus, such as USB bus 6070, to which may be attached one or more USB compatible devices, such as device A 6075 and device B 6080.

In some embodiments, the processors 6010 may be utilized to support one or more virtual machines. In some embodiments, the device 6000 further comprises a random access memory (RAM) or other dynamic storage device as a main memory 6020 for storing information and instructions to be executed by the processors 6010. Main memory 6020 also may be used for storing temporary variables or other intermediate information during execution of instructions by the processors 6010. RAM memory may include SPDRAM. RAM memory may further include other dynamic random access memory (DRAM), which requires refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). In some embodiments, memory of the system may include a shared memory, such as a shared BIOS/OS memory, that is accessible by multiple agents in the device. The device 6000 also may comprise a read only memory (ROM) 6025 or other static storage device for storing static information and instructions for the processors 6010. The device 6000 may include one or more non-volatile memory devices 6030 for the storage of certain elements, including, but not limited to, system BIOS and one or more pre-OS applications.

Data storage 6035 may also be coupled to the interconnect 6005 of the device 6000 for storing information and instructions. The data storage 6035 may include a magnetic disk, an optical disc and its corresponding drive, or other memory device. Such elements may be combined together or may be separate components, and utilize parts of other elements of the device 6000. In a particular embodiment, the data storage 6035 may include a hard drive 6036.

The device 6000 may also be coupled via the bus 6005 to a display 6040, such as a cathode ray tube (CRT) display, a liquid crystal display (LCD), a plasma display, or any other display technology, for displaying information to an end user. In some embodiments, the display 6040 may be utilized to display television programming. In some environments, the display 6040 may include a touch screen that is also utilized as at least a part of an input device. In some environments, the display 6040 may be or may include an audio device, such as a speaker for providing audio information, including the audio portion of a television program. An input device 6045 may be coupled to the interconnect 6005 for communicating information and/or command selections to the processors 6010. In various implementations, the input device 6045 may be a keyboard, a keypad, a touch screen and stylus, a voice-activated system, or other input device, or combinations of such devices. Another type of user input device that may be included is a cursor control device 6050, such as a mouse, a trackball, or cursor direction keys for communicating direction information and command selections to the one or more processors 6010 and for controlling cursor movement on the display 6040.

One or more communication elements 6055 may also be coupled to the interconnect 6005. Depending upon the particular implementation, the communication elements 6055 may include a transceiver, a wireless modem, a network interface card, LAN (Local Area Network) on motherboard, or other interface device. The communication elements 6055 may provide a connection to a network 6065 to transmit network data, such as Ethernet data. The uses of a communication device 6055 may include reception of signals from wireless devices. For radio communications, the communication device 6055 may include one or more antennas 6058, including any dipole or monopole antennas, as required. In one embodiment, the communication elements 6055 may include a firewall to protect the device 6000 from improper access. The device 6000 may also comprise a power device or system 6060, which may comprise a power supply, a battery, a solar cell, a fuel cell, or other system or device for providing or generating power. The power provided by the power device or system 6060 may be distributed as required to elements of the device 6000.

In the description above, for the purposes of explanation, numerous specific details are set forth in order to provide a thorough understanding of the present invention. It will be apparent, however, to one skilled in the art that the present invention may be practiced without some of these specific details. In other instances, well known structures and devices are shown in block diagram form. There may be intermediate structure between illustrated components. The components described or illustrated herein may have additional inputs or outputs which are not illustrated or described.

The present invention may include various processes. The processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Portions of the present invention may be provided as a computer program product, which may include a computer-readable medium having stored thereon computer program instructions to be executed by a processor, which instructions may be used to program a computer (or other electronic devices) to perform a process according to the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of tangible media/computer-readable medium suitable for storing electronic instructions.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A method of testing a device, the method comprising:
   testing a device including a component, the device including a plurality of serial ports,
   testing of the component including:
   providing, by a first built-in self-test structure of the component a first test pattern for the testing of the component, wherein the first test pattern complies with a protocol for the component;
   performing error checking for the testing of the component by enabling detection of legal commands for the component; and
   testing a serial interface of the device, testing of the serial interface including:
   providing, by the first built-in self-test structure of the component, a second test pattern for the testing of the serial interface;
   wherein testing of the component is separate from the testing of the serial interface.

2. The method of claim 1, wherein the component includes one or more memories.

3. The method of claim 2, wherein the one or more memories are serial port dynamic random access memories.

4. The method of claim 1, wherein the first built-in self-test structure includes a set of interface test structures for the component and a set of interface structures for the serial interface.

5. The method of claim 1, wherein the second test pattern for the testing of the serial interface does not comply with the protocol for the component.

6. The method of claim 1, further comprising encoding a test property into the second test pattern.

7. The method of claim 1, wherein the serial interface is between the component and a host, the host further including a second built-in self-test structure, and wherein testing further includes use of the second built-in self-test structure of the host.

8. The method of claim 1, further comprising examining a received test pattern to determine if one or more errors have occurred in the component or the serial interface.

9. The method of claim 1, further comprising testing of the component based on checking an extracted test property of the first test pattern.

10. The method of claim 1, wherein providing the first test pattern and the second test pattern includes generation of test signals.

11. The method of claim 1, wherein providing the first test pattern and the second test pattern includes receipt of test signals from an external tester.

12. The method of claim 1, further comprising bypassing at least a part of the first built-in self-test structure to loop back a signal for testing.

13. The method of claim 1, further comprising coupling the plurality of serial ports of the device together for testing.

14. The method of claim 13, wherein each port of the plurality of ports of the component includes a serializer and a deserializer, wherein coupling the ports together includes connecting the serializer of a first port to a deserializer of a second port.

15. The method of claim 14, wherein testing includes applying a test pattern to the serializer of the first port and receiving a test pattern at a deserializer for the first port.

16. The method of claim 14, wherein a first port and a second port coupled together are each bidirectional on a pin, and wherein the first port is configured to transmit and the second port is configured to receive.

17. The method of claim 1, further comprising:
   generating a test pattern utilizing a plurality of hierarchically organized test encoding functions to embed a test property into the test pattern.

18. The method of claim 1, wherein testing of the component and of the serial interface are tested internally in the device, testing including configuring the device to loop back a signal.

19. The method of claim 1, wherein testing the serial interface includes looping back a signal from an output of the device to an input of the device.

20. The method of claim 1, wherein testing the serial interface includes looping back a signal within a host connected to the component from an input of the host to an output of the host.

21. The method of claim 1, wherein the component includes a plurality of elements,
   and wherein testing of the component includes testing of an interface of each of the plurality of elements.

22. The method of claim 21, wherein the testing of the interface for each of the plurality of elements includes switching one or more links of each interface on or off to generate a test path for transmission of a test pattern.

23. The method of claim 22, wherein the switching of one of more links includes switching to generate a non-functional test path.

24. The method of claim 22, wherein the switching of one or more links includes switching links to test for one or more of open faults and bridging faults.

25. An apparatus including:
   a component including:
   a first built-in self-test structure, wherein the first built-in self-test structure includes a first set of component test structures and a second set of serial interface test structures, and
   a plurality of ports; and
   a serial interface for the component;
   wherein the component and the serial interface are to be tested using the a first set of component test structures and a second set of serial interface test structures, and wherein testing of the component includes providing by the first built-in self-test structure a first test pattern for the component, the first test pattern complying with a protocol for the component, and testing of the interface includes providing by the first built-in self-test structure a second test pattern for the serial interface; and
   wherein the testing of the component and the serial interface are run separately.

26. The apparatus of claim 25, wherein the component includes one or more memories.

27. The apparatus of claim 26, wherein the one or more memories are serial port dynamic random access memories (SPDRAM).

28. The apparatus of claim 25, wherein the second test pattern does not comply with the protocol for the component.

29. The apparatus of claim 25, wherein each port of the plurality of serial ports has a serializer and a deserializer.

30. The apparatus of claim 25, wherein a test generator generates a test pattern for each port of the plurality of ports of the component.

31. The apparatus of claim 25, wherein each port of the plurality of ports includes an error checker, each error checker checking the test patterns received by a deserializer for the respective port.

32. The apparatus of claim 25, further comprising a physical layer of a host, the physical layer includes a second built-in self-test structure.

33. The apparatus of claim 25, wherein the apparatus includes a single error checker for the plurality of ports.

34. The apparatus of claim 25, wherein the plurality of ports are connected together serially for testing of the apparatus.

35. A non-transitory computer-readable medium having stored thereon data representing sequences of instructions that, when executed by a processor, cause the processor to perform operations comprising:
    testing a device including a component, the device including a plurality of serial ports,
    testing of the component including:
    providing, by a first built-in self-test structure of the component a first test pattern for the testing of the component, wherein the first test pattern complies with a protocol for the component;
    performing error checking for the testing of the component by enabling detection of legal commands for the component; and
    testing a serial interface of the device, testing of the serial interface including:
    providing, by the first built-in self-test structure of the component, a second test pattern for the testing of the serial interface;
    wherein testing of the component is separate from the testing of the serial interface.

36. The medium of claim 35, wherein the component includes one or more memories.

37. The medium of claim 36, wherein the one or more memories are serial port dynamic random access memories (SPDRAM).

* * * * *